(12) United States Patent
Ashida

(10) Patent No.: US 8,174,062 B2
(45) Date of Patent: May 8, 2012

(54) SEMICONDUCTOR MEMORY DEVICE AND MANUFACTURING METHOD THEREOF

(75) Inventor: Motoi Ashida, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 92 days.

(21) Appl. No.: 12/504,146

(22) Filed: Jul. 16, 2009

(65) Prior Publication Data

US 2009/0294827 A1  Dec. 3, 2009

Related U.S. Application Data

(62) Division of application No. 11/384,864, filed on Mar. 21, 2006, now Pat. No. 7,582,550.

(30) Foreign Application Priority Data

Mar. 23, 2005 (JP) ................................ 2005-083981
Feb. 20, 2006 (JP) ................................ 2006-042255

(51) Int. Cl.
*H01L 29/792* (2006.01)

(52) U.S. Cl. ...... 257/316; 257/314; 257/315; 257/E29.3; 257/E29.305; 257/E29.306; 257/E29.33

(58) Field of Classification Search .................... None
See application file for complete search history.

(56) References Cited

U.S. PATENT DOCUMENTS

| | | | |
|---|---|---|---|
| 5,285,093 A | 2/1994 | Lage et al. | |
| 6,977,843 B2 | 12/2005 | Hamaguchi et al. | |
| 7,214,585 B2 | 5/2007 | Ding | |
| 2002/0100929 A1* | 8/2002 | Ebina et al. | 257/315 |
| 2003/0001175 A1 | 1/2003 | Masuoka et al. | |
| 2003/0151069 A1 | 8/2003 | Sugimae et al. | |
| 2004/0042292 A1 | 3/2004 | Sakata et al. | |
| 2004/0051153 A1 | 3/2004 | Yamamoto et al. | |
| 2004/0238878 A1 | 12/2004 | Sato et al. | |
| 2005/0141276 A1 | 6/2005 | Takeuchi et al. | |

FOREIGN PATENT DOCUMENTS

| | | |
|---|---|---|
| CN | 1574298 A | 2/2005 |
| JP | 2003-309193 | 10/2003 |
| JP | 2004-228571 A | 8/2004 |

OTHER PUBLICATIONS

Chinese Office Action, w/ English translation thereof, issued in Chinese Patent Application No. CN 200610067668.3, dated Feb. 6, 2009.

* cited by examiner

*Primary Examiner* — Fei Fei Yeung Lopez

(74) *Attorney, Agent, or Firm* — McDermott Will & Emery LLP

(57) ABSTRACT

A semiconductor memory device includes: a semiconductor substrate; a first impurity region; a second impurity region; a channel region; a first gate formed on a main surface on a side of the first impurity region; a second gate formed on the main surface on a side of the second impurity region, with a second insulating film being interposed; and a third insulating film formed on a side surface of the first gate. An interface between the third insulating film and the semiconductor substrate directly under the third insulating film is located above an interface between the second insulating film and the main surface of the semiconductor substrate directly under the second insulating film. The total number of steps can thus be reduced, and lower cost is achieved.

1 Claim, 54 Drawing Sheets

SEMICONDUCTOR MEMORY DEVICE AND MANUFACTURING METHOD THEREOF

RELATED APPLICATIONS

This application is a Divisional of U.S. patent application Ser. No. 11/384,864, filed on Mar. 21, 2006 now U.S. Pat. No. 7,582,550, claiming priority of Japanese Patent Application No. 2005-083981, filed on Mar. 23, 2005, and 2006-042255, filed on Feb. 20, 2006, the entire contents of each of which are hereby incorporated by reference.

BACKGROUND OF THE INVENTION

1. Field of the Invention

The present invention relates to a semiconductor memory device and a manufacturing method thereof.

2. Description of the Background Art

A semiconductor integrated circuit device (semiconductor memory device) including a memory cell region where a plurality of memory cell transistors are formed and a peripheral circuit region where a plurality of peripheral circuit transistors are formed has generally been known (see Japanese Patent Laying-Open No. 2004-228571). For example, Japanese Patent Laying-Open No. 2003-309193 discloses a semiconductor integrated circuit device including a memory cell transistor and an access circuit on a semiconductor substrate.

The semiconductor integrated circuit device includes a memory cell region and a peripheral region on a main surface of a semiconductor substrate, and a plurality of memory cell transistors are formed in the memory cell region. In addition, peripheral circuit transistors such as a power supply-voltage-related MOS (Metal Oxide Semiconductor) transistor and a high-withstand voltage NMOS (Negative Metal Oxide Semiconductor) transistor are formed in the peripheral region. In manufacturing the semiconductor integrated circuit device configured in such a manner, after the memory cell transistor is formed, the peripheral circuit transistor is formed. Namely, in a conventional method of manufacturing a semiconductor peripheral circuit device, the memory cell transistor and the peripheral circuit transistor have been formed in separate steps.

SUMMARY OF THE INVENTION

According to the method of manufacturing the semiconductor integrated circuit device described in Japanese Patent Laying-Open No. 2003-309193, the memory cell transistor and the peripheral circuit transistor have been formed in separate steps. Accordingly, the total number of steps has been great and the cost has been high.

The present invention was made in view of the above-described problems, and an object of the present invention is to reduce the total number of steps of a semiconductor integrated circuit device (semiconductor memory device) and to achieve lower cost.

According to one aspect of the present invention, a method of manufacturing a semiconductor memory device having a memory cell region where a memory cell transistor is formed and a peripheral circuit region where a peripheral circuit controlling an operation of the memory cell transistor is formed, includes the steps of: forming a first insulating film on a main surface of a semiconductor substrate; forming a first conductive film on the first insulating film; patterning the first conductive film to form a conductive pattern having an opening in a region serving as a source side impurity region of the memory cell transistor; forming a source region of the memory cell transistor using the conductive pattern as a mask; forming a second insulating film so as to cover the conductive pattern; forming a second conductive film on the second insulating film; forming a memory gate electrode of the memory cell transistor by etching back the second insulating film and the second conductive film; forming a gate electrode of the memory cell transistor and a gate electrode of a transistor formed in the peripheral circuit region by patterning the conductive pattern; and forming a drain region of the memory cell transistor and a source region and a drain region of the transistor formed in the peripheral circuit region.

According to one aspect of the present invention, a semiconductor memory device includes: a semiconductor substrate; an isolation region selectively formed on a main surface of the semiconductor substrate; first and second regions defined by the isolation region and adjacent to each other with the isolation region lying therebetween; a first impurity region formed on the first region; a second impurity region formed on the first region; a third impurity region formed on the second region; a fourth impurity region formed on the second region; a first channel region formed between the first impurity region and the second impurity region; a second channel region formed between the third impurity region and the fourth impurity region; a first gate formed on the main surface of the semiconductor substrate where the first channel region is located, on a side of the first impurity region, with a first insulating film being interposed; a second gate formed on the main surface of the semiconductor substrate where the first channel region is located, on a side of the second impurity region, with a second insulating film capable of accumulating charges being interposed; a third gate formed on the main surface of the semiconductor substrate where the second channel region is located, on a side of the third impurity region, with a third insulating film being interposed; a fourth gate formed on the main surface of the semiconductor substrate where the second channel region is located, on a side of the fourth impurity region, with a fourth insulating film capable of accumulating charges being interposed; a first connection portion formed on the isolation region located between the first region and the second region and connecting the second gate formed on the first region and the third gate formed on the second region to each other; and a second connection portion formed between the first connection portions. The second connection portion includes a first conductive film and a second conductive film formed around the first conductive film with a fifth insulating film being interposed.

According to another aspect of the present invention, a semiconductor memory device includes: a semiconductor substrate; an isolation region selectively formed on a main surface of the semiconductor substrate; an active region defined by the isolation region on the main surface of the semiconductor substrate; a first impurity region formed on the active region; a second impurity region formed on the active region; a channel region formed on the main surface of the semiconductor substrate located between the first impurity region and the second impurity region; an enclosing first gate formed on an upper surface of the channel region on a side of the first impurity region, with a first insulating film being interposed; a recessed portion formed on a side surface of the first gate located on a side of the second impurity region; an enclosing second gate formed on an upper surface of the channel region on a side of the second impurity region, with a second insulating film capable of accumulating charges being interposed, as well as on a side surface of the first gate; a connection portion connected to the second gate and formed in the recessed portion; and a voltage application portion connected to the connection portion, capable of applying a voltage to the second gate.

According to another aspect of the present invention, a method of manufacturing a semiconductor memory device includes the steps of: defining an active region by selectively forming an isolation region on a main surface of a semiconductor substrate; forming a first insulating film on the active region; forming a first conductive film on the first insulating film; forming a conductive film pattern having an opening in a region serving as a first impurity region that can serve as a source region and a recessed portion on a side surface on a side of the first impurity region, by patterning the first conductive film; forming the first impurity region by introducing an impurity into the main surface of the semiconductor substrate, using the conductive film pattern as a mask; forming a second insulating film covering the conductive film pattern, capable of accumulating charges; forming a second conductive film on the second insulating film; forming a second gate on a side surface of the opening in the conductive film pattern, with the second insulating film being interposed, by etching the second conductive film and the second insulating film; forming a first gate on the main surface of the semiconductor substrate that surrounds the first impurity region by etching a region where a second impurity region serving as a drain region is located, in the conductive film pattern; and forming the second impurity region by introducing an impurity into the main surface of the semiconductor substrate.

According to the semiconductor memory device (semiconductor integrated circuit device) and the method of manufacturing the same of the present invention, the total number of steps can be reduced and lower cost can be achieved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention will be described with reference to FIGS. 1 to 85.

First Embodiment

Figure 1:
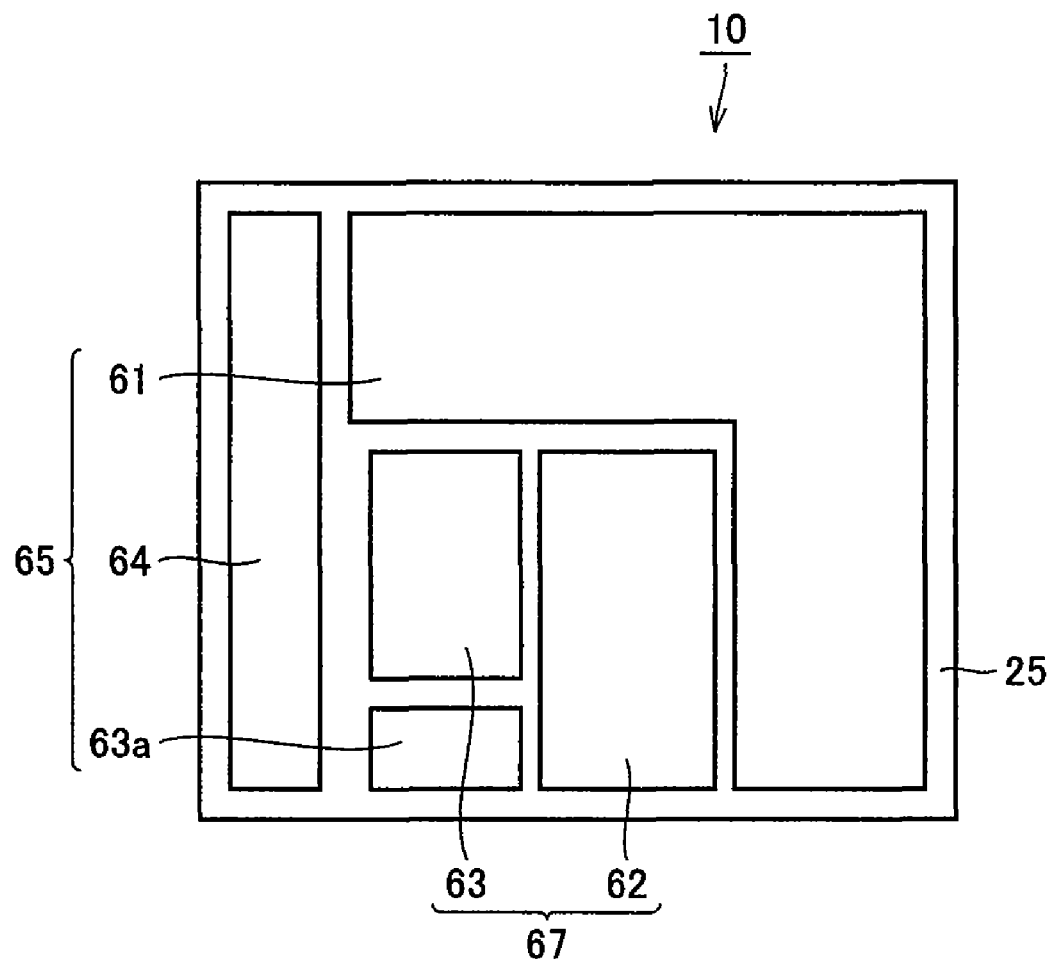
FIG. 1 is a plan view schematically showing a semiconductor integrated circuit device (non-volatile semiconductor memory device) according to a first embodiment.

FIG. 1 is a plan view schematically showing a semiconductor integrated circuit device (non-volatile semiconductor memory device) 10 according to a first embodiment. Semiconductor integrated circuit device 10 is applied as an embedded microcomputer incorporating a flash memory having a MONOS (Metal Oxide Nitride Oxide Silicon) structure. Semiconductor integrated circuit device 10 includes a peripheral circuit region 65 and a memory cell region 67 on a substrate.

Peripheral circuit region 65 includes, for example, an MPU (Micro Processing Unit) region 61, an I/O (Input/Output) region 64, and an ROM control region 63a.

Memory cell region 67 includes an ROM region 63 and an RAM (Read Access Memory) region 62.

Figure 2:
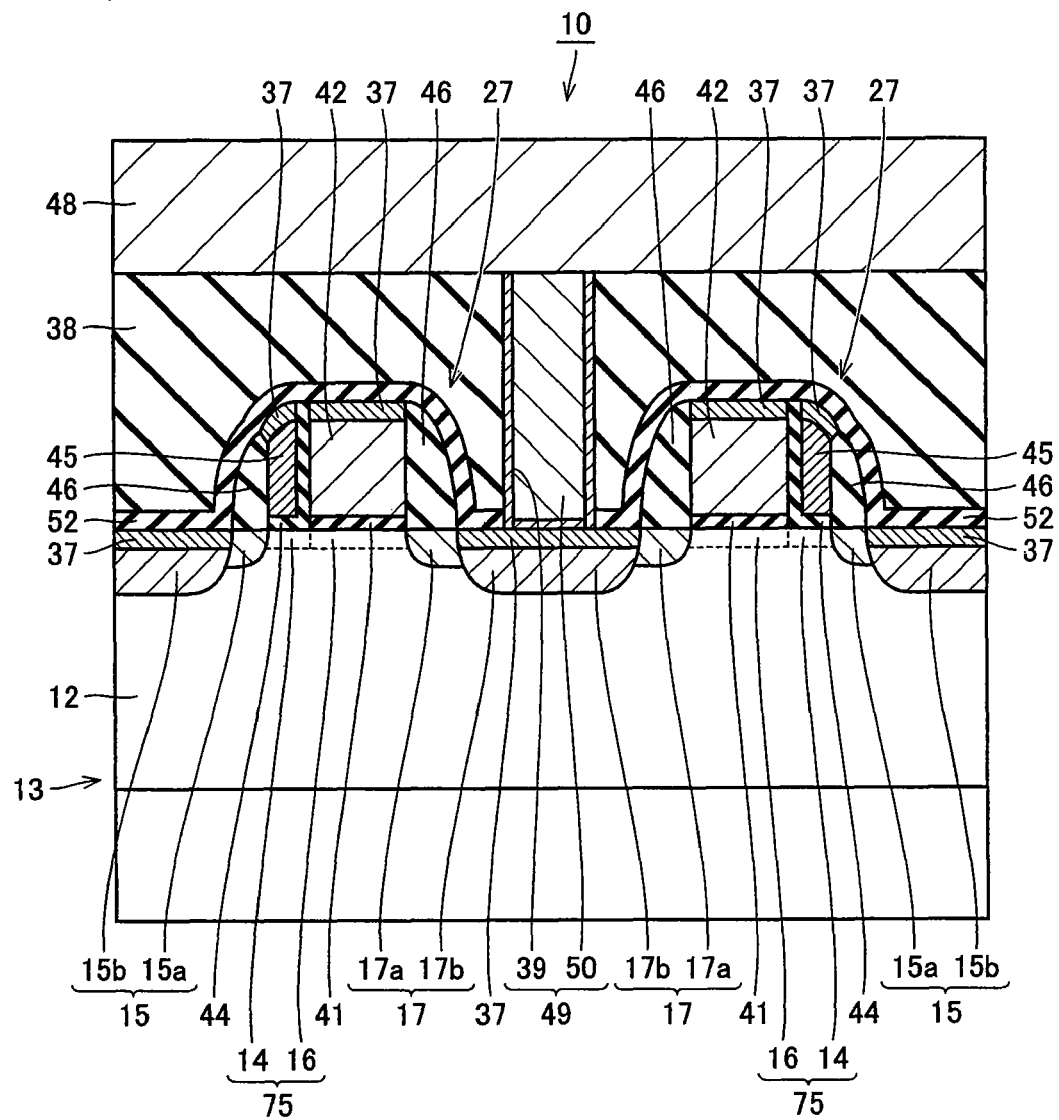
FIG. 2 is a cross-sectional view of an ROM (Read Only Memory) region in a memory cell region.

Each region 61, 63a, 64, 63, 62 is defined by an isolation region 25 selectively formed on a main surface of a semiconductor substrate 13. Isolation region 25 is implemented by a groove formed by etching the main surface of semiconductor substrate 13, for example, to a depth of approximately 300 nm and an insulating film such as a silicon oxide film filling the groove. FIG. 2 is a cross-sectional view of ROM region 63 of the memory cell region. As shown in FIG. 2, a plurality of memory cell transistors 27 are formed in ROM region 63 of memory cell region 67.

In memory cell region 67, a P-type well 12 is formed on the main surface side of semiconductor substrate 13. For example, a plurality of memory cell transistors (first transistors) 27 having a MONOS structure or the like are formed on the main surface of semiconductor substrate 13, and a bit line 48 is provided on a side of an upper surface of memory cell transistor 27. Memory cell transistor 27 includes a drain region (first impurity region) 17 formed on semiconductor substrate 13, a source region (second impurity region) 15 formed on the main surface of semiconductor substrate 13, a channel region 75 formed between source region 15 and drain region 17 on the main surface of semiconductor substrate 13, a control gate (first gate) 42 formed on the main surface of semiconductor substrate 13 where channel region 75 is located, on a side of drain region 17, with an insulating film (first insulating film) 41 being interposed, and a memory gate electrode (second gate) 45 formed on the main surface of semiconductor substrate 13 where channel region 75 is located, on a side of source region 15, with an insulating film (second insulating film) 44 capable of accumulating charges being interposed.

Control gate 42 is formed, for example, from a conductive film such as a polycrystalline silicon film having an impurity such as phosphorus (P) implanted (introduced). Control gate 42 has a thickness, for example, of approximately 200 nm, in a direction perpendicular to the main surface of semiconductor substrate 13, and a width, for example, of approximately 90 nm in a direction in parallel to the main surface of semiconductor substrate 13.

An insulating film 46 like a sidewall implemented, for example, by a silicon oxide film or the like is formed on a side surface of control gate 42 on a side of drain region 17. Memory gate electrode 45 is formed like a sidewall on a side surface of control gate 42 on a side of source region 15, and implemented, for example, by a conductive film such as a polycrystalline silicon film. A bottom portion of memory gate electrode 45 like a sidewall has a width, for example, of approximately 45 nm. Insulating film 46 like a sidewall implemented by a silicon oxide film or the like is formed on a side surface of memory gate electrode 45 on a side of source region 15.

Source region 15 has an LDD (Lightly Doped Drain) structure having a low-concentration impurity diffusion layer 15a having an n-type impurity such as arsenic (As) introduced and a high-concentration impurity diffusion layer 15b having an n-type impurity introduced in a concentration higher than in low-concentration impurity diffusion layer 15a. Not only arsenic but also phosphorus is implanted in low-concentration impurity diffusion layer 15a, for example, in an ion implantation amount (dose amount) of $10^{13}$ to $10^{14}/cm^{-2}$.

In thermal diffusion, phosphorus tends to diffuse more readily than arsenic in a direction in parallel to the main surface of semiconductor substrate 13. Accordingly, concentration is lower in an end portion of low-concentration impurity diffusion layer 15a on a side of control gate 42, than in a central portion of low-concentration impurity diffusion layer 15a. Here, a charge density region of an impurity suitable for forming a hole can be formed in the end portion of low-concentration impurity diffusion layer 15a. In addition, such a structure that a boron impurity diffusion layer surrounds an arsenic impurity diffusion layer (Halo structure) can be implemented by introducing boron simultaneously with forming low-concentration impurity diffusion layer 15a using arsenic, whereby higher electric field can be achieved.

Drain region 17 is implemented in a manner similar to source region 15, and includes an n-type low-concentration impurity diffusion layer 17a and a high-concentration impurity diffusion layer 17b attaining a concentration higher than low-concentration impurity diffusion layer 17a.

On an upper surface of memory gate electrode 45, an upper surface of control gate 42, an upper surface of source region 15, and an upper surface of drain region 17, a metal silicide film 37 composed, for example, of cobalt silicide (CoSi) or nickel silicide (NiSi) is formed. Here, the upper surface of control gate 42 is formed flat from the side of source region 15 toward the side of drain region 17, and metal silicide film 37 formed on the upper surface of control gate 42 is also formed flat from the side of source region 15 toward the side of drain region 17. Therefore, as metal silicide film 37 has an even thickness, resistance of control gate 42 can be uniform, and the resistance of control gate 42 can be set to a desired value.

Channel region 75 includes a channel region under memory gate (first channel region) 14 located on the side of source region 15 and formed in a region under memory gate electrode 45 and a channel region under control gate (second channel region) 16 located on the side of drain region 17 and formed in a region under control gate 42.

The charge density (impurity concentration) of channel region under memory gate 14 is smaller than that of channel region under control gate 16. For example, the charge density of channel region under memory gate 14 is set preferably to $10^{17}$ to $10^{18}/cm^3$, more preferably to $3\times10^{17}$ to $7\times10^{17}/cm^3$, and set, for example, to approximately $5\times10^{17}/cm^3$. The charge density (impurity concentration) of the impurity of channel region under control gate 16 is set, for example, to $10^{18}/cm^3$.

Insulating film 44 is formed on the main surface of semiconductor substrate 13 under memory gate electrode 45 and between control gate 42 and memory gate electrode 45.

Insulating film 44 is formed, for example, by successively stacking a silicon oxide film having a thickness of approximately 5 nm in a direction perpendicular to the main surface of semiconductor substrate 13, a silicon nitride film having a thickness of approximately 10 nm formed on the silicon oxide film, and a silicon oxide film having a thickness of approximately 5 nm formed on the silicon nitride film. Namely, insulating film 44 has a thickness of approximately 20 nm in a direction perpendicular to the main surface of semiconductor substrate 13.

Insulating film 41 is formed on the main surface of semiconductor substrate 13 under control gate 42, and implemented, for example, by a silicon oxide film having a thickness of approximately 3 nm.

An insulating film 52 is formed on the surface of memory cell transistor 27 configured as above, and an interlayer insulating film 38 is formed on an upper surface of insulating film 52. Bit line 48 is formed on an upper surface of interlayer insulating film 38.

A contact portion 49 is formed in metal silicide film 37 formed on the upper surface of drain region 17. Contact portion 49 is implemented by a contact hole extending from the upper surface to a lower surface of interlayer insulating film 38, a conductive film 39 formed on an inner wall surface of the contact hole, and a conductive film 50 formed on the surface side of conductive film 39 and filling the contact hole. Contact portion 49 penetrates interlayer insulating film 38 and is connected to bit line 48 formed on interlayer insulating film 38.

Figure 3:
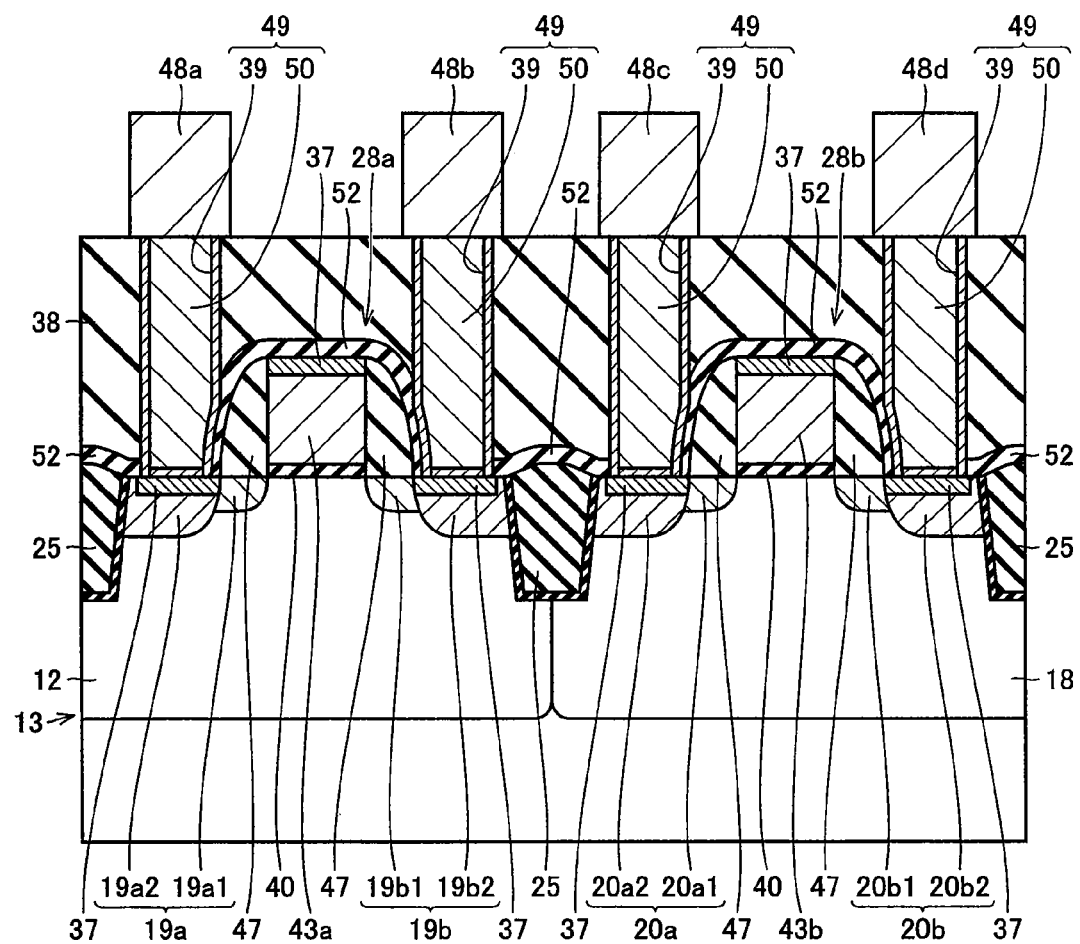
FIG. 3 is a cross-sectional view in a peripheral circuit region.

FIG. 3 is a cross-sectional view in peripheral circuit region 65. As shown in FIG. 3, P-type well 12 and an N-type well 18 are formed on the main surface of semiconductor substrate 13 where peripheral circuit region 65 is located. Isolation region (STI (Shallow Trench Isolation)) 25 is formed at a boundary between P-type well 12 and N-type well 18. A peripheral circuit transistor 28*a* is formed on an upper surface of P-type well 12, and a peripheral circuit transistor 28*b* is formed on an upper surface of N-type well 18. Insulating film 52 is formed on upper surfaces of peripheral circuit transistors 28*a*, 28*b*, and interlayer insulating film 38 is formed on insulating film 52. A plurality of upper interconnections 48*a*, 48*b*, 48*c*, and 48*d* are arranged on the upper surface of interlayer insulating film 38. Peripheral circuit transistor 28*a* includes a gate electrode 43*a* formed on the main surface of semiconductor substrate 13, with a gate insulating film 40 being interposed.

A height of gate electrode 43*a* in a direction perpendicular to the main surface of semiconductor substrate 13 is substantially the same as that of control gate 42 of memory cell transistor 27 shown in FIG. 2.

Peripheral circuit transistor 28*a* includes a source region 19*a* and a drain region 19*b* formed on the main surface of semiconductor substrate 13. A sidewall 47 is formed on a side surface of gate electrode 43*a*.

Source region 19*a* includes an N-type low-concentration impurity diffusion layer 19*a*1 and an N-type high-concentration impurity diffusion layer 19*a*2 attaining a concentration higher than density of charges introduced in low-concentration impurity diffusion layer 19*a*1. The drain region is implemented in a manner similar to source region 19*a*, and includes a low-concentration impurity diffusion layer 19*b*1 and a high-concentration impurity diffusion layer 19*b*2 attaining density of charges higher than low-concentration impurity diffusion layer 19*b*1. On the upper surfaces of gate electrode 43*a*, source region 19*a* and drain region 19*b*, metal silicide film 37 composed, for example, of cobalt silicide (CoSi) or nickel silicide (NiSi) is formed.

Peripheral circuit transistor 28*b* includes a gate electrode 43*b* formed above the main surface of semiconductor substrate 13, gate insulating film 40 formed on the main surface of semiconductor substrate 13 under gate electrode 43*b*, and a P-type source region 20*a* and a P-type drain region 20*b* formed on the main surface of semiconductor substrate 13 that are adjacent to gate electrode 43*b*. Metal silicide film 37 is formed also on the upper surfaces of gate electrode 43*b*, source region 20*a* and drain region 20*b*. Contact portion 49 is connected to upper interconnections 48*c* and 48*d*.

Figure 4:
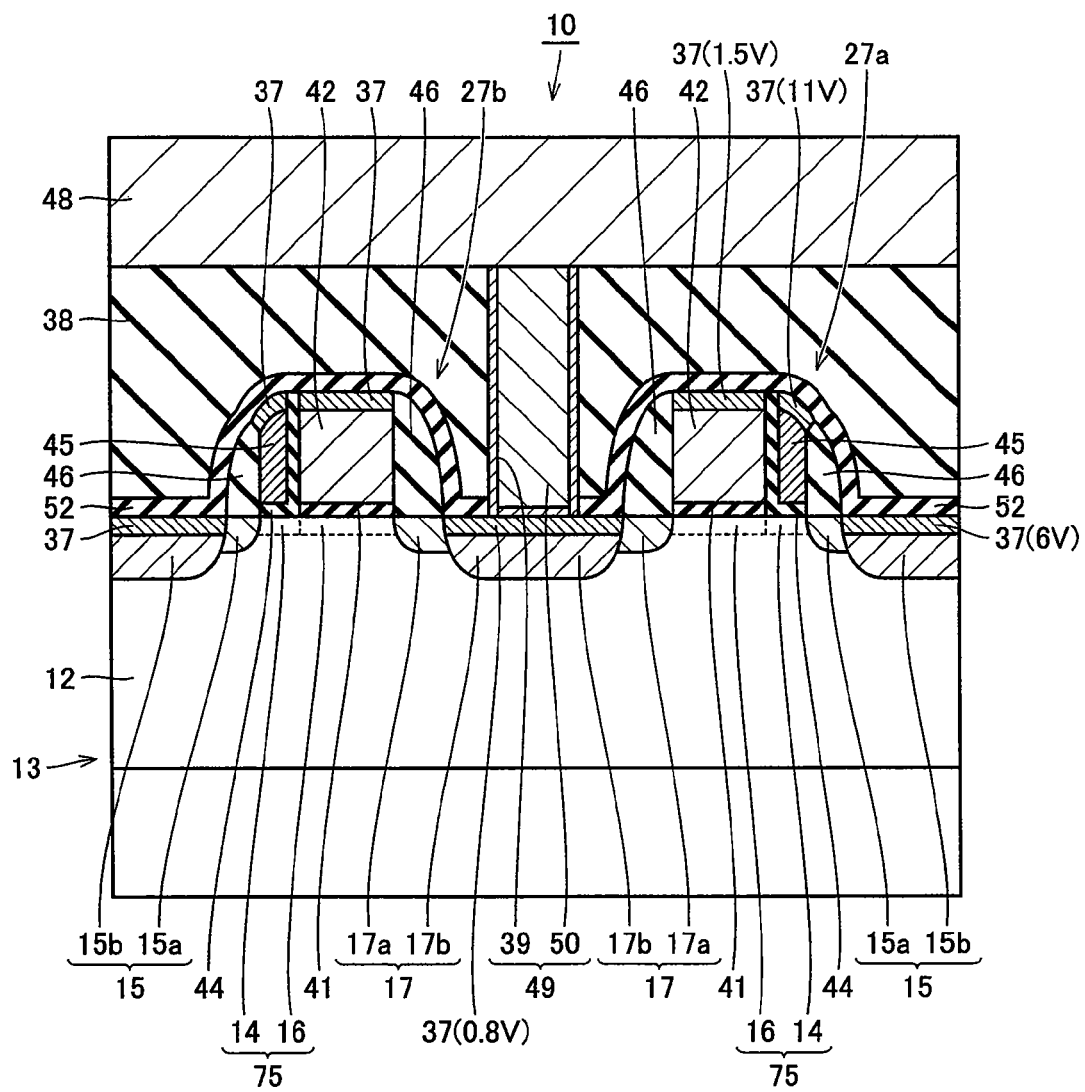
FIG. 4 is a cross-sectional view of the memory cell region in a writing operation.

A writing or program operation of semiconductor integrated circuit device 10 configured as above will be described with reference to FIG. 4. FIG. 4 is a cross-sectional view of memory cell region 67 in the writing operation. As shown in FIG. 4, for example, a voltage of approximately 0.8V is applied to drain region 17 of selected memory cell transistor 27*a*, and for example, a voltage of approximately 6V is applied to source region 15. A voltage of approximately 11V is applied to memory gate electrode 45, and a voltage of approximately 1.5V is applied to control gate 42.

When the voltage is applied in this manner, a large electric field is created around the boundary between control gate 42 and memory cell gate electrode 45, and a large number of hot electrons are generated. Electrons are trapped in insulating film 44 that can accumulate charges and enter a silicon nitride portion in insulating film 44, whereby electric information is written. This phenomenon is known as source side injection (SSI).

Figure 5:
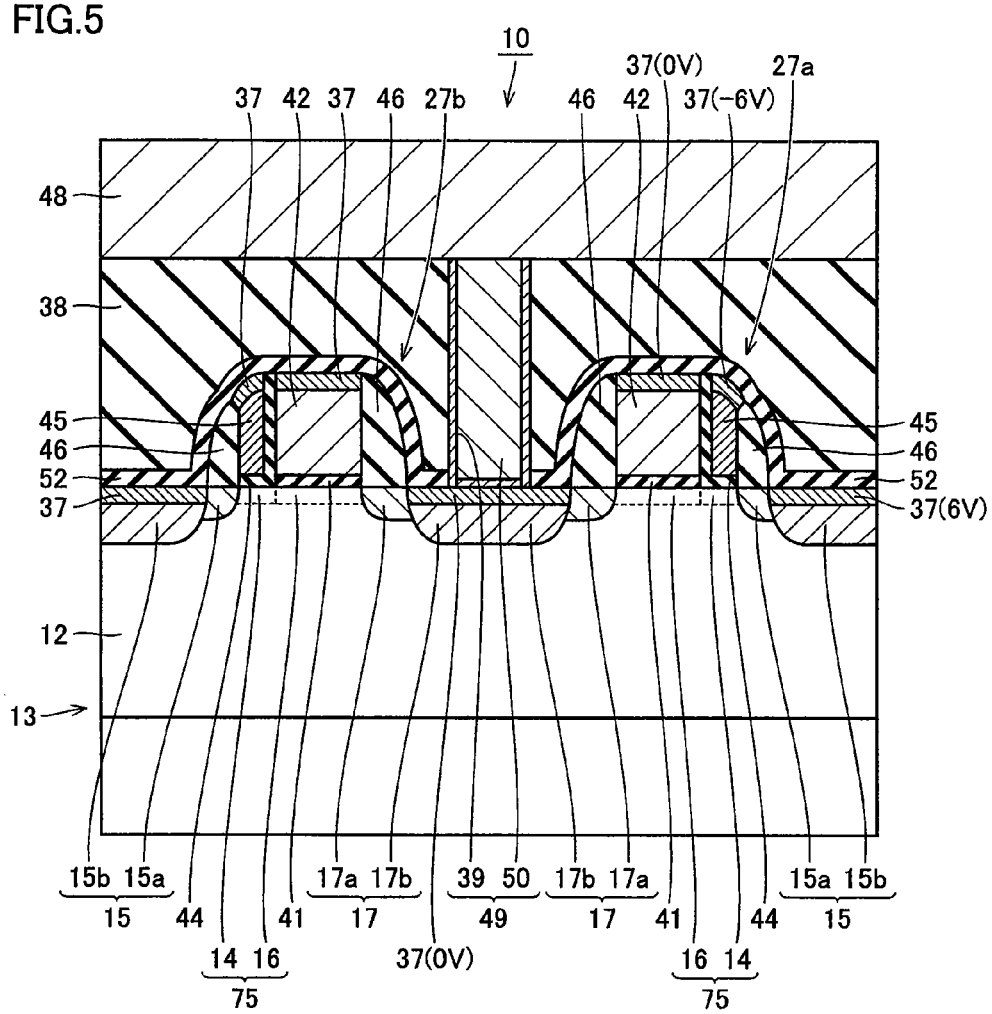
FIG. 5 is a cross-sectional view of the memory cell region in an erase operation.

An erase operation of semiconductor integrated circuit device 10 configured as above will be described with reference to FIG. 5. FIG. 5 is a cross-sectional view of memory cell region 67 in the erase operation. As shown in FIG. 5, for example, a voltage of approximately 6V is applied to source region 15, and a voltage of approximately 0V is applied to drain region 17. A voltage of approximately 0V is applied to control gate 42, and a voltage of approximately −6V is applied to memory gate electrode 45.

By applying a negative potential to memory gate electrode 45 and a positive potential to the impurity diffusion layer on the side of the memory gate, strong inversion occurs in the end portion of source region 15 on the side of memory gate electrode 45, interband tunneling phenomenon takes place, and holes can be generated. The generated holes are pulled by the application of bias and implanted into insulating film 44 under memory gate electrode 45, thereby performing an erase operation.

The electrons implanted into insulating film 44 are neutralized by the holes, so as to lower the raised threshold voltage.

In a reading operation, for example, a voltage of approximately 1.5V is applied to control gate 42 and memory gate electrode 45 of selected memory cell transistor 27. In addition, for example, a voltage of approximately 0V is applied to source region 15, and for example, a voltage of approximately 1.5V is applied to drain region 17. In this manner, a voltage between the threshold voltage in a written state of selected memory cell transistor 27 and the threshold voltage of memory cell transistor 27 in an erased state is applied between source region 15 and drain region 17. Here, if electrons have been trapped in insulating film 44 of selected memory cell transistor 27 and the threshold voltage has been raised, an OFF state is maintained. Meanwhile, if the holes have been implanted in insulating film 44, an ON state is established.

A method of manufacturing semiconductor integrated circuit device 10 configured as above will now be described.

Figure 6:
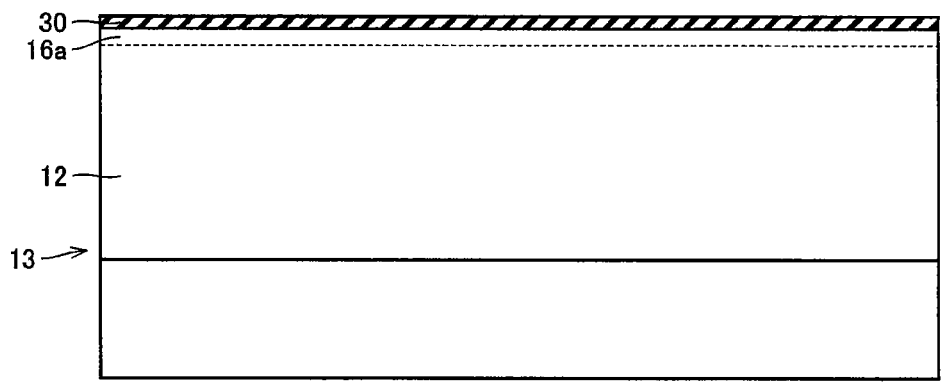
FIG. 6 is a cross-sectional view of the memory cell region in the first step of the semiconductor integrated circuit device.
Figure 7:
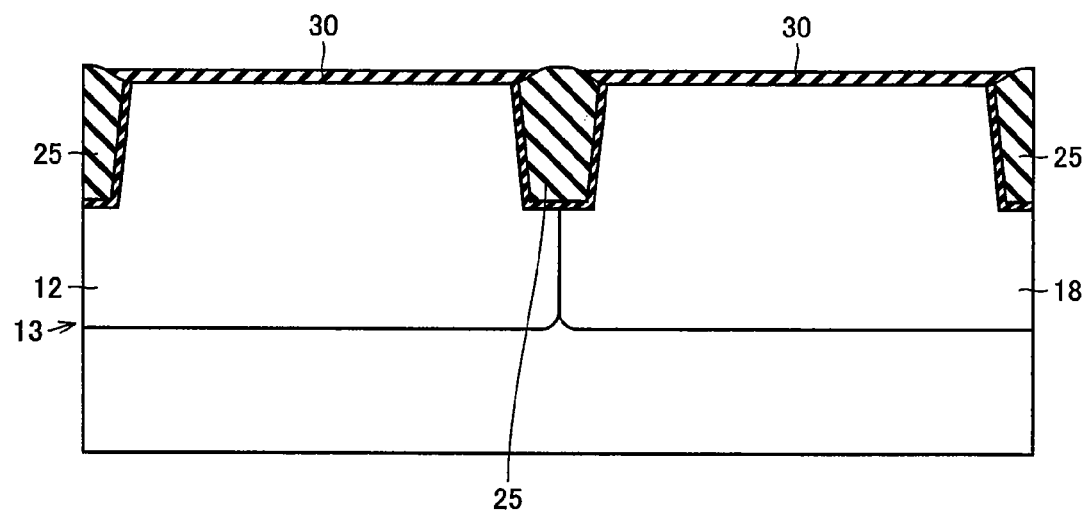
FIG. 7 is a cross-sectional view in the peripheral circuit region in the first step of the semiconductor integrated circuit device.

FIG. 6 is a cross-sectional view in memory cell region 67 in the first step of the step of manufacturing semiconductor integrated circuit device 10, and FIG. 7 is a cross-sectional view in peripheral circuit region 65 in the first step.

As shown in FIG. 7, the main surface of semiconductor substrate 13 is selectively etched, for example, by approximately 300 nm, so as to form a groove serving as isolation region (element isolation region) 25. Thereafter, thermal oxidation is performed so as to form a thermal oxide film having a thickness, for example, of approximately 10 nm on the main surface of semiconductor substrate 13 and on an inner surface of the groove portion. After the thermal oxide film is formed in this manner, an insulating film such as a silicon oxide film is deposited on the main surface of semiconductor substrate 13, for example, to a thickness of approximately 500 nm, and the silicon oxide film fills the groove portion using CMP (Chemical Mechanical Polishing), thereby forming isolation region 25.

By selectively forming isolation region 25 in this manner, ROM region 63 where memory cell transistor 27 shown in FIG. 2 is formed, RAM region 62, a logic circuit region (peripheral circuit region) 65, and the like in FIG. 1 are defined on the main surface of semiconductor substrate 13.

After isolation region 25 is formed in this manner, insulating film 30 composed of silicon oxide is formed as a result of thermal oxidation such as ISSG (In-Situ Steam Generation) oxidation, for example, to a thickness of approximately 5 nm on the main surface of semiconductor substrate 13. Here, as shown in FIG. 6, an impurity region 16a is formed on the main surface of semiconductor substrate 13 where memory cell region 67 in FIG. 1 is located, for example, by introducing an impurity in charge density of approximately $10^{18}/cm^3$.

Figure 8:
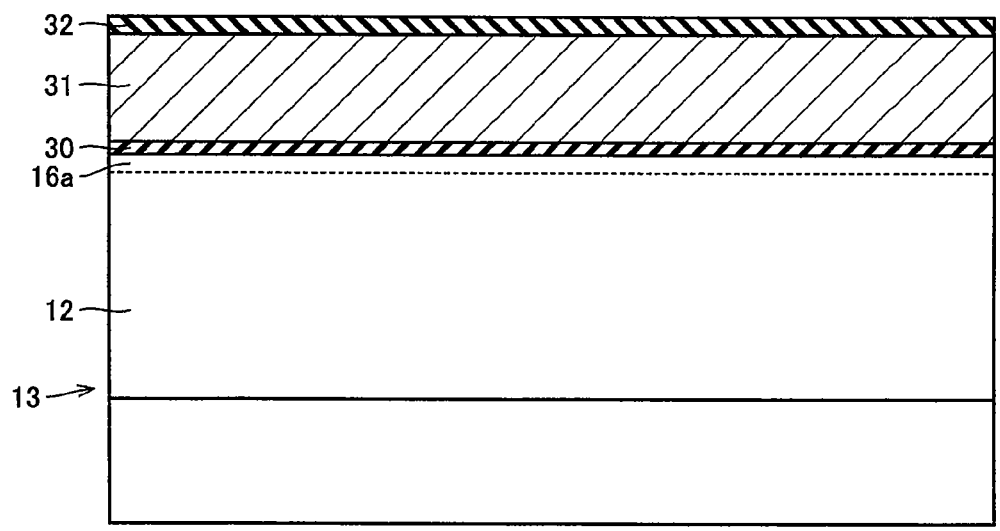
FIG. 8 is a cross-sectional view of the memory cell region in the second step of the semiconductor integrated circuit device.
Figure 9:
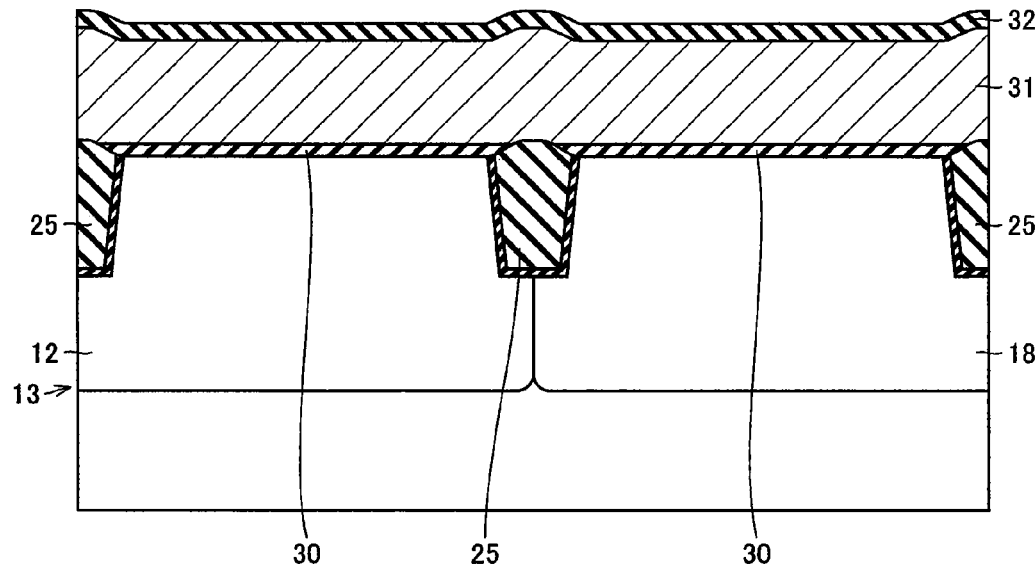
FIG. 9 is a cross-sectional view of the peripheral circuit region in the second step of the semiconductor integrated circuit device.

FIG. 8 is a cross-sectional view of memory cell region 67 in the second step of semiconductor integrated circuit device 10 (the step of forming a first conductive film). FIG. 9 is a cross-sectional view of peripheral circuit region 65 in the second step of semiconductor integrated circuit device 10. As shown in FIGS. 8 and 9, a conductive film 31 implemented by a polysilicon film is deposited, for example, to a thickness of approximately 2.9 nm on the upper surface of insulating film 30 formed on the entire surface of peripheral circuit region 65 and memory region 67 of the main surface of semiconductor substrate 13. Then, an insulating film 32 is deposited on an upper surface of conductive film 31 implemented by the polysilicon film with CVD (Chemical Vapor Deposition) using a TEOS (Tetraethoxysilane) gas.

Figure 10:
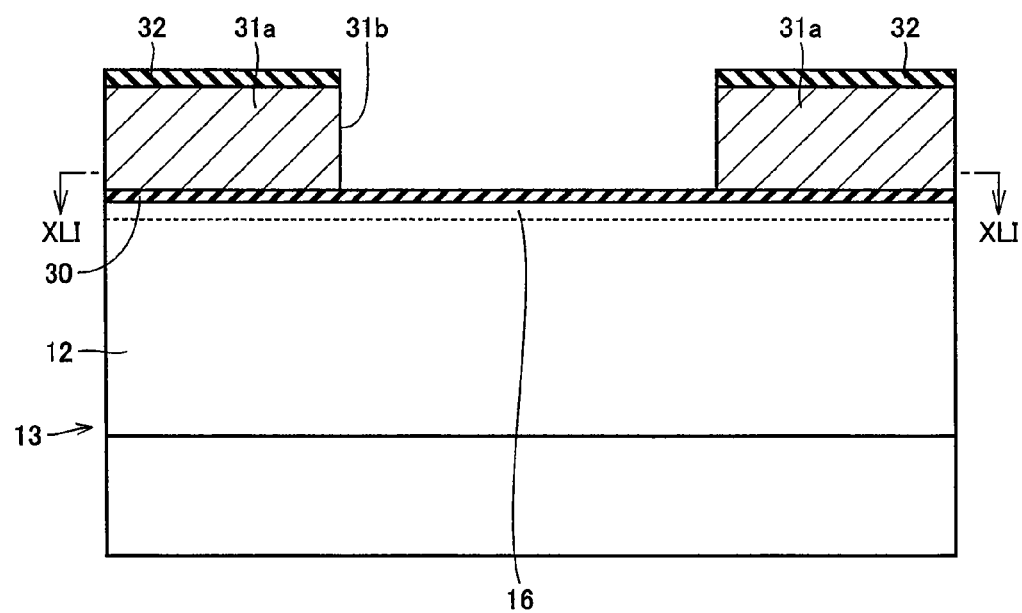
FIG. 10 is a cross-sectional view of the memory cell region in the third step (the step of patterning a first conductive film) of the semiconductor integrated circuit device.
Figure 11:
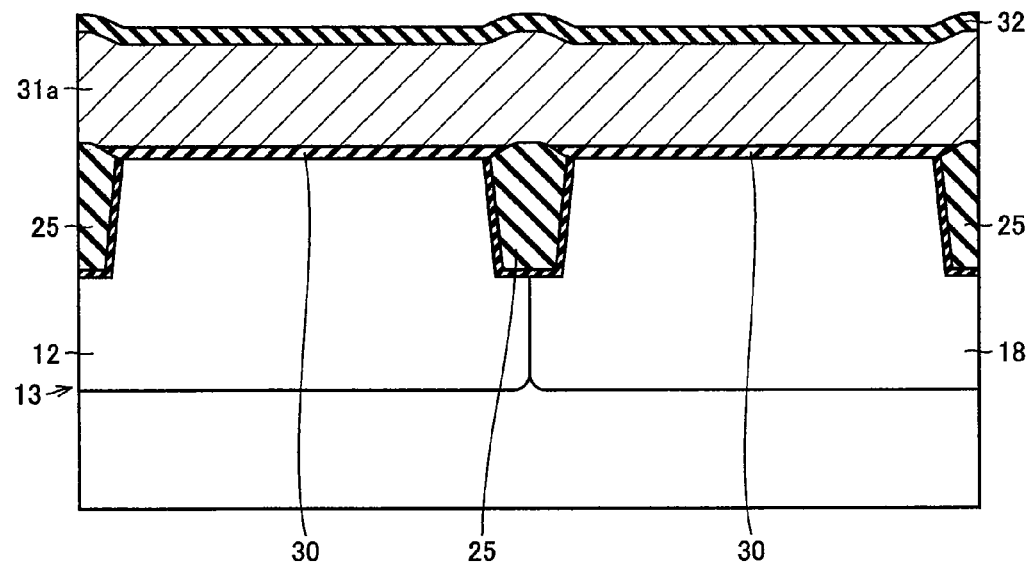
FIG. 11 is a cross-sectional view in the peripheral circuit region in the third step of the semiconductor integrated circuit device.

FIG. 10 is a cross-sectional view of memory cell region 67 in the third step of semiconductor integrated circuit device 10 (the step of patterning the first conductive film). As shown in FIG. 10, insulating film 32 and conductive film 31 are patterned, so as to form a conductive pattern 31a having an opening 31b in a region serving as source region 15 of memory cell transistor 27 shown in FIG. 2. FIG. 11 is a cross-sectional view in peripheral circuit region 65 in the third step of semiconductor integrated circuit device 10. As shown in FIG. 11, the main surface of semiconductor substrate 13 in peripheral circuit region 65 is covered with conductive film pattern 31a.

Figure 12:
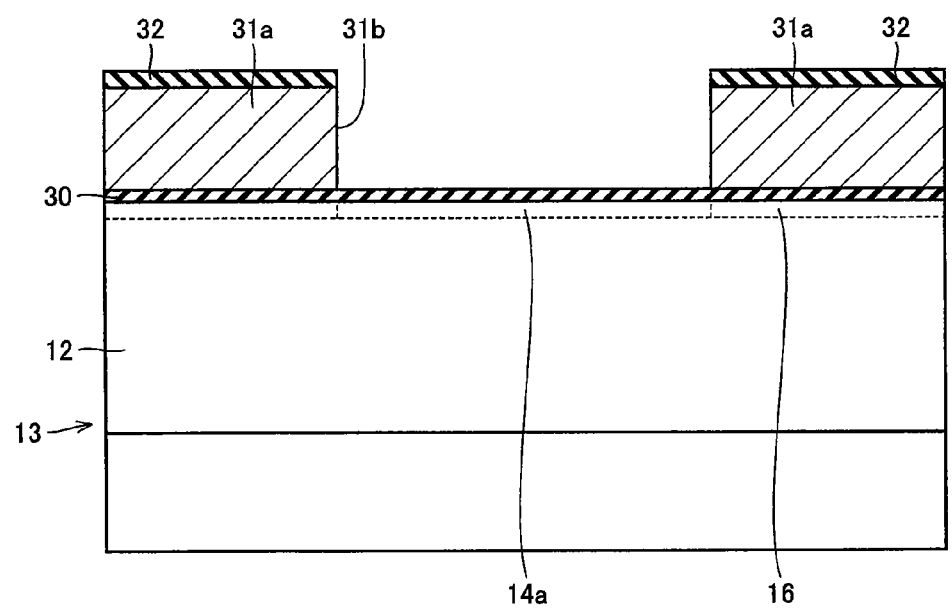
FIG. 12 is a cross-sectional view of the memory cell region in the fourth step (the step of forming a channel region under memory gate of a memory cell transistor) of the semiconductor integrated circuit device.

FIG. 12 is a cross-sectional view of memory cell region 67 in the fourth step of semiconductor integrated circuit device 10 (the step of forming channel region under memory gate 14 of the memory cell transistor). As shown in FIG. 12, conductive film pattern 31a has opening 31b exposing a part of the upper surface of impurity region 16a. Using conductive film pattern 31a as a mask, an impurity having a conductivity type different from that of impurity region 16a is introduced into the main surface of semiconductor substrate 13. When the impurity having a conductivity type different from that of impurity region 16a is introduced into the main surface of semiconductor substrate 13 in this manner, an impurity region 14a having charge density lower than that of impurity region 16a is formed. In this manner, impurity region 16a remains in a portion under conductive film pattern 31a, of the main surface of semiconductor substrate 13, and impurity region 14a having the charge density lower than that of impurity region 16a is formed in a portion where opening 31b of conductive film pattern 31a is located.

By forming opening 31b in advance in conductive film pattern 31a, the impurity regions having different concentrations can be implemented without using a mask.

Figure 13:
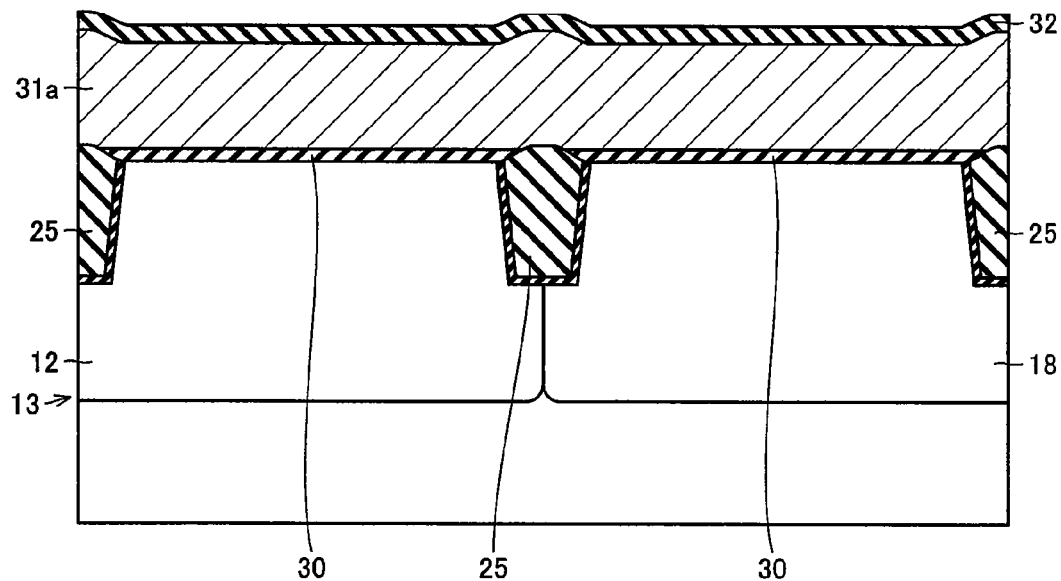
FIG. 13 is a cross-sectional view in the peripheral circuit region in the fourth step of the semiconductor integrated circuit device.

As described above, conductive pattern 31a is used as a mask, so that maskless implantation can be performed and channel region under memory gate 14 can readily be formed. FIG. 13 is a cross-sectional view in peripheral circuit region 65 in the fourth step of semiconductor integrated circuit device 10. As shown in FIG. 13, in peripheral circuit region 65, conductive film 31 and insulating film 32 formed on conductive film 31 are formed on substantially the entire main surface of semiconductor substrate 13.

Figure 14:
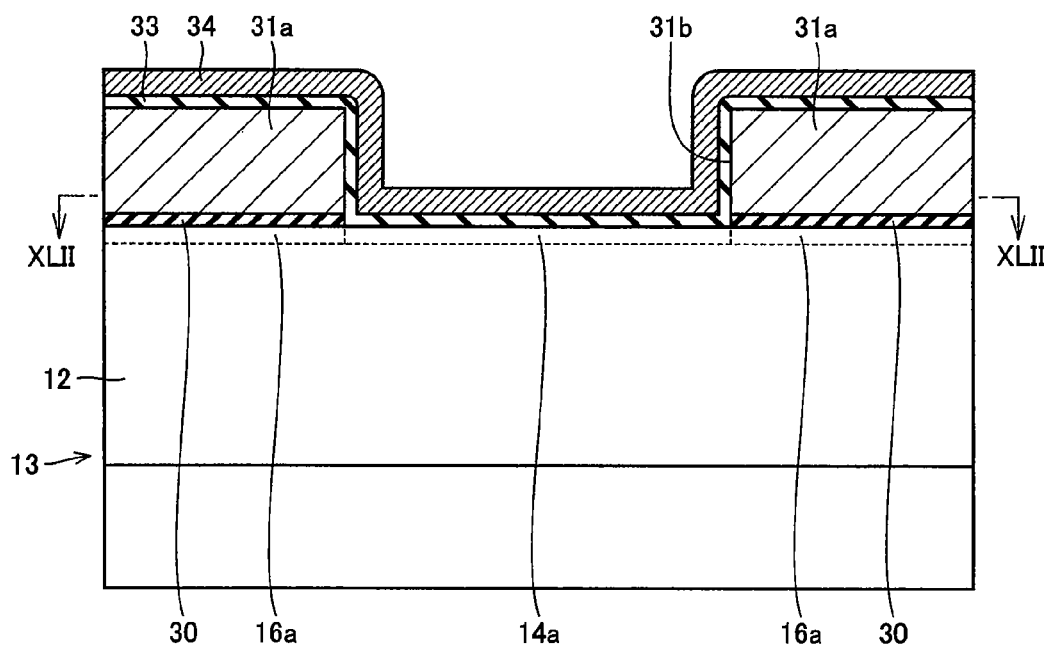
FIG. 14 is a cross-sectional view of the memory cell region in the fifth step (the step of forming a second insulating film) of the semiconductor integrated circuit device.

FIG. 14 is a cross-sectional view of memory cell region 67 in the fifth step of semiconductor integrated circuit device 10 (the step of forming a second insulating film). As shown in FIG. 14, insulating film 32 is removed, and an insulating film composed on silicon oxide, an insulating film composed of silicon nitride, and an insulating film composed of silicon oxide are successively stacked so as to cover conductive film pattern 31a. An insulating film 33 is thus formed to cover conductive film pattern 31a. It is noted that silicon oxide may be formed by using thermal oxidation such as ISSG oxidation. When insulating film 33 is formed on conductive pattern 31a as described above, a thermal oxide film is formed also on the main surface of semiconductor substrate 13 in opening 31b. On the other hand, insulating film 30 is formed between conductive pattern 31a and the main surface of semiconductor substrate 13. A conductive film 34 implemented, for example, by a polysilicon film is deposited on an upper surface of insulating film 33.

Figure 15:
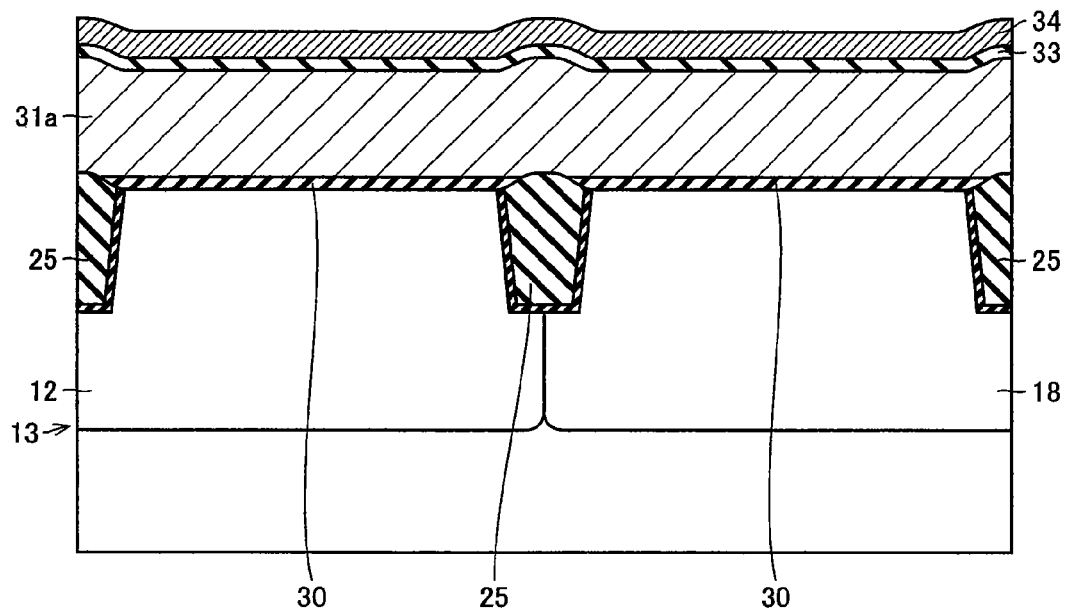
FIG. 15 is a cross-sectional view of the peripheral circuit region in the fifth step of the semiconductor integrated circuit device.

FIG. 15 is a cross-sectional view of the peripheral circuit region in the fifth step of semiconductor integrated circuit device 10. As shown in FIG. 15, in the fifth step of semiconductor integrated circuit device 10, in the region where peripheral circuit region 65 shown in FIG. 1 is located, conductive film pattern 31a formed on the main surface of semiconductor substrate 13 with insulating film 30 being interposed, insulating film 33 formed on the upper surface of conductive film pattern 31a, and conductive film 34 formed on insulating film 33 are formed.

Figure 16:
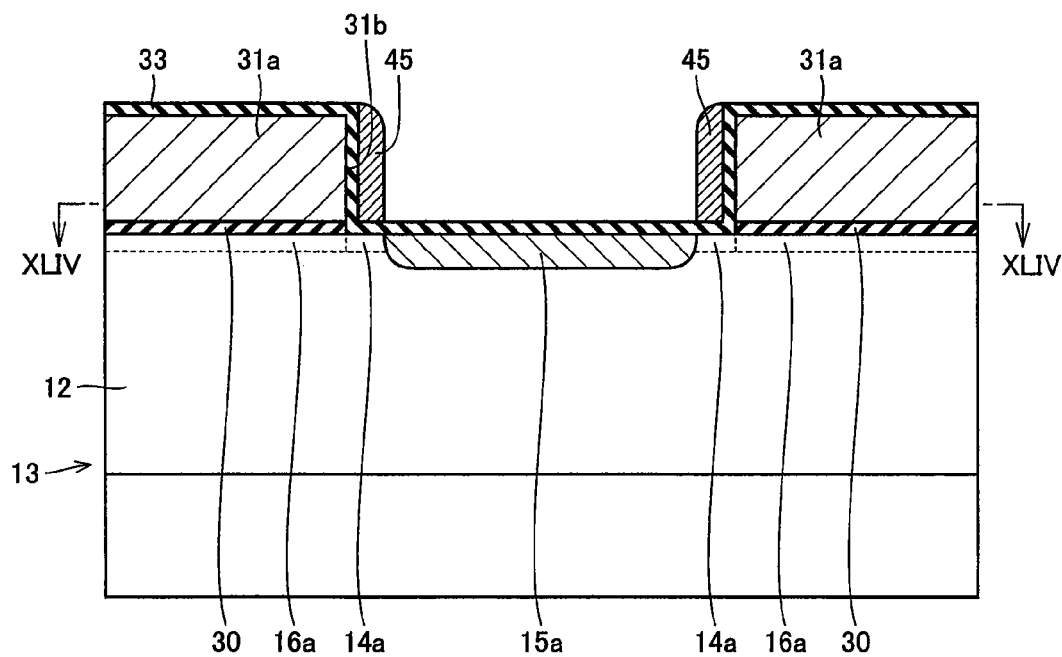
FIG. 16 is a cross-sectional view in the memory cell region in the sixth step (the step of forming a memory gate electrode/a source region) of the semiconductor integrated circuit device.

FIG. 16 is a cross-sectional view in the memory cell region in the sixth step of semiconductor integrated circuit device 10 (the step of forming the memory gate electrode/the source region). As shown in FIG. 16, conductive film 34 formed on the upper surface of insulating film 33 is etched, to form memory gate electrode 45 like a sidewall on an inner surface of opening 31b in conductive film pattern 31a. By forming opening 31b in advance in conductive film pattern 31a, memory gate electrode 45 is formed in a self-aligned manner. In other words, memory gate electrode 45 can be formed without a mask in forming the same, and the number of masks can be decreased.

In addition, unlike an example in which memory gate electrode 45 is formed through photolithography, memory gate electrode 45 can be formed in a self-aligned manner. Therefore, error in registration due to displacement of a mask or defective formation can be prevented.

Here, impurity region 14a has already been formed in a region surrounded by memory gate electrodes 45 like a sidewall, in the main surface of semiconductor substrate 13. Then, an impurity is introduced using conductive film pattern 31a and memory gate electrode 45 as a mask, to form n-type low-concentration impurity diffusion layer 15a. Accordingly, impurity region 14a remains on the main surface of semiconductor substrate 13 under memory gate electrode 45, to form channel region under memory gate 14. It is noted that impurity region 16a is formed on the main surface of semiconductor substrate 13 under conductive film pattern 31a. In this manner, according to the method of manufacturing semiconductor integrated circuit device 10 of the first embodiment, as a result of maskless implantation, channel region under memory gate 14 as well as low-concentration impurity diffusion layer 15a in source region 15 can be formed.

Figure 17:
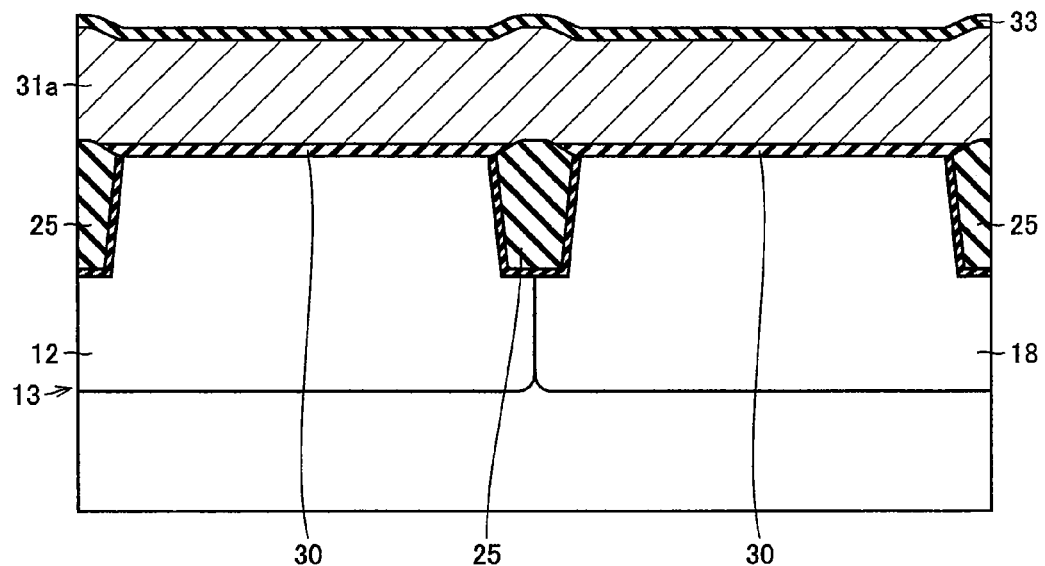
FIG. 17 is a cross-sectional view of the peripheral circuit region in the sixth step of the semiconductor integrated circuit device.

FIG. 17 is a cross-sectional view of the peripheral circuit region in the sixth step of semiconductor integrated circuit device 10. As shown in FIG. 17, conductive film 31 and insulating film 33 formed on the upper surface of conductive film 31 are successively formed on the main surface of semiconductor substrate 13 in the peripheral circuit region.

Figure 18:
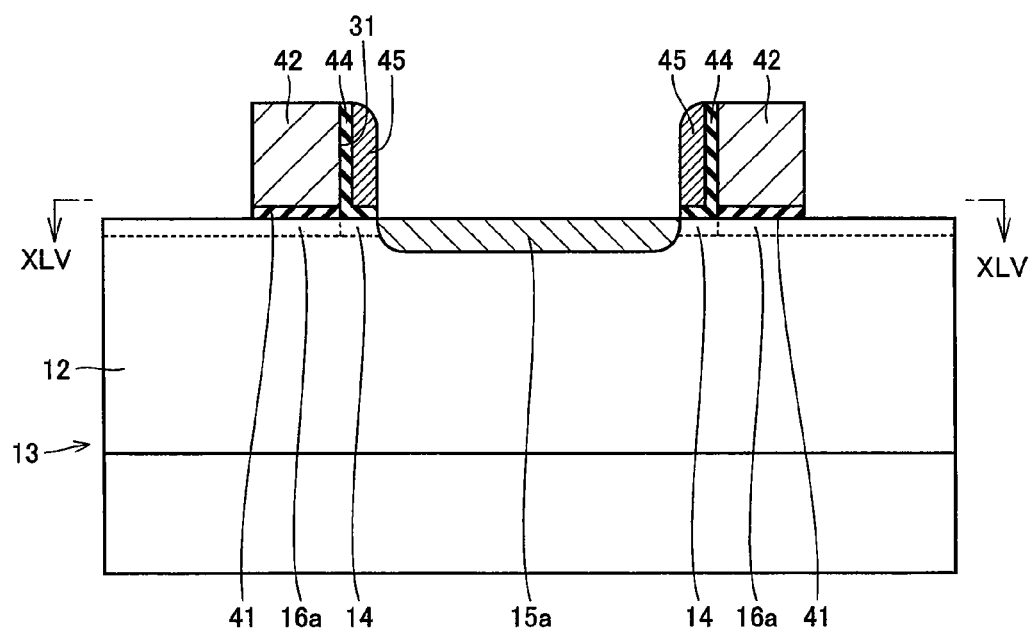
FIG. 18 is a cross-sectional view in the memory cell region in the seventh step (the step of forming a control gate and a gate electrode) of the semiconductor integrated circuit device.
Figure 19:
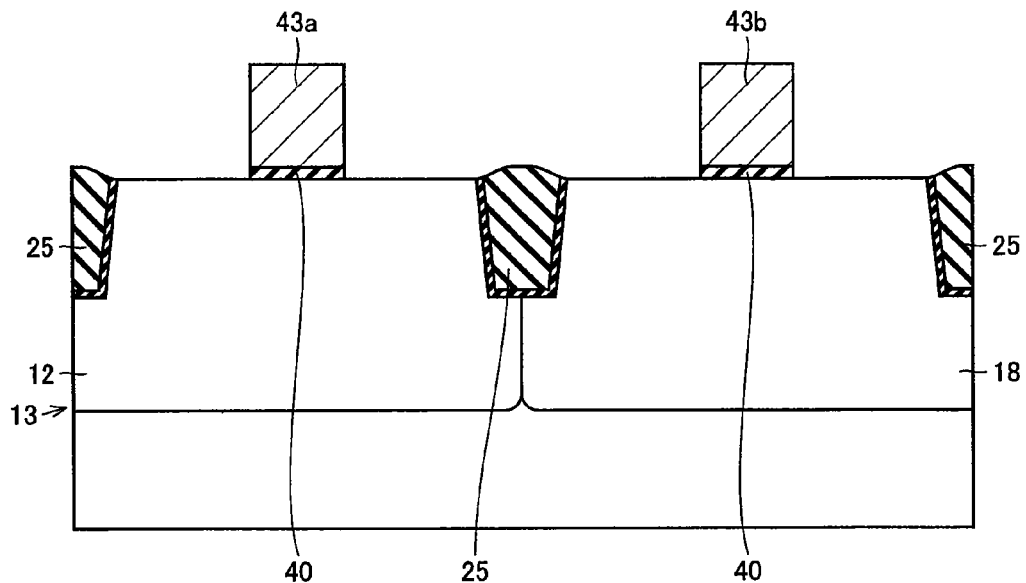
FIG. 19 is a cross-sectional view in the peripheral circuit region in the seventh step of the semiconductor integrated circuit device.

FIG. 18 is a cross-sectional view in the memory cell region in the seventh step of semiconductor integrated circuit device 10 (the step of forming the control gate and the gate electrode). FIG. 19 is a cross-sectional view in the peripheral circuit region in the seventh step of semiconductor integrated circuit device 10. In the seventh step, initially, insulating film 33 formed in the memory cell region and the peripheral circuit region shown in FIGS. 16 and 17 is removed. Here, in the memory cell region, insulating film 33 formed on the upper surface of conductive film pattern 31a and insulating film 33 formed in a region between memory gate electrodes 45 in the main surface of semiconductor substrate 13 are removed. Meanwhile, in the peripheral circuit region, insulating film 33 formed on the upper surface of conductive film pattern 31a is removed. Accordingly, insulating film 33 remains on the side surface on the side of opening 31b of conductive pattern 31a as well as on the main surface of semiconductor substrate 13 under memory gate electrode 45. In other words, insulating film 33 is formed from the lower surface toward the side surface of formed memory gate electrode 45. Insulating film 44 shown in FIG. 2 is thus formed.

After a part of insulating film 33 is removed, a photomask is arranged on the upper surface of conductive pattern 31a, and conductive pattern 31a is patterned through photolithography. As a result of patterning, control gate 42 of memory cell transistor 27 formed in the memory cell region and gate electrodes 43a, 43b of peripheral circuit transistors 28a, 28b formed in the peripheral circuit region are simultaneously formed.

In addition, as a result of patterning, drain region 17 of memory cell transistor 27 shown in FIG. 2 and drain regions 19b, 20b of peripheral circuit transistors 28a, 28b are exposed.

In patterning conductive film pattern 31a, etching employing a large etching selectivity between the silicon oxide film and the polysilicon film is adopted, so that etching damage on the main surface of semiconductor substrate 13 where each drain region 17, 19b, 20b is located can be suppressed. In this manner, etching damage on the main surface of semiconductor substrate 13 where each drain region 17, 19b, 20b is located is mitigated, thus suppressing recess in the main surface of semiconductor substrate 13 where each drain region 17, 19b, 20b is located.

Figure 20:
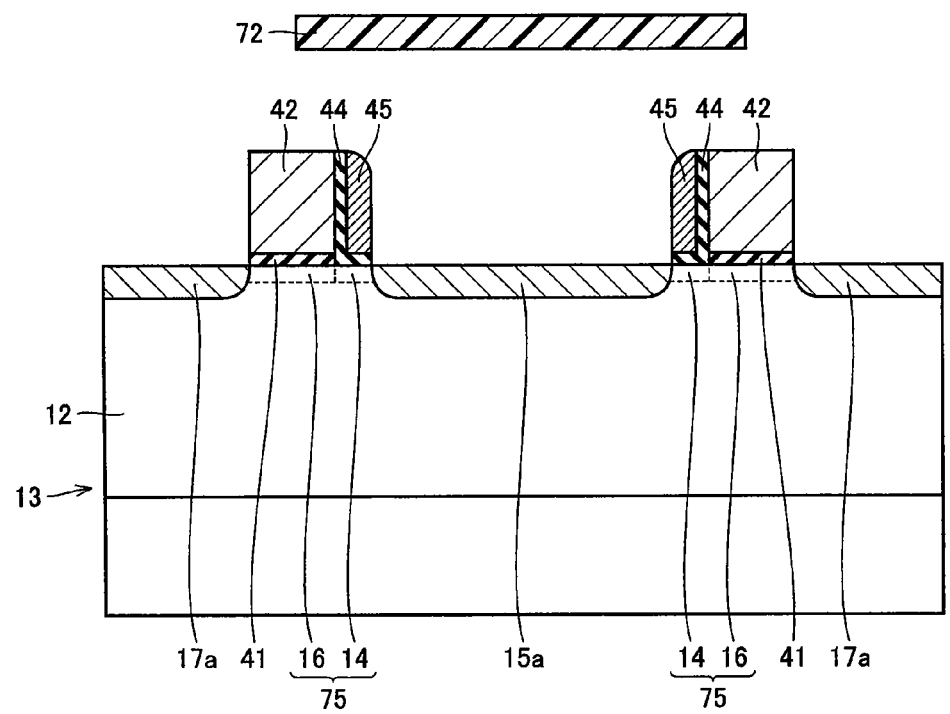
FIG. 20 is a cross-sectional view in the memory cell region in the eighth step (the step of forming a drain region of the memory cell transistor and an impurity region of a peripheral circuit transistor) of the semiconductor integrated circuit device.
Figure 21:
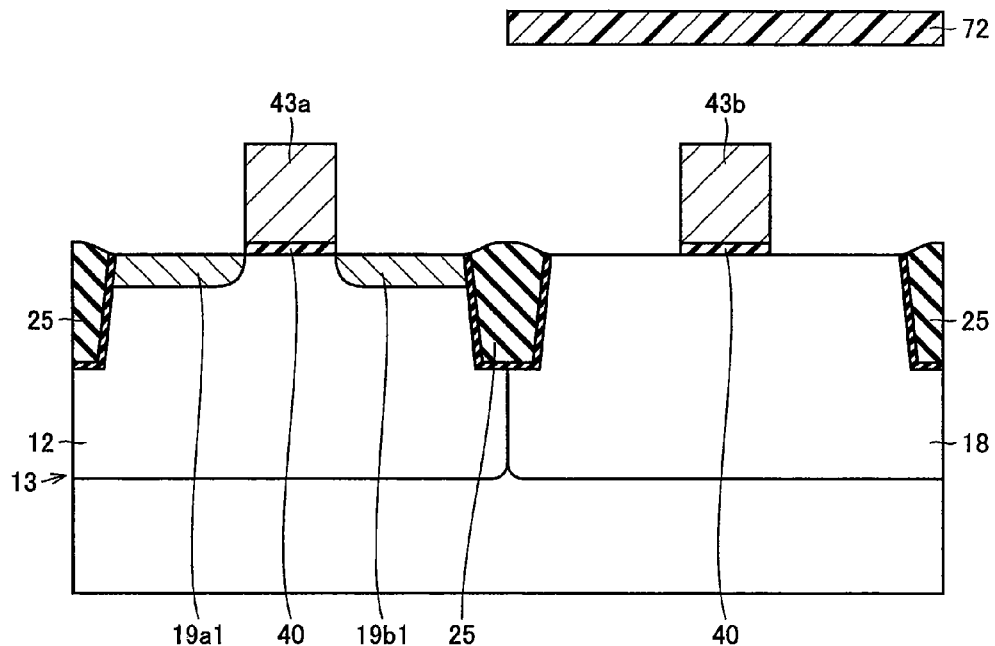
FIG. 21 is a cross-sectional view in the peripheral circuit region in the eighth step of the semiconductor integrated circuit device.

FIG. 20 is a cross-sectional view in the memory cell region in the eighth step of semiconductor integrated circuit device 10 (the step of forming the drain region of the memory cell transistor and the impurity region of the peripheral circuit transistor). FIG. 21 is a cross-sectional view in the peripheral circuit region in the eighth step of semiconductor integrated circuit device 10. In FIGS. 20 and 21, photolithography is performed, using a mask 72 having an opening in a region where drain region 17 of memory cell transistor 27 shown in FIG. 1 and source region 19a and drain region 19b of peripheral circuit transistor 28a are located. Thereafter, an impurity is implanted into the main surface of semiconductor substrate 13 exposed in a formed photoresist, so as to form low-concentration impurity diffusion layer 17a of memory cell transistor 27 and low-concentration impurity diffusion layers 19a1, 19b1 of peripheral circuit transistor 28a.

In the method of manufacturing semiconductor integrated circuit device 10 according to the first embodiment, insulating film 33 implemented by what is called an ONO (Oxide Nitride Oxide) film is not formed on the main surface of semiconductor substrate 13 where drain regions 17, 19b, 20b and source regions 19a, 20a are located. Accordingly, the main surface of semiconductor substrate 13 where drain regions 17, 19b, 20b and source regions 19a, 20a are located is not subjected to thermal oxidation treatment for forming the silicon oxide film implemented by the ONO film. Therefore, recess in the main surface of semiconductor substrate 13 where drain regions 17, 19b, 20b and source regions 19a, 20a are located due to thermal oxidation treatment for forming the ONO film can be suppressed.

In addition, as the ONO film is not formed on the main surface of semiconductor substrate 13 where drain regions 17, 19b, 20b and source regions 19a, 20a are located, damage due to removal of the ONO film does not occur and recess in the main surface of semiconductor substrate 13 where drain regions 17, 19b, 20b and source regions 19a, 20a are located is further suppressed.

If low-concentration impurity diffusion layer 17a is formed in the above-described manner, impurity region 16a shown in FIG. 18 remains as channel region under control gate 16 on the main surface of semiconductor substrate 13 under control gate 42.

Figure 22:
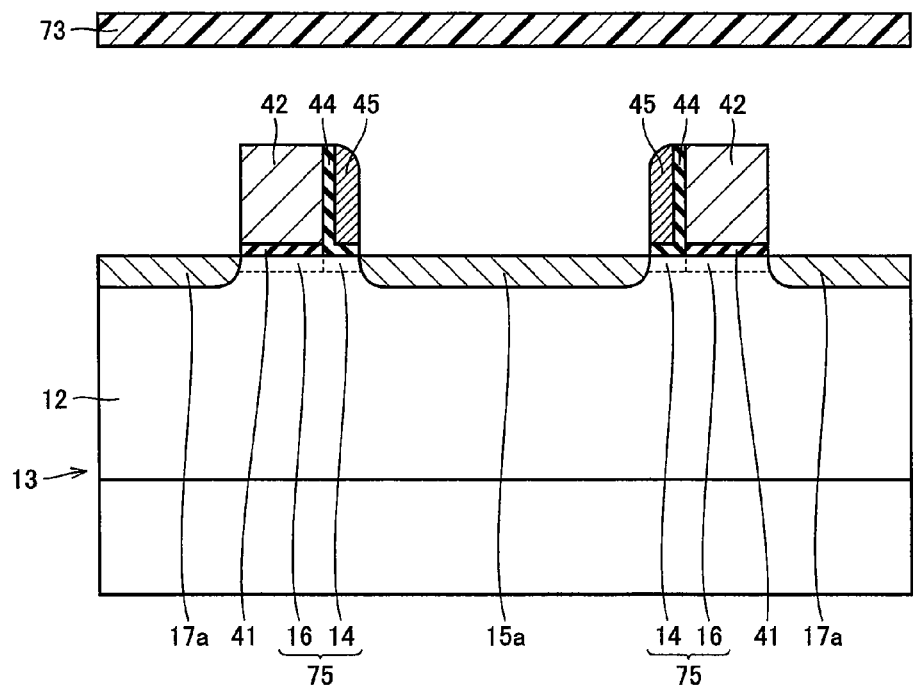
FIG. 22 is a cross-sectional view of the memory cell region in the ninth step (the step of forming an impurity region of the peripheral circuit transistor) of the semiconductor integrated circuit device.
Figure 23:
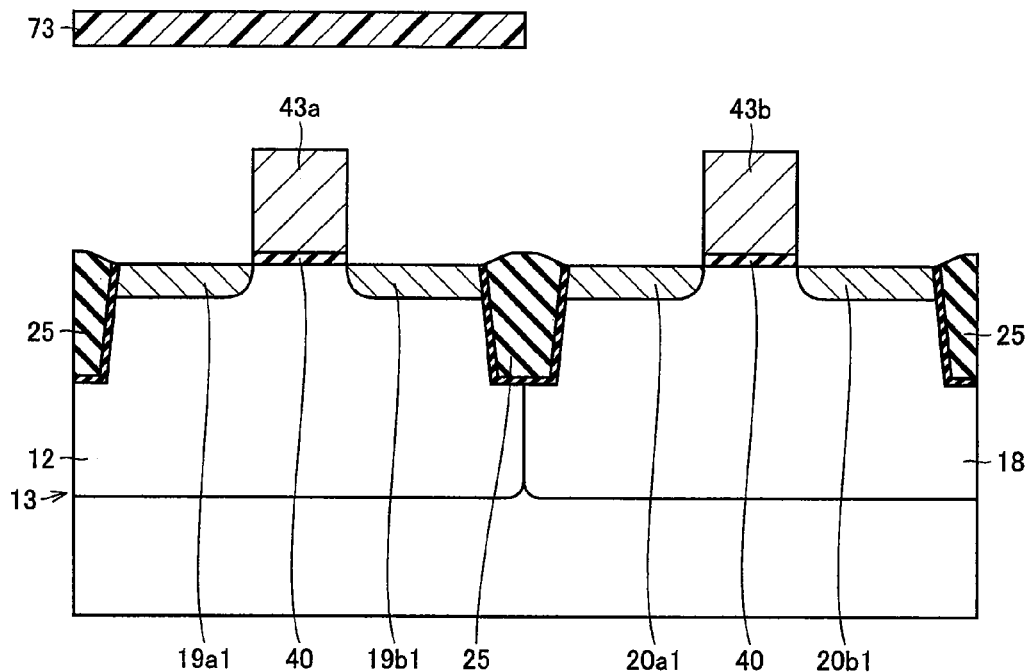
FIG. 23 is a cross-sectional view of the peripheral circuit region in the ninth step of the semiconductor integrated circuit device.

FIG. 22 is a cross-sectional view of the memory cell region in the ninth step of semiconductor integrated circuit device 10 (the step of forming the impurity region of the peripheral circuit transistor). FIG. 23 is a cross-sectional view of the peripheral circuit region in the ninth step of semiconductor integrated circuit device 10. As shown in FIGS. 22 and 23, in the ninth step, initially, a photomask 73 is arranged above the main surface of semiconductor substrate 13, and a photoresist having an opening in a portion where source region 20a and drain region 20b of peripheral circuit transistor 28b are located is formed through photolithography. Thereafter, an impurity is introduced in the main surface of semiconductor substrate 13 where source region 20a and drain region 20b are located, so as to form low-concentration impurity diffusion layers 20a1, 20b1.

Figure 24:
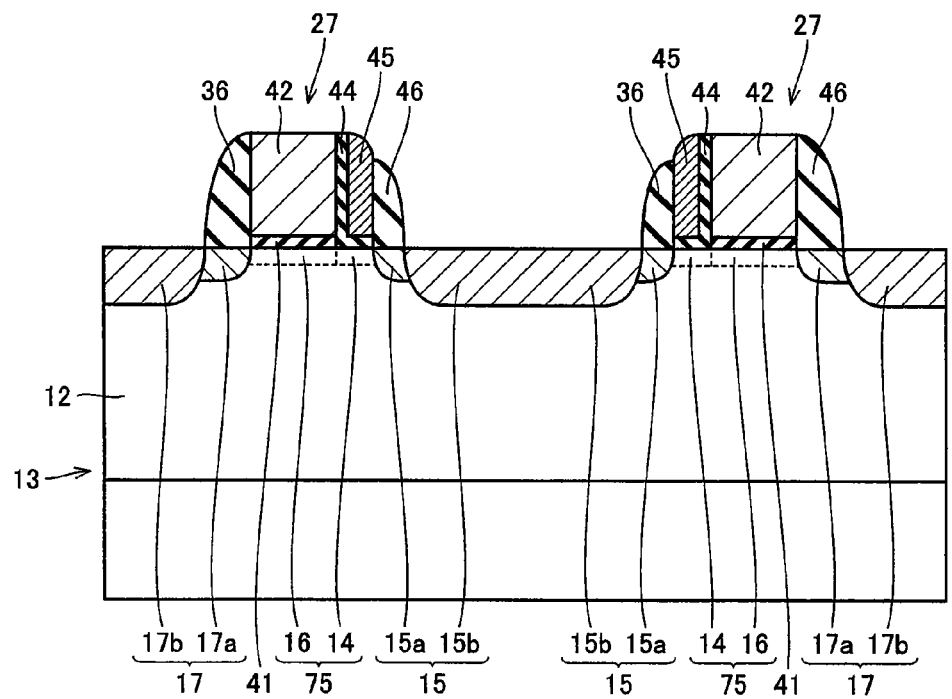
FIG. 24 is a cross-sectional view of the memory cell region in the tenth step (the step of forming a sidewall of the memory cell transistor and the peripheral circuit transistor) of the semiconductor integrated circuit device.
Figure 25:
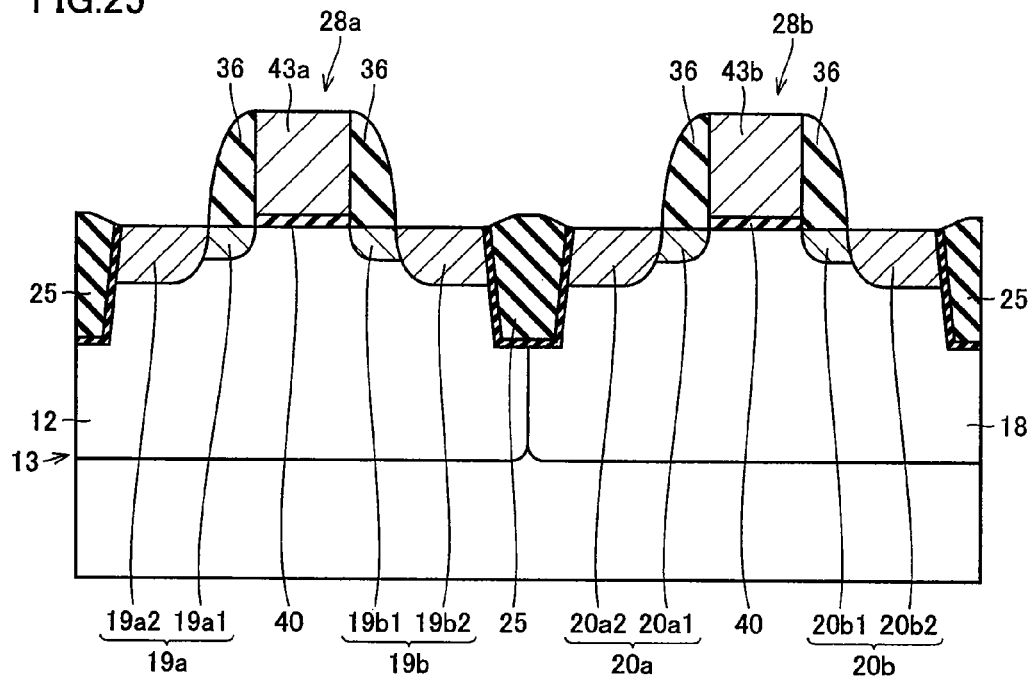
FIG. 25 is a cross-sectional view of the peripheral circuit region in the tenth step of the semiconductor integrated circuit device.

FIG. 24 is a cross-sectional view of the memory cell region in the tenth step of semiconductor integrated circuit device 10 (the step of forming a sidewall of the memory cell transistor and the peripheral circuit transistor). FIG. 25 is a cross-sectional view of the peripheral circuit region in the tenth step of semiconductor integrated circuit device 10. In FIGS. 24 and 25, an insulating film 36 implemented by a silicon oxide film or the like is formed on the main surface of semiconductor substrate 13, for example, using CVD. Thereafter, insulating film 36 is etched, to form insulating films 36, 46 like a sidewall, on side surfaces of control gate 42 and gate electrodes 43a and 43b.

Thereafter, an impurity is introduced in the main surface of semiconductor substrate 13, so as to form high-concentration impurity diffusion layers 17b, 15b and high-concentration impurity diffusion layers 19a2, 19b2 on the main surface of semiconductor substrate 13, thus forming memory cell transistor 27 and peripheral circuit transistor 28a. In addition, high-concentration impurity diffusion layers 20a2, 20b2 are formed, to form peripheral circuit transistor 28b.

Figure 26:
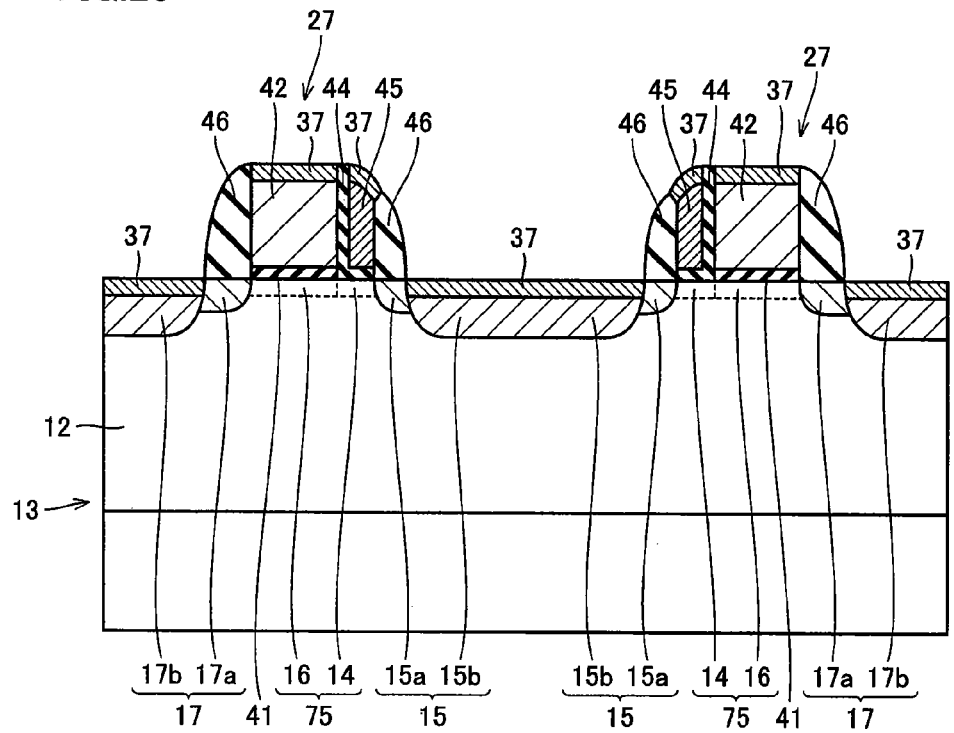
FIG. 26 is a cross-sectional view of the memory cell region in the eleventh step (the step of forming metal silicide) of the semiconductor integrated circuit device.
Figure 27:
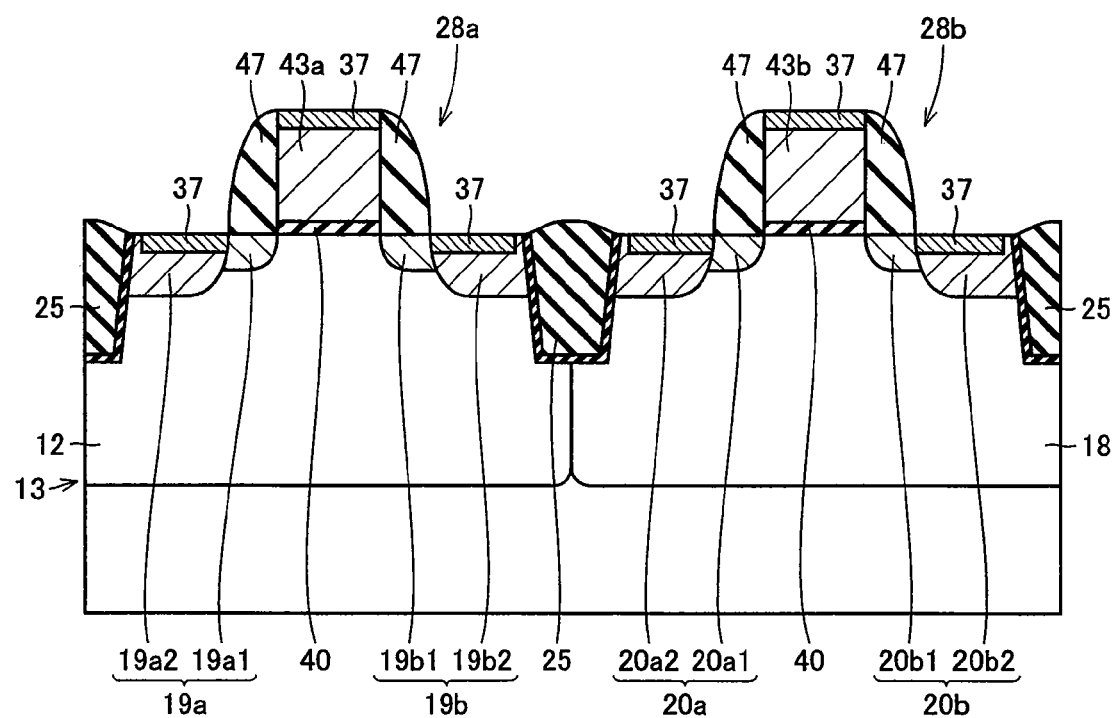
FIG. 27 is a cross-sectional view of a peripheral region in the eleventh step of the semiconductor integrated circuit device.

FIG. 26 is a cross-sectional view of the memory cell region in the eleventh step of semiconductor integrated circuit device 10 (the step of forming metal silicide). FIG. 27 is a cross-sectional view of the peripheral region in the eleventh step of semiconductor integrated circuit device 10.

As shown in FIGS. 26 and 27, on the upper surface of control gate 42 of formed memory cell transistor 27 and on the upper surfaces of source region 15, drain region 17, source regions 19a, 20a and drain regions 19b, 20b of peripheral circuit transistors 28a, 28b, metal silicide film 37 composed of cobalt silicide (CoSi) or nickel silicide (NiSi) is formed. Here, metal silicide film 37 formed on an upper end surface of control gate 42 and metal silicide film 37 formed on an upper end surface of memory gate electrode 45 are electrically isolated from each other by insulating film 44.

Figure 28:
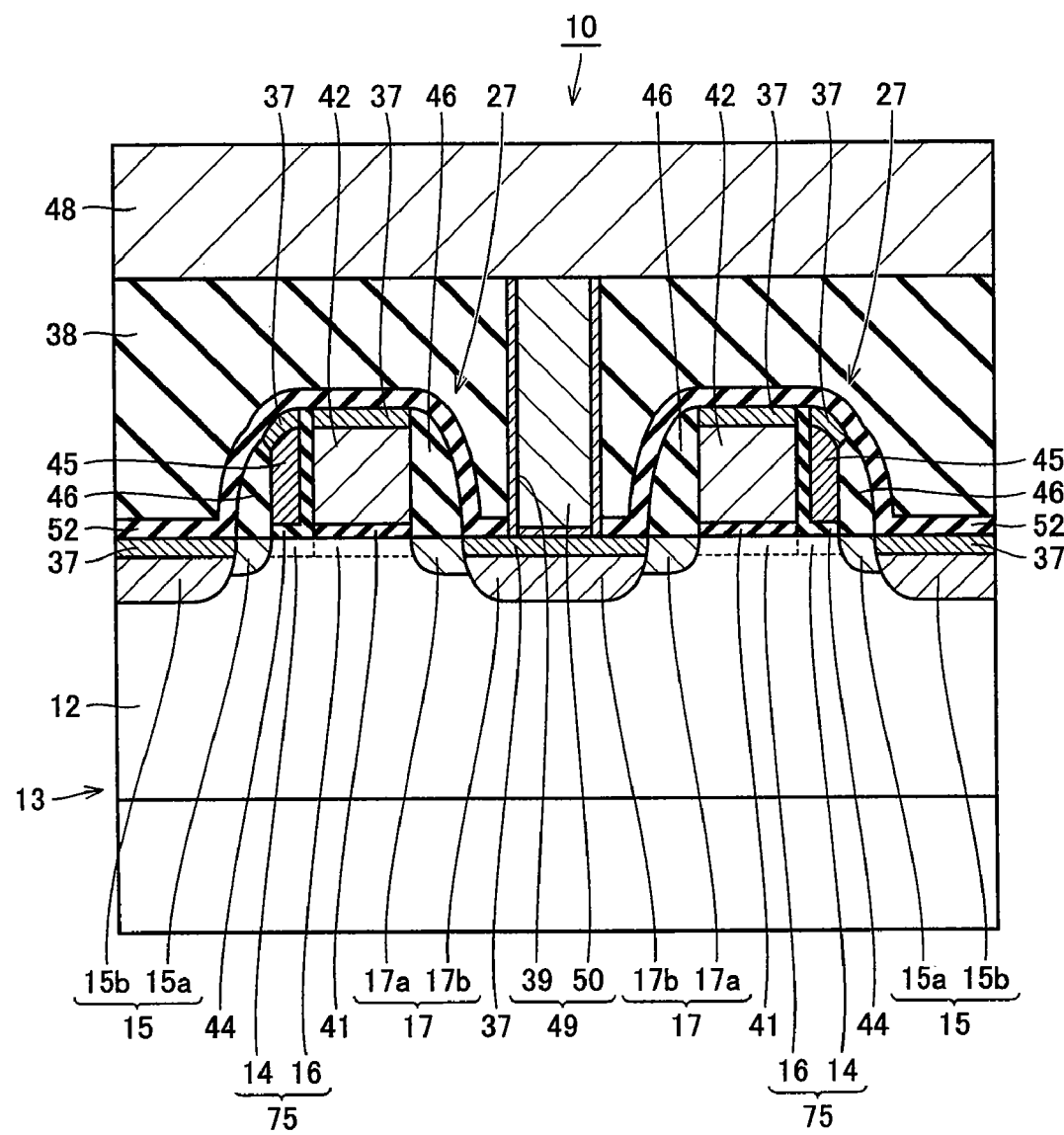
FIG. 28 is a cross-sectional view of the memory cell region in the twelfth step (the step of forming a bit line) of the semiconductor integrated circuit device.
Figure 29:
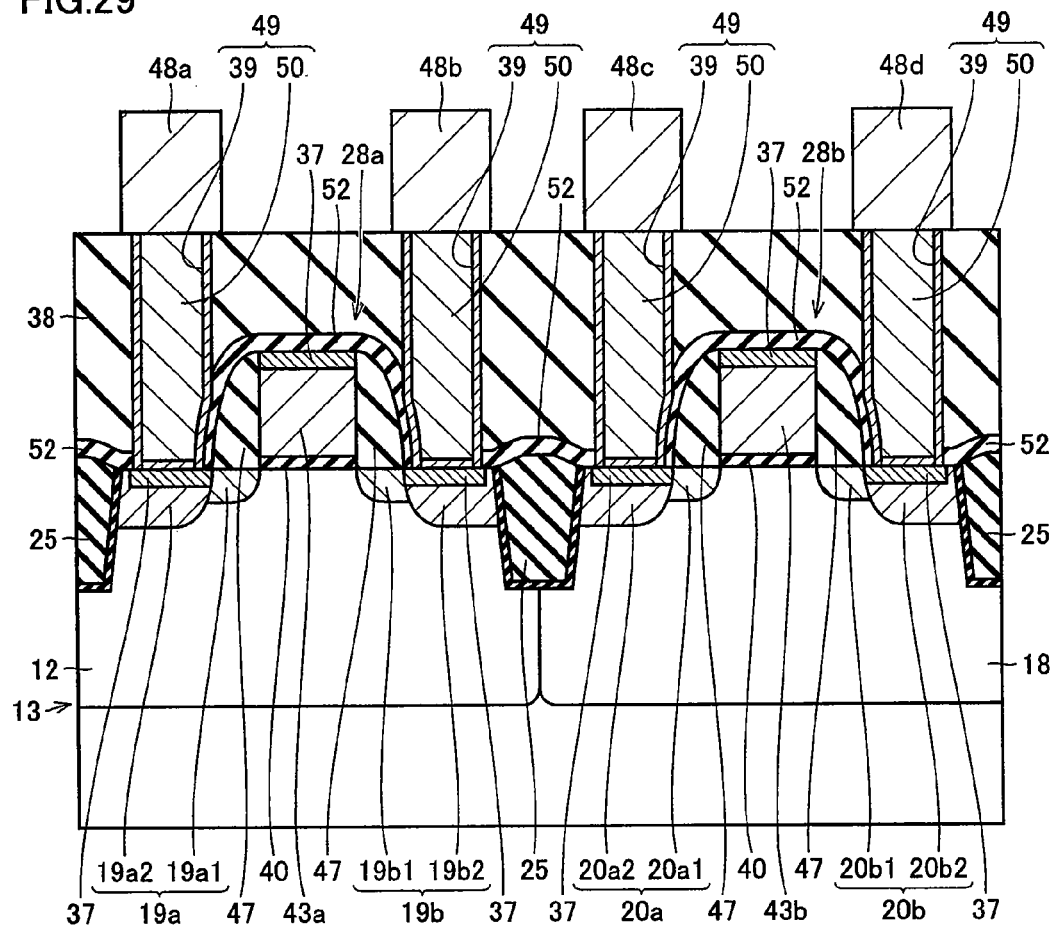
FIG. 29 is a cross-sectional view of the peripheral circuit region in the twelfth step of the semiconductor integrated circuit device.

FIG. 28 is a cross-sectional view of the memory cell region in the twelfth step (the step of forming a bit line) of semiconductor integrated circuit device 10. FIG. 29 is a cross-sectional view of the peripheral circuit region in the twelfth step of semiconductor integrated circuit device 10. As shown in FIGS. 28 and 29, insulating film 52 is formed on the upper surfaces of formed memory cell transistor 27 and peripheral circuit transistors 28a, 28b, and interlayer insulating film 38 is formed on the upper surface of insulating film 52. Thereafter, contact portion 49 penetrating interlayer insulating film 38 and insulating film 52 formed on high-concentration impurity diffusion layer 17b is formed. In addition, interconnections 48a, 48b, 48c, and 48d are formed on interlayer insulating film 38. Semiconductor integrated circuit device 10 shown in FIGS. 2 and 3 is formed as described above.

In the method of manufacturing semiconductor integrated circuit device 10 described above, formation of a recessed portion in the main surface of semiconductor substrate 13 where drain regions 17, 19b, 20b and source regions 19a, 20a are located is suppressed. Therefore, formed drain regions 17, 19b, 20b and source regions 19a, 20a can be formed in positions at a small depth from the main surface of semiconductor substrate 13.

Here, if a recessed portion is formed in the region where drain regions 17, 19b, 20b and source regions 19a, 20a are to be formed, a stepped portion is formed at a boundary region between the main surface of semiconductor substrate 13 under control gate 42, gate electrodes 43a, 43b, and drain regions 17, 19b, 20b and source regions 19a, 20a. Here, it is known that, if an impurity is introduced into the region where drain regions 17, 19b, 20b and source regions 19a, 20a are to be formed with the stepped portion having a height, for example, of approximately 30 nm being formed at the boundary region, charge density of the impurity at the boundary region tends to be large. Accordingly, if the introduced impurity is subsequently thermally diffused, the impurity diffuses also horizontally with respect to the main surface of semiconductor substrate 13. Consequently, a distance between source regions 15, 19a, 20a and drain regions 17, 19b, 20b becomes smaller, and the threshold voltage of memory cell transistor 27 suddenly lowers, in which case variation in the threshold voltages of memory cell transistors 27 occurs.

On the other hand, according to the method of manufacturing semiconductor integrated circuit device 10 of the first embodiment, formation of the recessed portion in the upper surfaces of drain regions 17, 19b, 20b and source regions 19a, 20a is suppressed. Therefore, formation of a large step at the boundary region between the source/drain regions and the main surface of semiconductor substrate 13 under control gates 42, 43a and 43b is suppressed.

Figure 38:
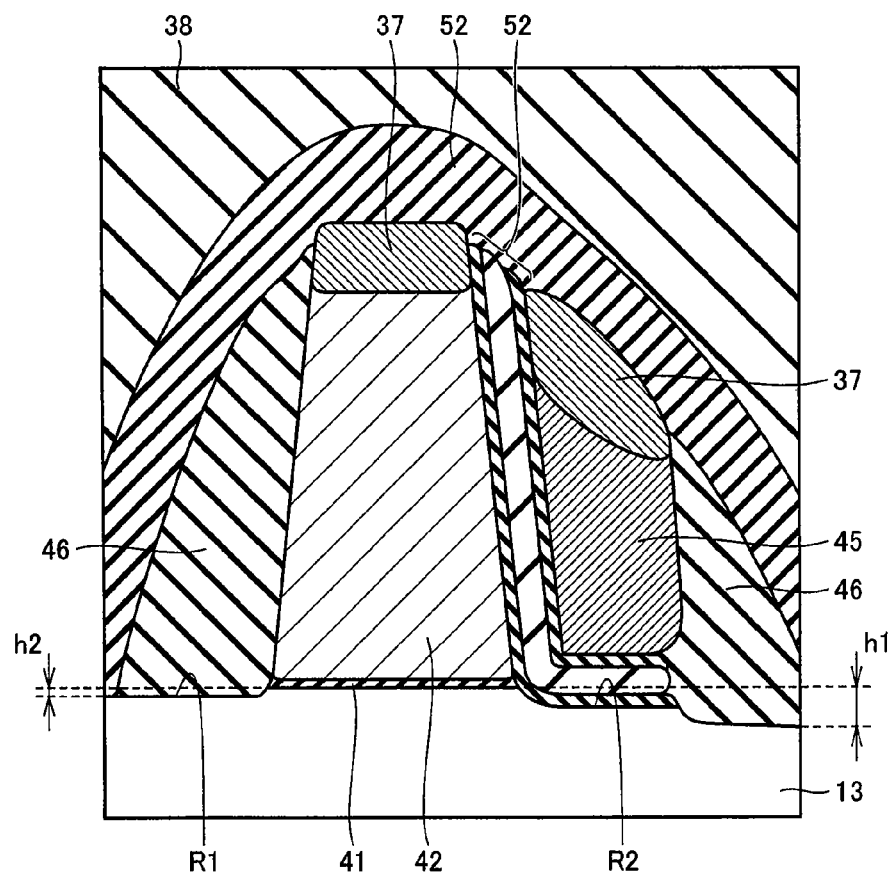
FIG. 38 is a cross-sectional view showing details of the memory cell transistor of the semiconductor integrated circuit device according to the first embodiment.

FIG. 38 is a cross-sectional view showing details of memory cell transistor 27 of semiconductor integrated circuit device 10 according to the first embodiment.

As shown in FIG. 38, a distance h2 in a direction perpendicular to the main surface of semiconductor substrate 13 between the main surface of semiconductor substrate 13 under control gate 42 and a main surface R1 of semiconductor substrate 13 located on a side opposite to memory gate electrode 45 with respect to control gate 42 is set, for example, to approximately at least 2 nm to at most 3 nm. A distance h1 between a main surface R2 of semiconductor substrate 13 under memory gate 45 and the main surface of semiconductor substrate 13 under control gate 42 is set, for example, to approximately 10 nm.

In other words, the main surface of semiconductor substrate 13 under insulating film 46 is located above the main surface of semiconductor substrate 13 under memory gate 45, in such a manner that distance h2 is smaller than distance h1. As shown in FIGS. 20 and 38, an impurity is introduced into main surface R2 in such a state that there is almost no step at the boundary region between main surface R2 and the main surface of semiconductor substrate 13 under control gate 42 and the boundary region is substantially flat, thereby forming low-concentration impurity diffusion layer 17a. Variation in the charge density of the introduced impurity can thus be suppressed.

Figure 85:
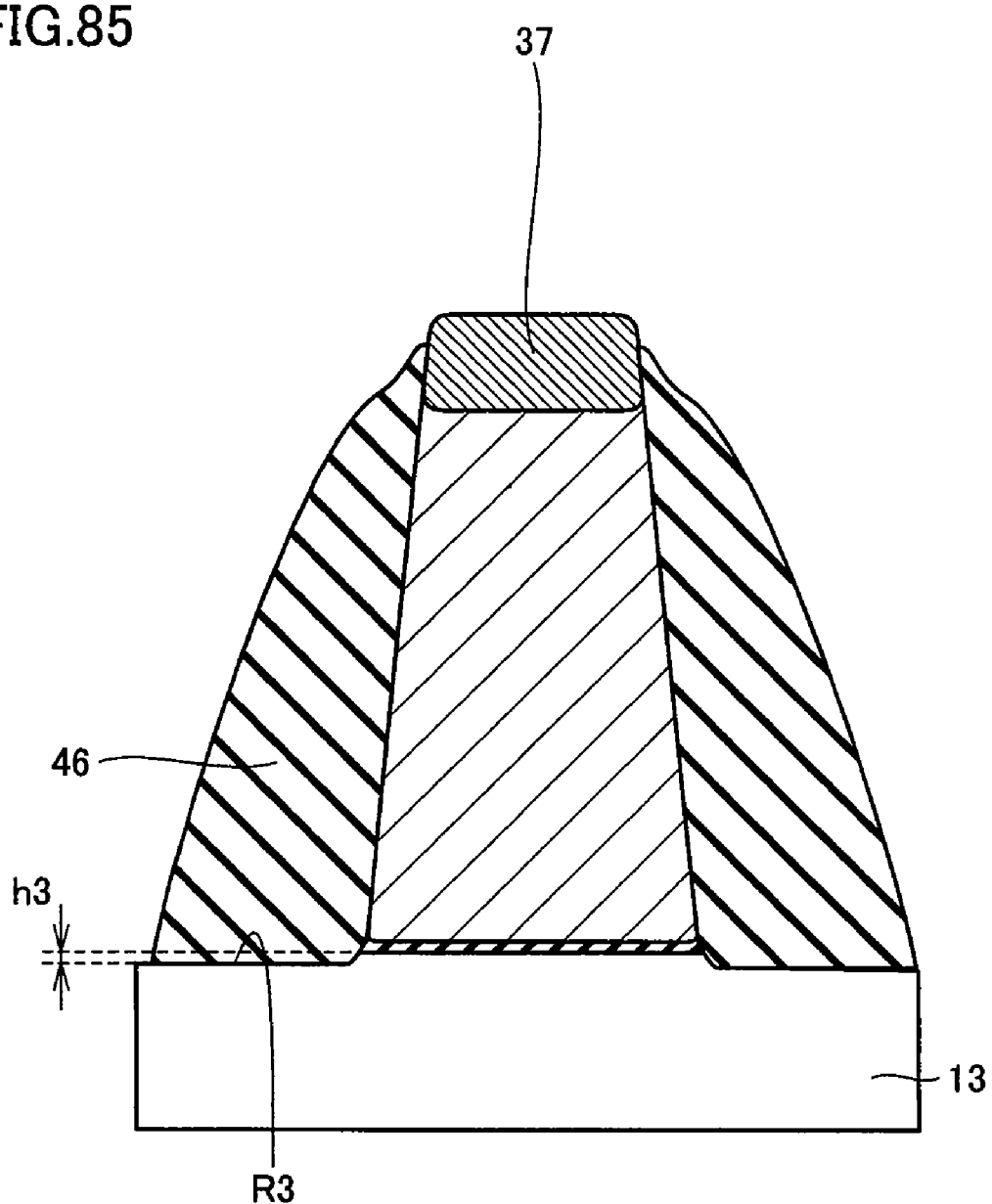
FIG. 85 is a cross-sectional view showing details of the peripheral circuit transistor.

FIG. 85 is a cross-sectional view showing details of the peripheral circuit transistor. As shown in FIG. 85, considerable diffusion of an impurity in a direction in parallel to a main surface R3 of semiconductor substrate 13 can be suppressed also during thermal diffusion of the impurity. Therefore, the threshold voltage of formed memory cell transistor 27 can be set to a desired value, and variation in the threshold voltages of memory cell transistors 27 can be suppressed.

It is noted that the timing at which the main surface of semiconductor substrate 13 located on the sides of opposing side surfaces of gate electrodes 43a, 43b of peripheral circuit transistors 28a, 28b is damaged is the same as the timing at which main surface R1 shown in FIG. 38 is damaged during patterning of conductive film pattern 31a.

Therefore, formation of a large stepped portion at the boundary region between the main surface of semiconductor substrate 13 on the sides of opposing side surfaces of gate electrodes 43a, 43b and the main surface of semiconductor substrate 13 under gate electrodes 43a, 43b is suppressed. Accordingly, in peripheral circuit transistors 28 and 28b as well, smaller distance between source regions 19a, 20a and drain regions 19b, 20b is suppressed, so that lowering in the threshold voltages of peripheral circuit transistors 28a, 28b can be suppressed and a desired threshold voltage can be set.

Here, a distance in a direction perpendicular to the main surface between the main surface of semiconductor substrate 13 under gate electrodes 43a, 43b and the main surface of semiconductor substrate 13 adjacent to gate electrodes 43a, 43b can be suppressed, for example, to approximately 2 nm to 3 nm. In the manufacturing step shown in FIGS. 6 and 7, the charge density of the impurity introduced into the main surface of semiconductor substrate 13 where the memory cell region is located may be equal to or lower than density of charges introduced into the main surface of semiconductor substrate 13 where the peripheral circuit region is located.

In this case, a thickness of insulating film 30 formed on the main surface of semiconductor substrate 13 where the memory cell region is located is equal to or smaller than a thickness of insulating film 30 formed on the main surface of semiconductor substrate 13 where the peripheral circuit region is located, as a result of thermal oxidation treatment in the manufacturing step shown in FIGS. 6 and 7.

In addition, as insulating film 30 formed on main surface R1 shown in FIG. 38 and insulating film 30 formed on the main surface of semiconductor substrate 13 located on the sides of the side surfaces of gate electrodes 43a, 43b of peripheral circuit transistors 28a, 28b are also removed, main surface R1 is located above the main surface of semiconductor substrate 13 located on the side surface side of the gate electrode. Therefore, the threshold voltage of memory cell transistor 27 can be set to a desired threshold voltage.

Here, the fourth step (the step of forming the channel region under gate of the memory cell transistor), the fifth step (the step of forming the second insulating film), and the sixth step (the step of forming the memory gate electrode/the source region) of semiconductor integrated circuit device 10 are manufacturing steps specific to memory cell transistor 27, separate from the steps of manufacturing peripheral circuit transistors 28a, 28b. During the step specific to memory cell transistor 27, conductive film pattern 31a covers the main surface of semiconductor substrate 13 where the peripheral circuit region is located, so that influence on semiconductor substrate 13 where the peripheral circuit region is located is suppressed.

On the other hand, the step of patterning the control gate electrode and the gate electrode of the peripheral circuit transistor, the step of forming drain region 17 of memory cell transistor 27 and drain region 19b and source region 19a of peripheral circuit transistor 28a, the step of forming each sidewall, and the step of forming the metal silicide film are simultaneously performed.

As described above, the step specific to memory cell transistor 27 is initially performed while the peripheral circuit region is covered, and thereafter, the step common to memory cell transistor 27 and peripheral circuit transistors 28a, 28b is performed. The number of steps of manufacturing semiconductor integrated circuit device 10 can thus be reduced.

Second Embodiment

Figure 39:
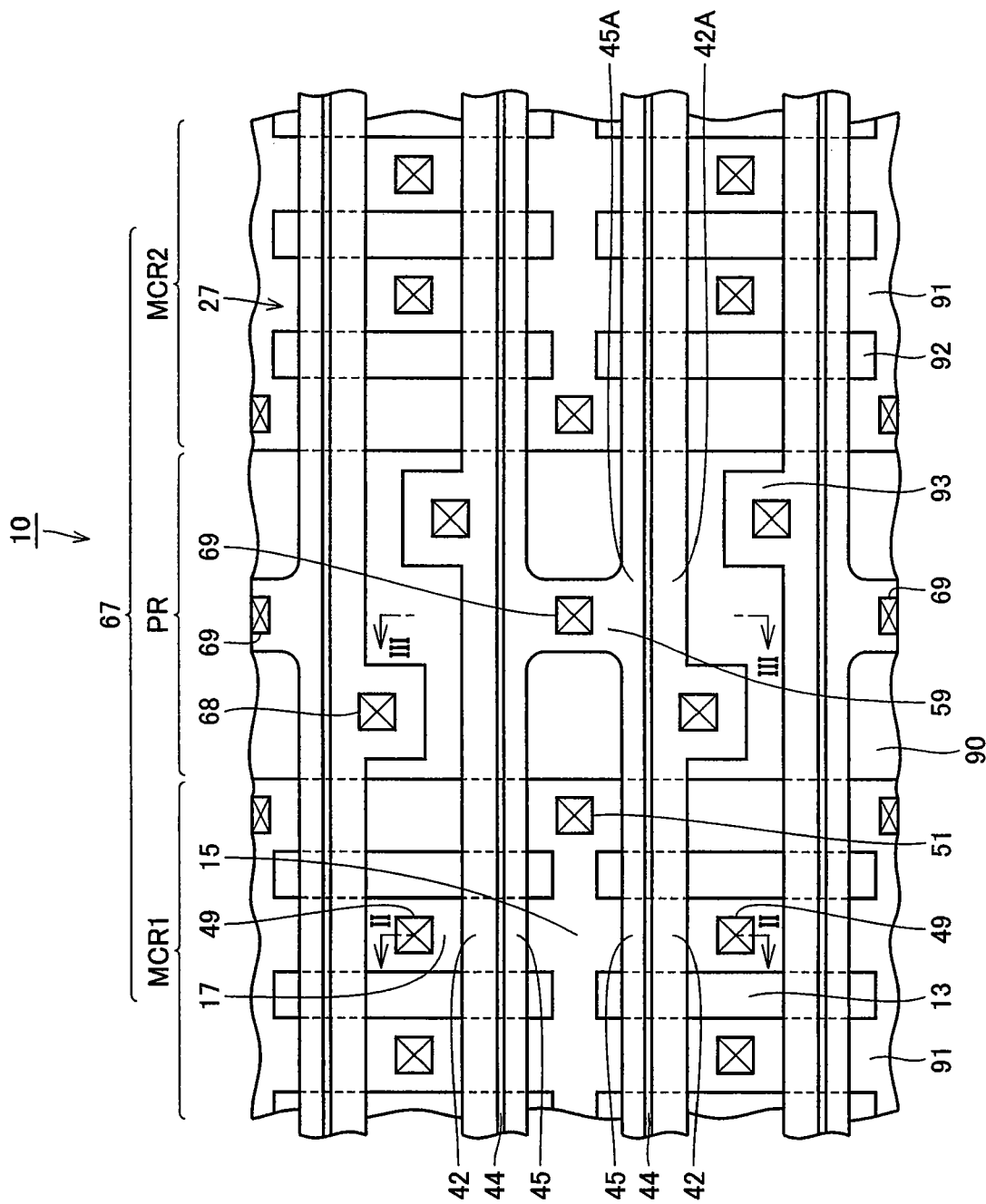
FIG. 39 is a plan view of a memory cell region of a semiconductor integrated circuit device according to a second embodiment.

Semiconductor integrated circuit device 10 according to a second embodiment will be described with reference to FIGS. 30 to 33 and FIGS. 39 to 45. FIG. 39 is a plan view of memory cell region 67 of semiconductor integrated circuit device 10 according to the second embodiment. As shown in FIG. 39, semiconductor integrated circuit device 10 includes an isolation region 90 selectively formed on the main surface of semiconductor substrate 13 where memory cell region 67 is located, a plurality of divided memory cell regions MCR1, MCR2 defined by isolation region 90, and a connection region PR connecting control gate 42 and memory gate electrode 45 formed on divided memory cell regions MCR1, MCR2 to each other.

On the main surface of semiconductor substrate 13 where divided memory cell regions MCR1, MCR2 are located, a plurality of control gates 42 extending in one direction and memory gate electrode 45 formed on the side surface of control gate 42 with insulating film 44 being interposed are formed.

In addition, an isolation region 92 is formed on the main surface of semiconductor substrate 13 between control gates 42. Isolation region 92 defines a plurality of drain regions 17 on the main surface of semiconductor substrate 13 between control gates 42. Contact portion 49 for applying a desired voltage to each drain region 17 is provided on each drain region 17.

Source region 15 extending along memory gate electrode 45 is formed on the main surface of semiconductor substrate 13 between memory gate electrodes 45. Channel region 75 shown in FIG. 2 is formed on the main surface of semiconductor substrate 13 between source region 15 and drain region 17. An interconnection (first connection portion) 45A connecting memory gate electrode 45 formed on one divided memory cell region MCR1 to memory gate electrode 45 formed on divided memory cell region MCR2 adjacent thereto with isolation region 90 being interposed is formed on isolation region 90 between divided memory cell regions MCR1, MCR2 adjacent to each other.

In a portion of the upper surface of isolation region 90 between interconnections 45A, a connection portion (first connection portion) 59 connecting interconnections 45A to each other is formed. A contact portion (voltage application portion) 69 applying a desired voltage to memory gate electrode 45 is formed in first connection portion 59.

An interconnection (third connection portion) 42A connecting control gate 42 formed on divided memory cell region MCR1 and control gate 42 formed on divided memory cell region MCR2 to each other is formed on isolation region 90. A contact portion 68 applying a desired voltage to control gate 42 is formed in the interconnection, and a pad portion 93 is formed in a lower end portion of contact portion 68.

Figure 30:
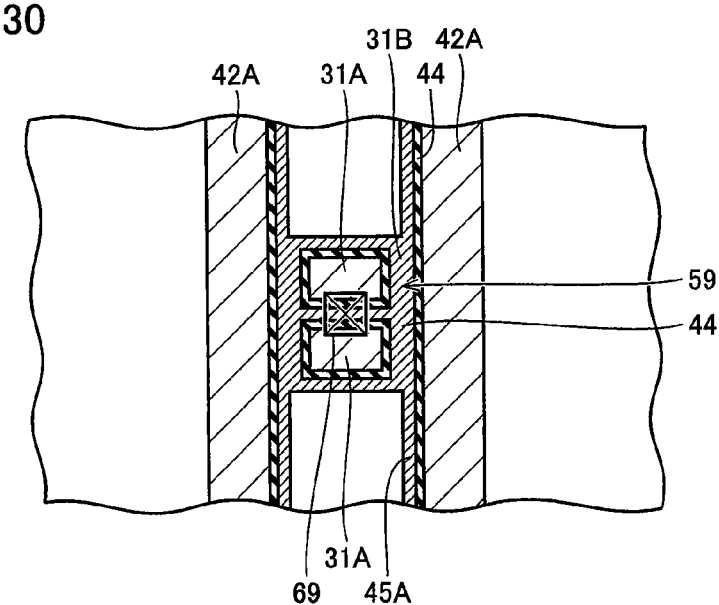
FIG. 30 is a cross-sectional view showing details of a connection portion shown in FIG. 39.

FIG. 30 is a cross-sectional view showing details of connection portion 59 shown in FIG. 39. As shown in FIG. 30, connection portion 59 includes a conductive film (remaining portion) 31A formed on the upper surface of isolation region 90 and implemented for example by a polysilicon film, insulating film (fifth insulating film) 44 formed around the side surface (outer surface) of remaining portion 31A and implemented for example by the ONO film, and a conductive film (second conductive film) 31B formed around the outer surface of remaining portion 31A with insulating film 44 being interposed and filling a space between interconnections 45A. Contact portion 69 is formed on the upper surface of connection portion 59 configured as above. Therefore, the voltage applied to contact portion 69 is transmitted to interconnection 45A through conductive film 31B, and applied to each memory gate electrode 45.

Figure 40:
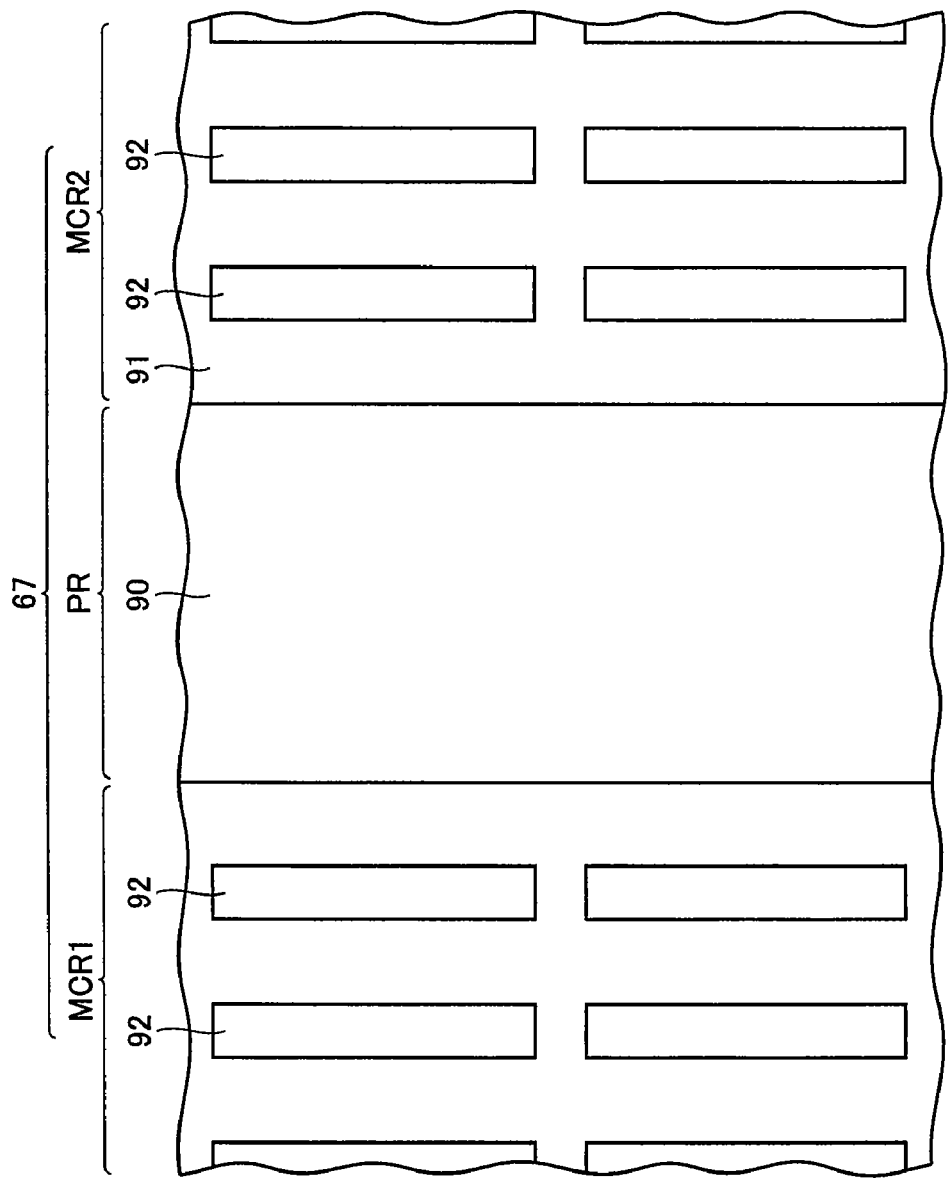
FIG. 40 is a cross-sectional view showing a manufacturing step corresponding to the first manufacturing step shown in FIGS. 6 and 7, in the step of manufacturing the semiconductor integrated circuit device according to the first embodiment.

In the second embodiment, remaining portion 31A is formed at two locations (a plurality of locations) between memory gate electrodes 45A in a direction in which memory gate electrode 45 extends, however, the embodiment is not limited as such and remaining portion 31A may be formed at one location. A method of manufacturing semiconductor integrated circuit device 10 configured as above will now be described. FIG. 40 is a cross-sectional view showing a manufacturing step corresponding to the first manufacturing step shown in FIGS. 6 and 7, in the step of manufacturing semiconductor integrated circuit device 10 according to the first embodiment described above.

As shown in FIG. 40, isolation regions 90 and 92 are selectively formed on the main surface of semiconductor substrate 13. Then, divided memory cell regions MCR1, MCR2 defined by isolation region 90 are formed on the main surface of semiconductor substrate 13. In addition, an active region 91 defined by isolation region 92 is formed on the main surface of semiconductor substrate 13 where each divided memory cell region MCR1, MCR2 is located.

Figure 41:
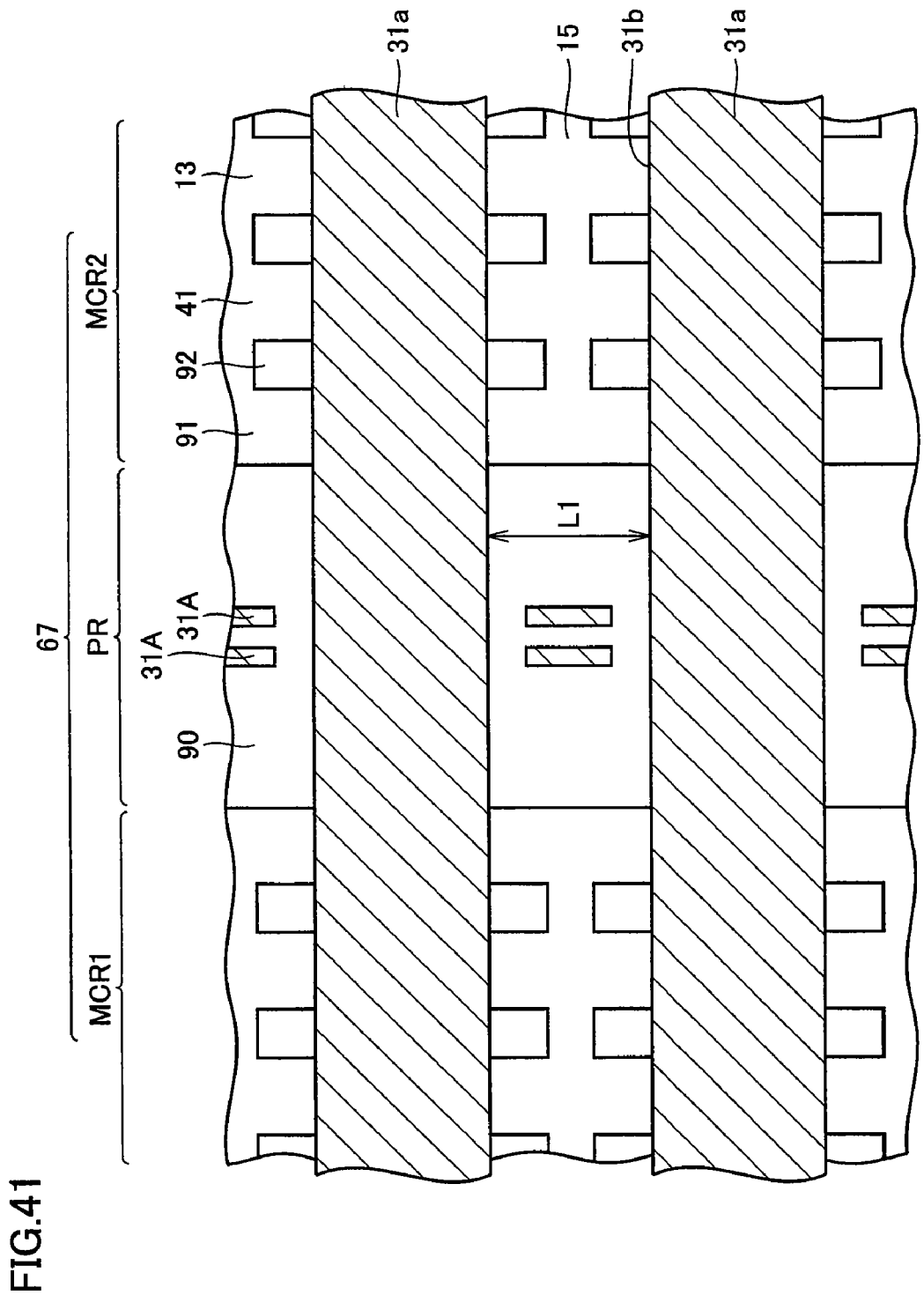
FIG. 41 is a cross-sectional view along the line XLI-XLI in FIG. 10, showing a manufacturing step corresponding to the third step of the semiconductor integrated circuit device according to the first embodiment.

FIG. 41 is a cross-sectional view along the line XLI-XLI in FIG. 10, showing a manufacturing step corresponding to the third step of semiconductor integrated circuit device 10 according to the first embodiment described above, and FIG. 31 is a cross-sectional view showing details of a portion on isolation region 90 in FIG. 41.

Figure 31:
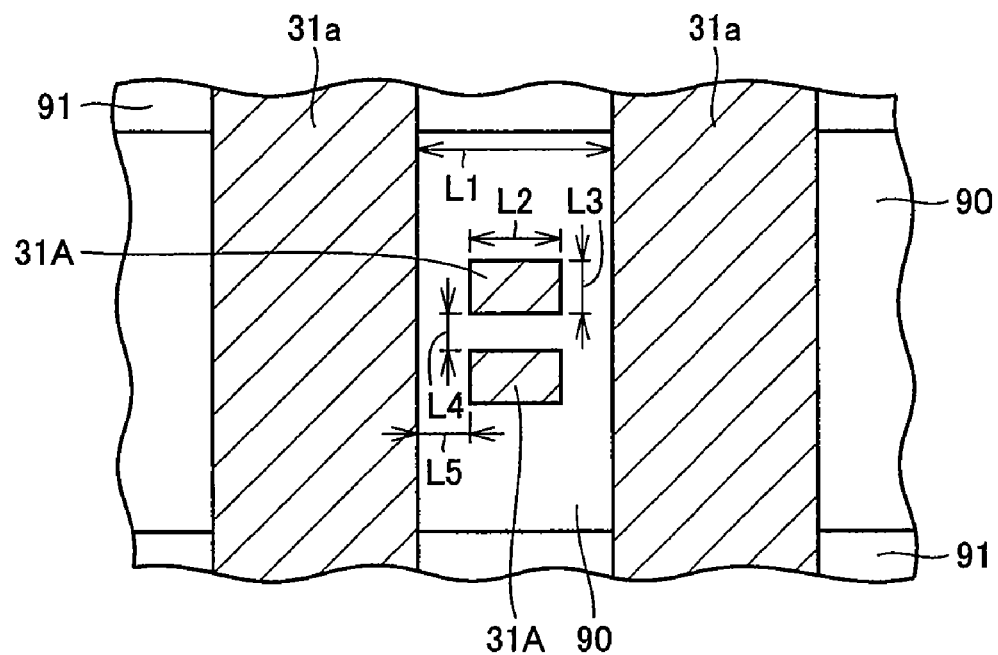
FIG. 31 is a cross-sectional view showing details of a portion on an isolation region in FIG. 41.

As shown in FIGS. 41 and 31, conductive film pattern 31a having opening 31b in the region where formed source region 15 is located is formed, and remaining portion 31A is formed on isolation region 90.

Then, conductive film patterns 31a are formed such that a distance L1 between conductive film patterns 31a is set, for example, to approximately 300 nm. Alternatively, remaining portion 31A is formed such that a width thereof L2 in a direction in which a plurality of conductive film patterns 31a are arranged is set, for example, to approximately 150 nm, or such that a width L3 thereof in a direction in which conductive film pattern 31a extends is set, for example, to approximately 100 nm. In forming a plurality of remaining portions 31A, they are formed such that a distance L4 between remaining portions 31A is set, for example, to approximately 100 nm. Alternatively, remaining portion 31A is formed such that a distance L5 between remaining portion 31A and adjacent conductive film pattern 31a is set, for example, to 100 nm or smaller.

Figure 32:
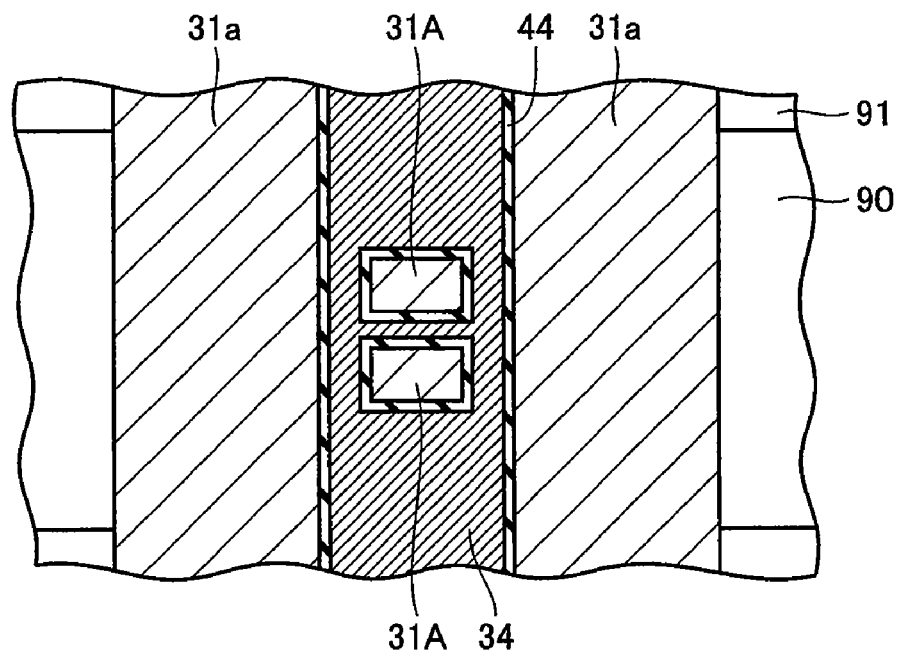
FIG. 32 is a cross-sectional view showing details of an upper surface of the isolation region in FIG. 42.
Figure 42:
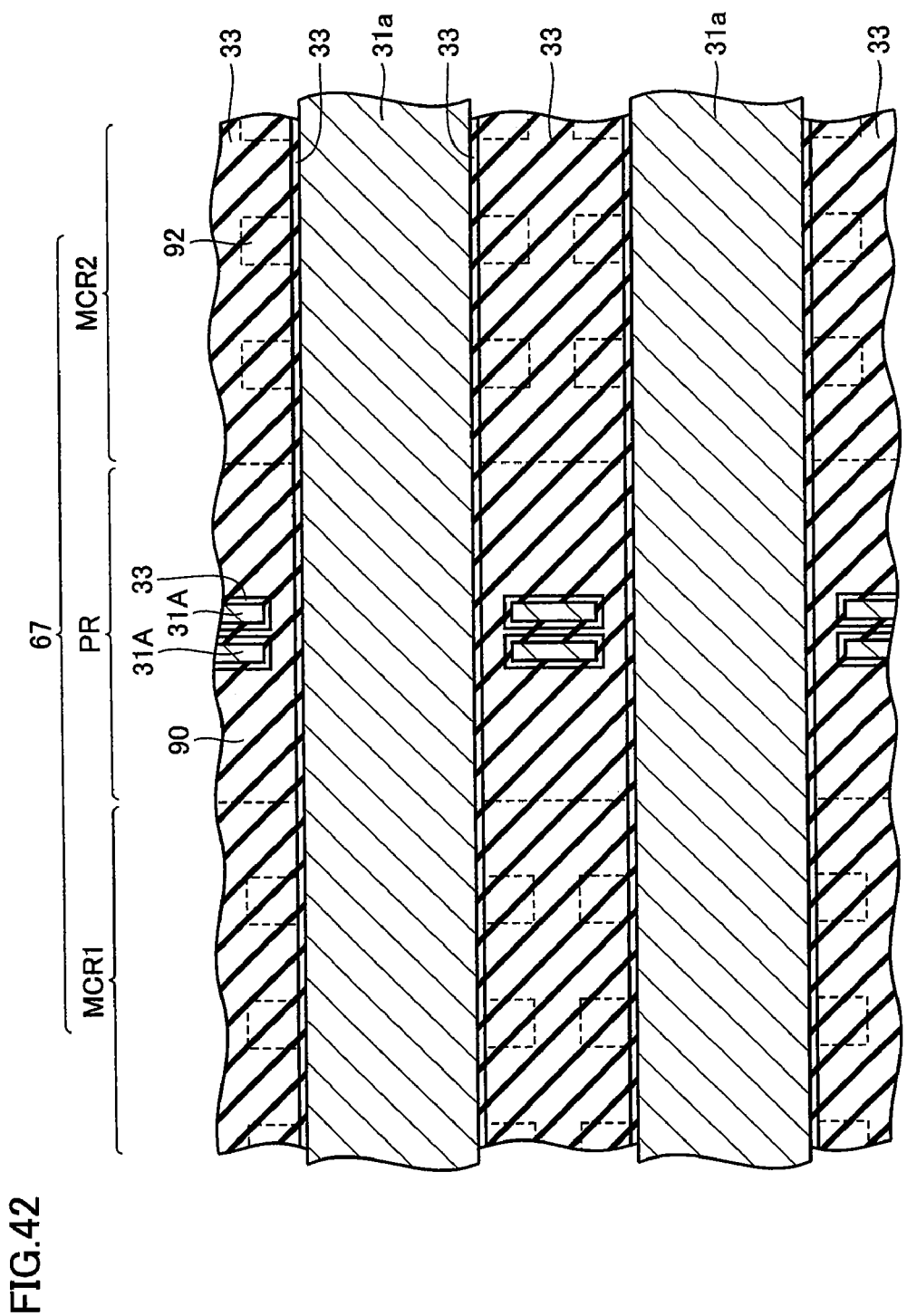
FIGS. 42 and 43 are cross-sectional views showing a manufacturing step corresponding to the fifth step of the semiconductor integrated circuit device according to the first embodiment shown in FIG. 14.
Figure 43:
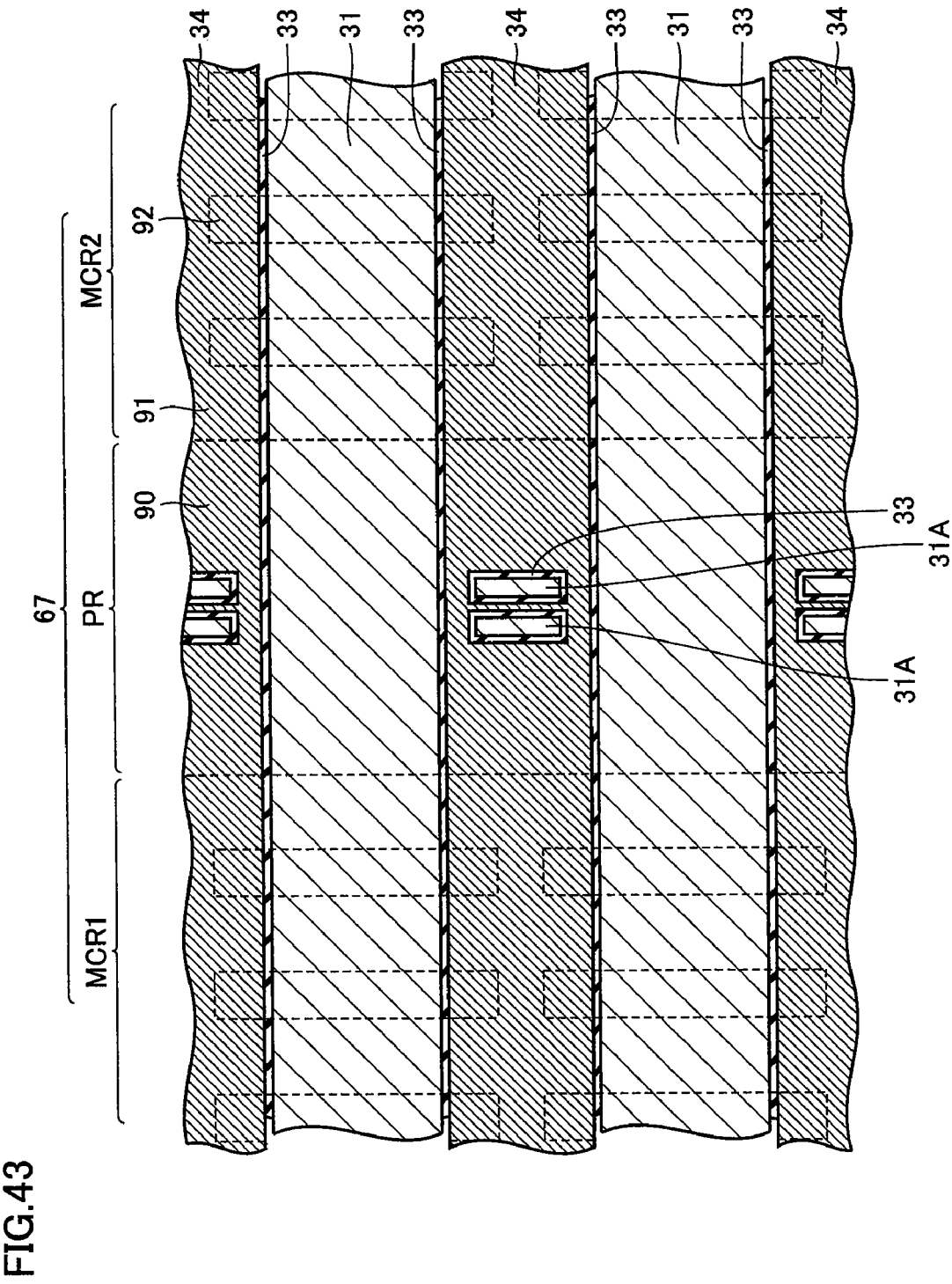

FIGS. 42 and 43 are cross-sectional views along the line XLII-XLII in FIG. 14, showing a manufacturing step corresponding to the fifth of semiconductor integrated circuit device 10 according to the first embodiment shown in FIG. 14, and FIG. 32 is a cross-sectional view showing details of an upper surface of isolation region 90 in FIG. 42.

As shown in FIGS. 14 and 42, insulating film 33 covers conductive film pattern 31a, and is formed on the main surface of semiconductor substrate 13 located between conductive film patterns 31a. In this manner, insulating film 33 is formed also on opposing side surfaces of conductive film 31a and on the surface of remaining portion 31A. Thereafter, conductive film 34 is deposited on the upper surface of insulating film 33.

As shown in FIGS. 14, 32 and 43, conductive film 34 is formed on the upper surface of insulating film 33. Here, conductive film 34 fills a gap between remaining portions 31A and a gap between remaining portion 31A and conductive film pattern 31a.

Figure 33:
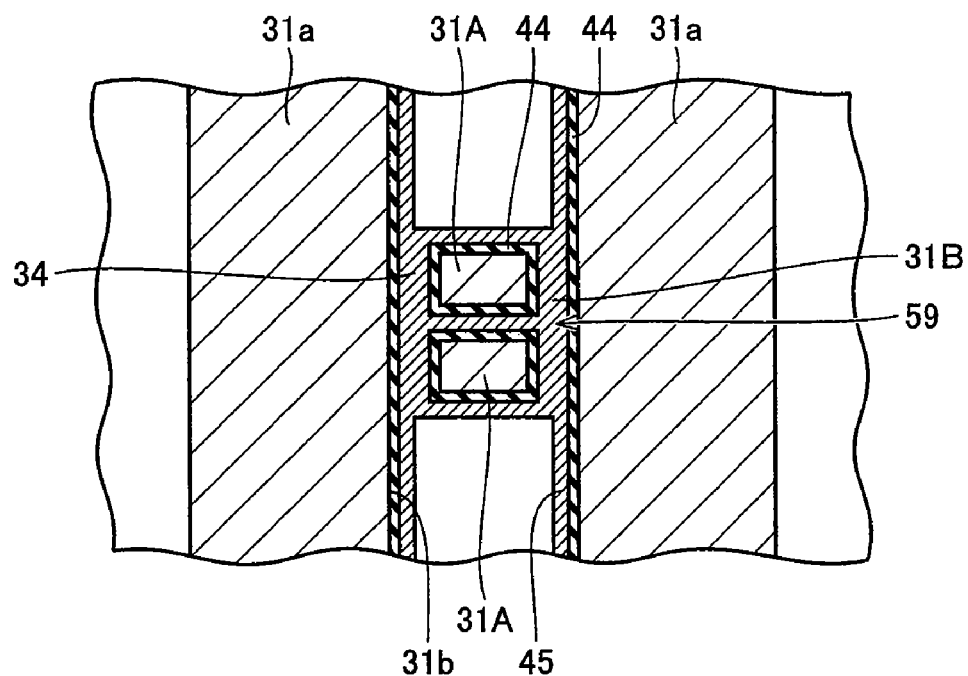
FIG. 33 is a cross-sectional view showing details in the isolation region in FIG. 44.
Figure 44:
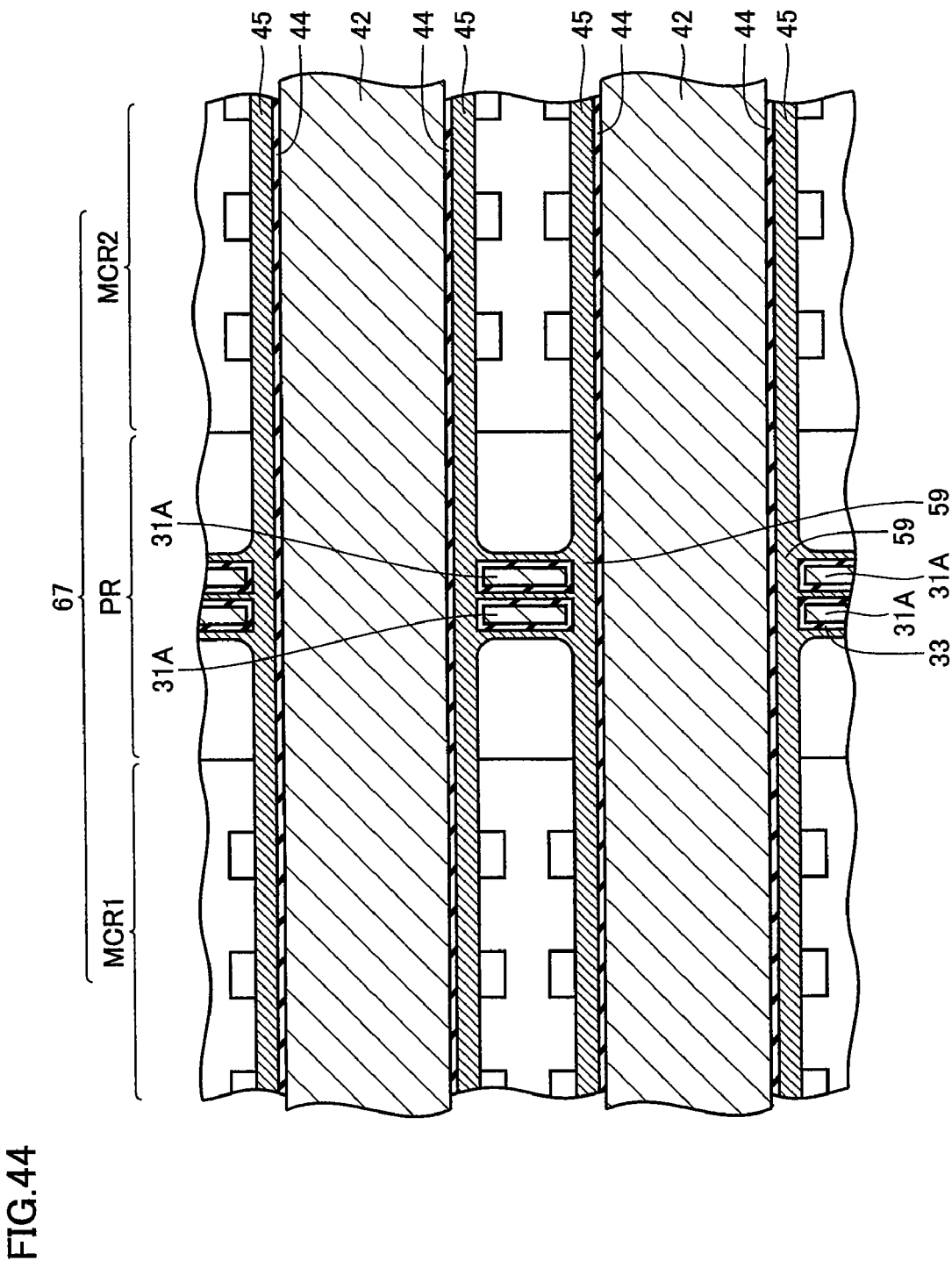
FIG. 44 is a cross-sectional view along the line XLIV-XLIV in FIG. 16, corresponding to the sixth step of the semiconductor integrated circuit device according to the first embodiment shown in FIG. 16.

FIG. 44 is a cross-sectional view along the line XLIV-XLIV in FIG. 16, corresponding to the sixth step of semiconductor integrated circuit device 10 according to the first embodiment shown in FIG. 16, and FIG. 33 is a cross-sectional view showing details in isolation region 90 in FIG. 44.

As shown in FIGS. 16, 33 and 44, conductive film 34 is etched to form memory gate electrode 45.

Here, memory gate electrode 45 in FIG. 2 is formed, and conductive film 31B remains on the surface of remaining portion 31A. As remaining portions 31A are arranged proximate to each other, conductive films 31B formed on the surfaces of remaining portions 31A are connected to each other in an integrated manner. In addition, as remaining portion 31A and conductive pattern 31a are also proximate to each other, conductive film 31B formed on the surface of remaining portion 31A and formed memory gate electrode 45 are also connected to each other. In other words, in the step of forming memory gate electrode 45, opposing memory gate electrodes 45 are integrally connected to each other by conductive film 31B formed on the surface of remaining portion 31A.

As described above, in the step of patterning conductive film 31 in the step of manufacturing semiconductor integrated circuit device 10 shown in the first embodiment, conductive film 31 is patterned so as to form remaining portion 31A, whereby connection portion 59 can be formed in a self-aligned manner.

Figure 45:
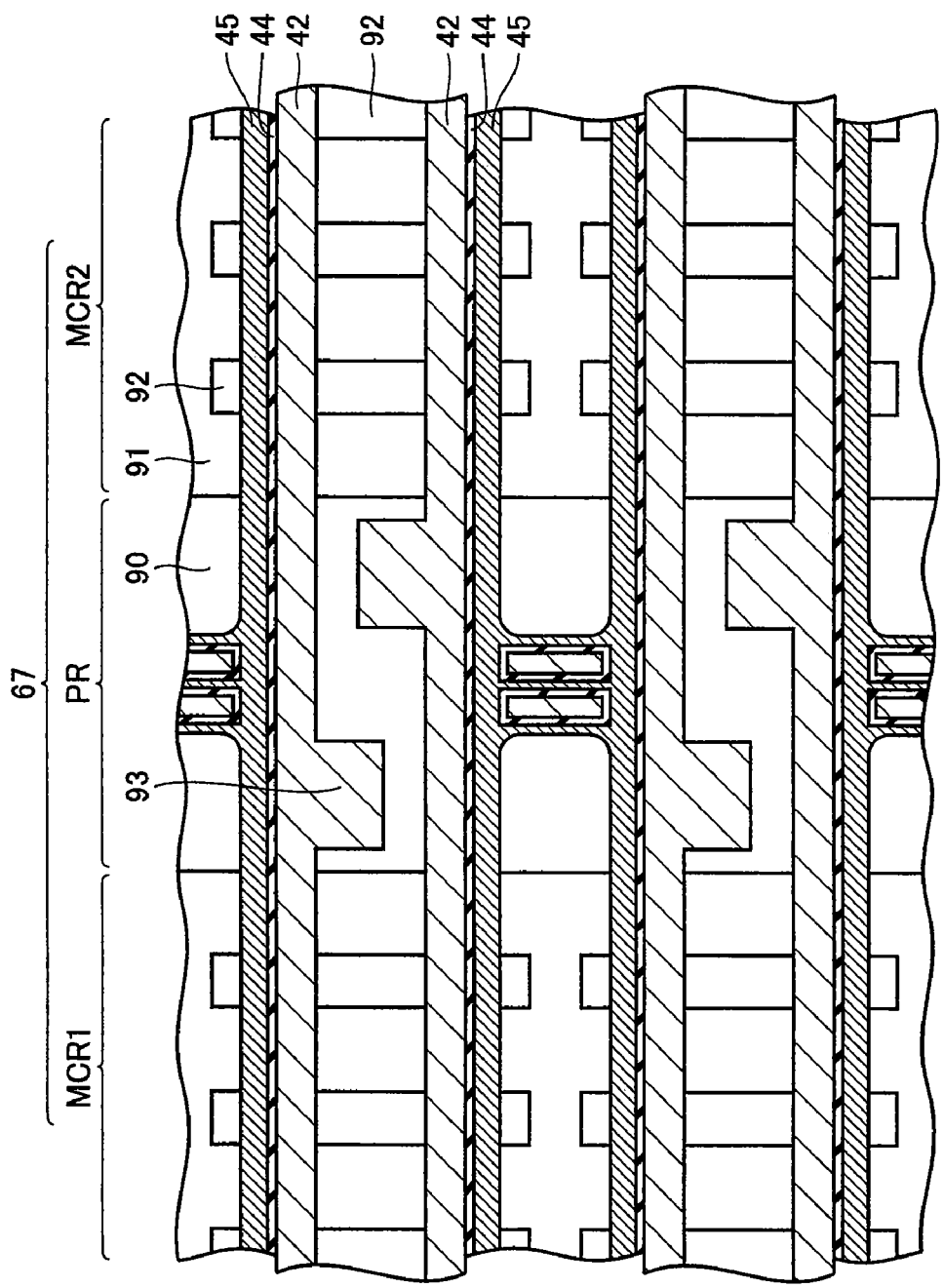
FIG. 45 is a cross-sectional view along the line XLV-XLV in FIG. 18, showing a manufacturing step subsequent to the step of manufacturing the semiconductor integrated circuit device shown in FIG. 44.

FIG. 45 is a cross-sectional view along the line XLV-XLV in FIG. 18, showing a manufacturing step subsequent to the step of manufacturing semiconductor integrated circuit device 10 shown in FIG. 44. As shown in FIG. 45, conductive film pattern 31a is patterned to expose the region serving as drain region 17 and to form pad portion 93.

As shown in FIG. 30, contact portion 69 is formed on the upper surface of formed connection portion 59. Namely, connection portion 59 is used as a pull-out portion of memory gate electrode 45 shown in FIG. 2. It is noted that the manufacturing step other than the step of manufacturing semiconductor integrated circuit device 10 described above includes the steps of manufacturing semiconductor integrated circuit device 10 described in the first embodiment.

According to the method of manufacturing semiconductor integrated circuit device 10 of the second embodiment, it is not necessary to provide the step of forming a pull-out portion of memory gate electrode 45, and the total number of steps in the step of manufacturing semiconductor integrated circuit device 10 and the number of masks can be reduced. In the method of manufacturing semiconductor integrated circuit device 10 according to the second embodiment, remaining portion 31A is formed in the step of patterning conductive film 31 in the step of manufacturing semiconductor integrated circuit device 10 according to the first embodiment, and a function and effect similar to that in semiconductor integrated circuit device 10 in the first embodiment can be obtained.

Third Embodiment

Semiconductor integrated circuit device 10 according to a third embodiment will be described with reference to FIGS. 46 to 52. It is noted that configuration the same as in semiconductor integrated circuit device 10 according to the first or second embodiment has the same reference character allotted, and detailed description thereof will not be repeated.

Figure 46:
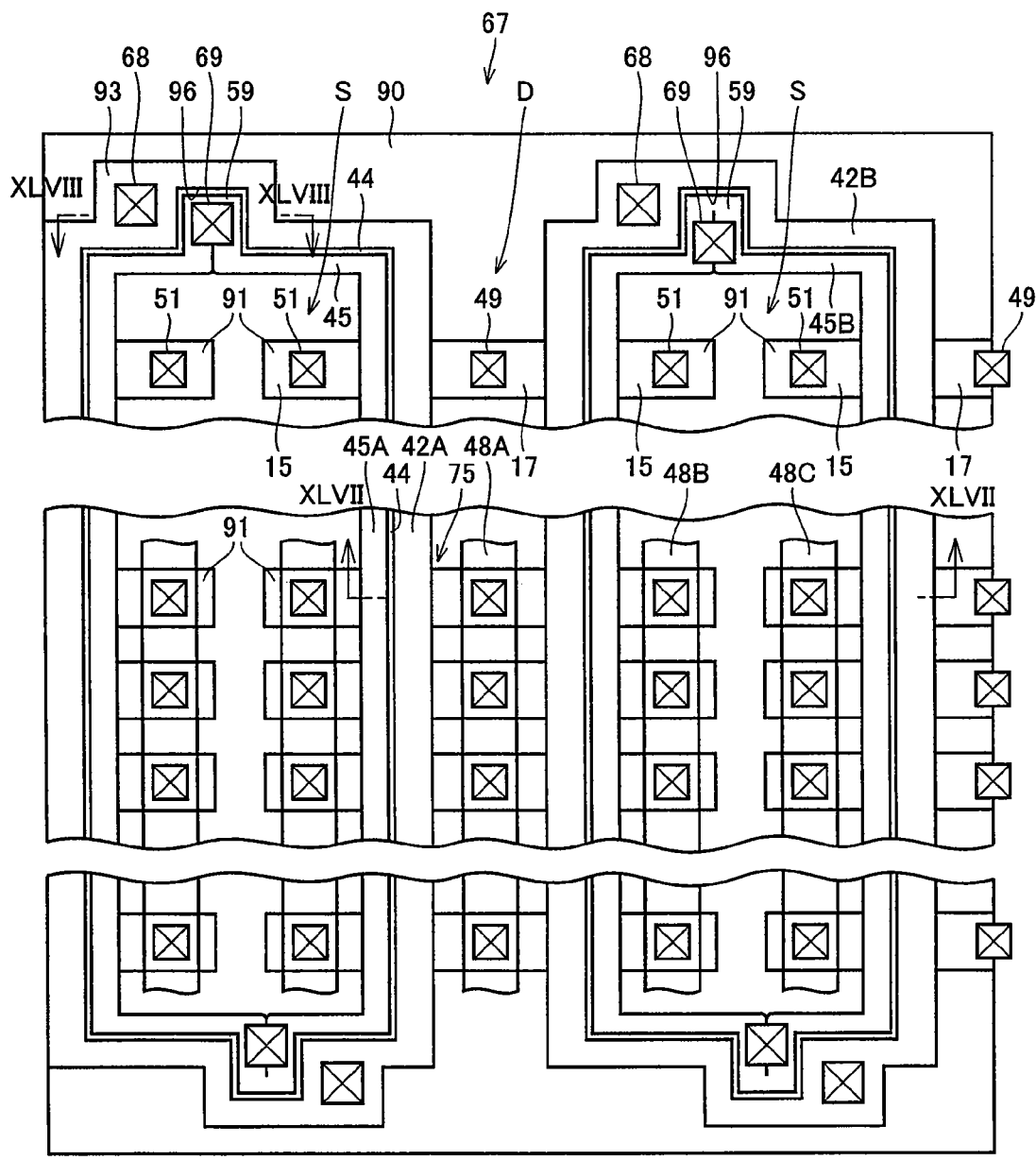
FIG. 46 is a plan view of a semiconductor integrated circuit device according to a third embodiment.

FIG. 46 is a plan view of semiconductor integrated circuit device 10 according to the third embodiment. In FIG. 46, semiconductor integrated circuit device 10 includes isolation region 90 selectively formed on the main surface of semiconductor substrate 13 where memory cell region 67 is located, band-like active region 91 defined by isolation region 90, source region 15 and drain region 17 formed on isolation region 91, a plurality of enclosing control gates (first gate) 42A, 42B, and enclosing memory gate electrodes (second gate) 45A, 45B formed on the side surface of control gates 42A, 42B on a side of source region (first impurity region) 15, with insulating film 44 being interposed.

Active region 91 is formed like a band, in a manner extending in a direction of width of control gates 42A, 42B and memory gate electrode 45. A plurality of active regions 91 are formed, spaced apart from each other, in a direction in which control gates 42A, 42B and memory gate electrodes 45A, 45B extend.

Source regions 15 are formed at opposing end portions of band-like active region 91, and drain region 17 is formed in a central portion of band-like active region 91. Channel region 75 is formed between drain region 17 and source region 15 in active region 91.

Accordingly, active region 91 adjacent to another active region 91 in a longitudinal direction thereof is arranged such that source region 15 thereof is opposed to source region 15 of another active region 91. A contact portion (voltage application portion) 51 is formed in each source region 15. Voltage application portion 51 is connected to upper interconnections 48B, 48C.

In this manner, a voltage is applied to each source region 15 through the contact portion or the interconnection composed of a barrier metal and tungsten having an electric resistance smaller than the active region, whereby an interconnection resistance is mitigated.

Therefore, fluctuation of the voltage applied to source region 15 depending on a position of the selected memory cell transistor can be suppressed, and a desired voltage can be applied to source region 15 of any memory cell transistor, thus suppressing malfunction.

If source regions 15 of the memory cell transistors are connected to each other through the active region, a large voltage should be applied to the shared source region in order to apply a desired voltage to the source region of each memory cell transistor in the writing operation. If a large voltage is applied to source region 15 shared by a plurality of memory cell transistors, however, the writing operation may occur also in a non-selected memory cell transistor and malfunction tends to take place. In contrast, if each source region is separate from or independent of each other and the voltage is applied through the interconnection having the resistance lower than the active region as described above, malfunction can be suppressed.

Control gates 42A, 42B are formed in such a manner that control gates 42A, 42B extend over channel regions 75 of active regions 91 adjacent to each other in the longitudinal direction thereof and surround source regions 15 of any active region 91 adjacent to each other. A recessed portion 96 is formed on the side surface of control gates 42A, 42B on the side of source region 15. Recessed portions 96 are formed on sides of opposing end portions in a longitudinal direction of control gates 42A, 42B, and located on the upper surface of isolation region 90. In addition, pad portions 93 are formed in the opposing end portions in a longitudinal direction of control gates 42A, 42B, and a contact portion (voltage application portion) 68 capable of applying a desired voltage to control gates 42A, 42B is formed in pad portion 93.

Memory gate electrodes 45A, 45B are formed on inner side surfaces of control gates 42A, 42B respectively, and formed in a manner similar to enclosing control gates 42A, 42B surrounding source regions 15. Pad portions (connection portion) 59 applying a voltage to memory gate electrodes 45A, 45B are formed in opposing end portions in a longitudinal direction of memory gate electrodes 45A, 45B. Connection portion 59 is formed such that a part of the conductive film implementing memory gate electrodes 45A, 45B enters recessed portion 96.

Figure 47:
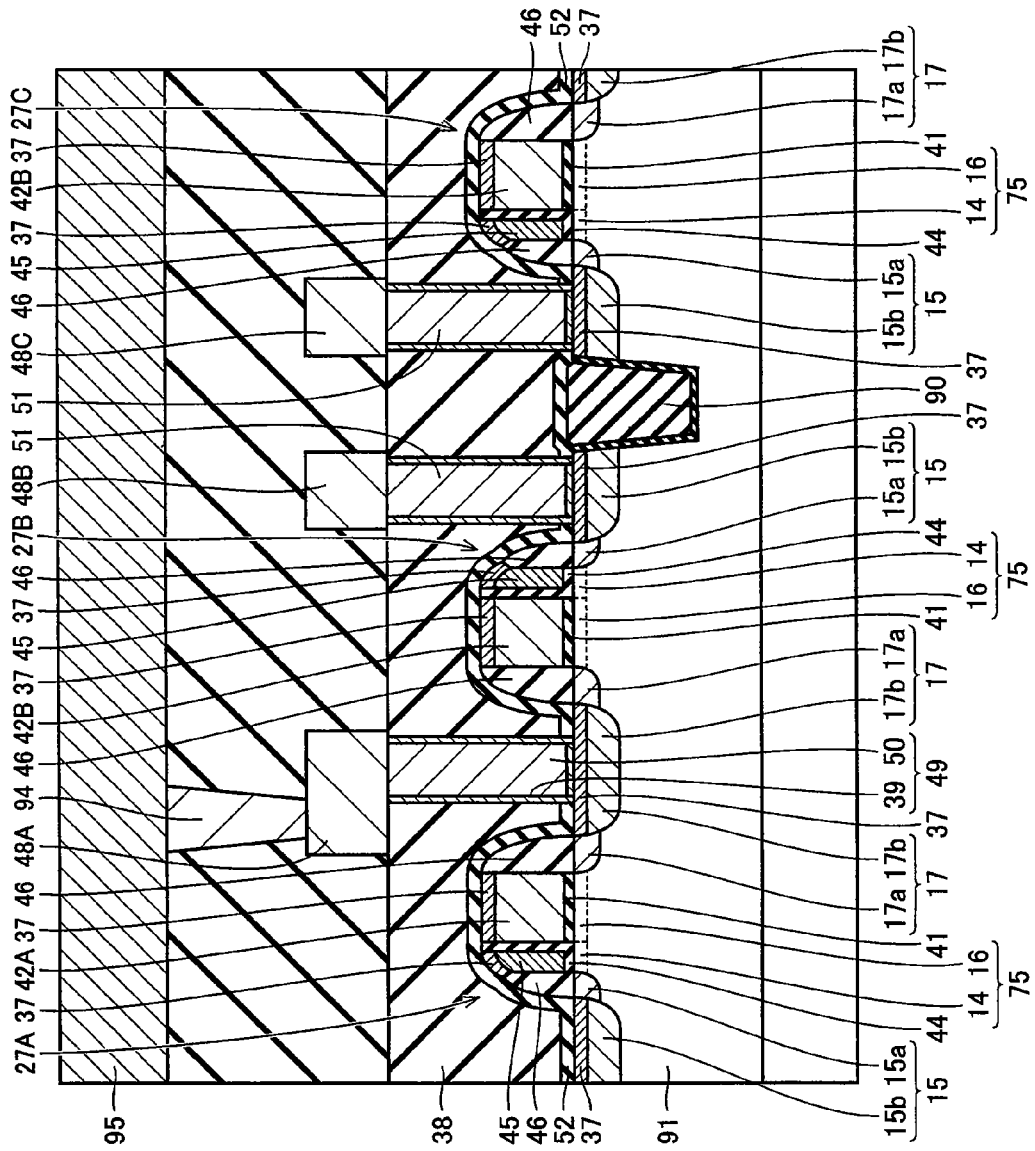
FIG. 47 is a cross-sectional view along the line XLVII-XLVII in FIG. 46.

FIG. 47 is a cross-sectional view along the line XLVII-XLVII in FIG. 46. As shown in FIG. 47, memory cell transistor 27A including control gate 42A and memory cell transistors 27B, 27C including control gate 42B are formed on the main surface of semiconductor substrate 13. Memory cell transistor 27A and memory cell transistor 27B share drain region 17. Contact portion 49 including a barrier metal 39 and a tungsten film 50 is formed in shared drain region 17.

Contact portion 49 is connected to upper interconnection 48B, and further connected to a bit line 95 through contact portion 94.

Figure 48:
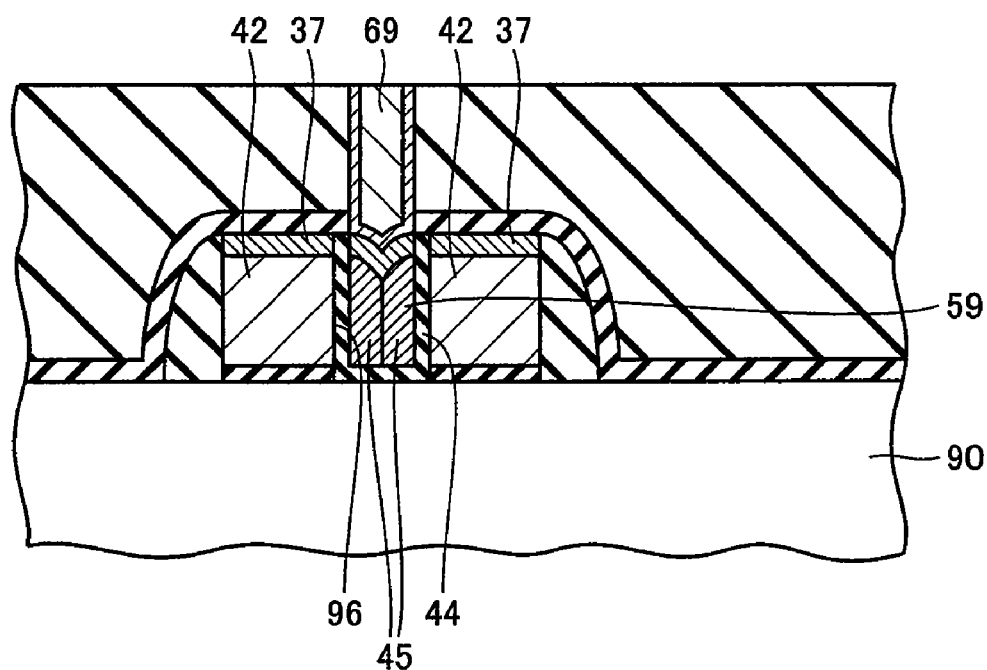
FIG. 48 is a cross-sectional view along the line XLVIII-XLVIII in FIG. 46.

Memory cell transistors 27B adjacent to each other and including enclosing control gates 42B are isolated from each other by isolation region 90. FIG. 48 is a cross-sectional view along the line XLVIII-XLVIII in FIG. 46, showing pad portion 59 and the surroundings. As shown in FIG. 48, recessed portion 96 is located on isolation region 90, and insulating film 44 is formed on an inner surface of recessed portion 96 and on the upper surface of isolation region 90 where recessed portion 96 is located.

Memory gate electrode 45 is formed like a sidewall on the inner surface of recessed portion 96, and memory gate electrode 45 formed on one inner surface of recessed portion 96 is in contact with memory gate electrode 45 formed on the other inner surface.

Contact portion 69 is formed on the upper surface of memory gate electrodes 45 that contact to each other in recessed portion 96, with metal silicide film 37 being interposed.

In this manner, pad portion 59 of contact portion 69 is implemented by memory gate electrodes 45 that are formed in recessed portion 96 and contact to each other.

It is noted that recessed portion 96 has a width smaller than twice the width of memory gate electrode 45 shown in FIG. 46, and smaller than 60 nm.

Figure 83:
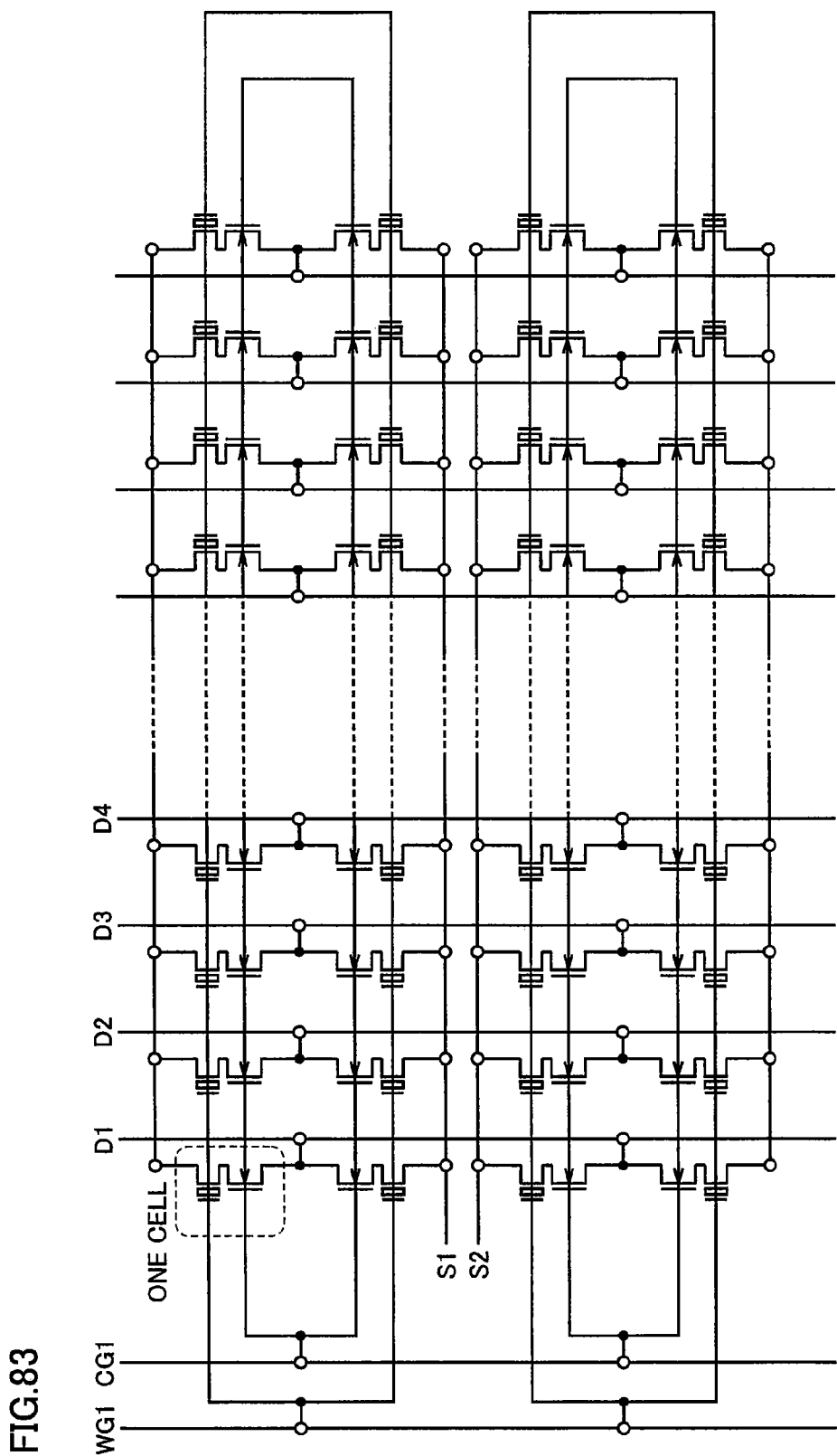
FIG. 83 is a circuit diagram of the semiconductor integrated device according to the third embodiment.
Figure 84:
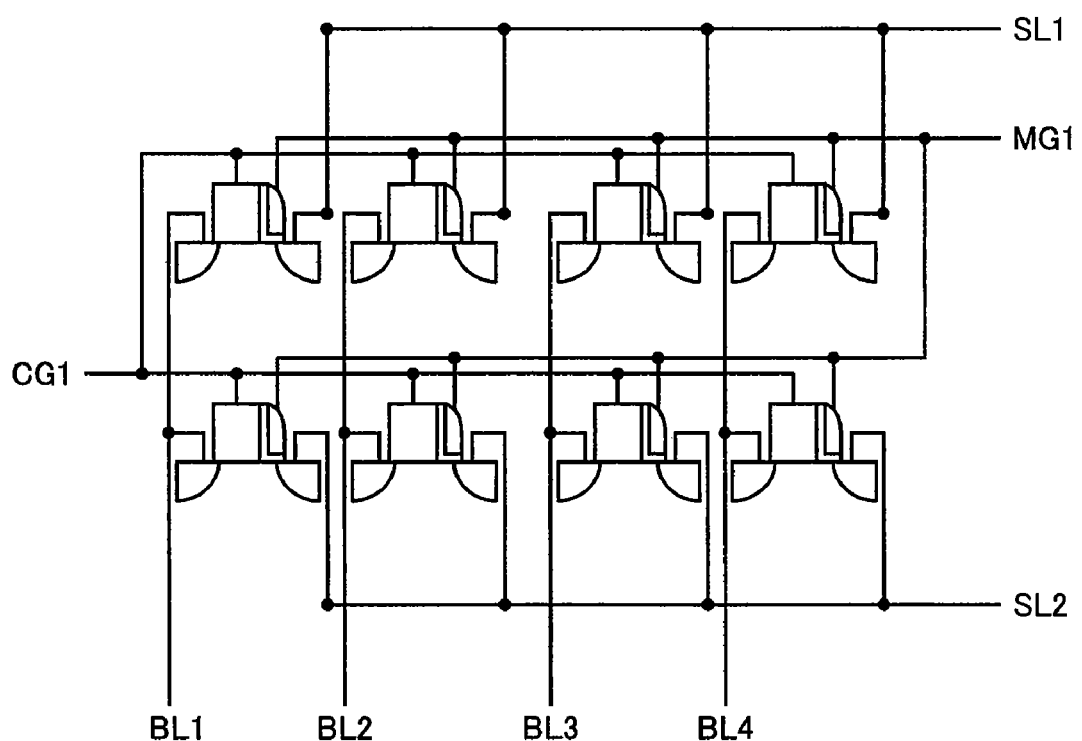
FIG. 84 is a schematic view of the semiconductor integrated circuit device according to the third embodiment.

The configuration other than those described above is similar to that of semiconductor integrated circuit device 10 according to the first or second embodiment. FIG. 83 is a circuit diagram of semiconductor integrated circuit device 10 configured as above, and FIG. 84 is a schematic diagram thereof.

Figure 80:
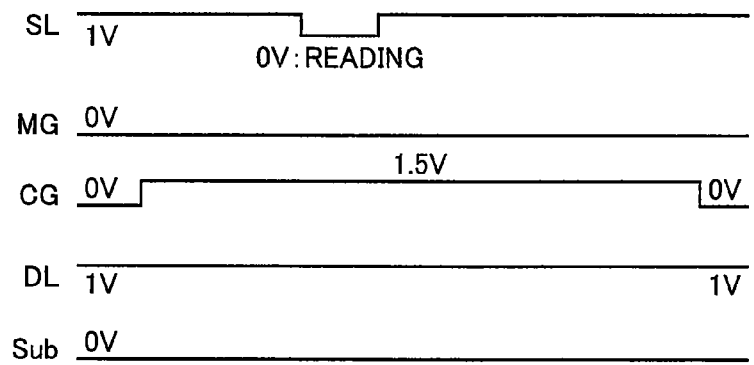
FIG. 80 is a performance chart in the reading operation in the semiconductor integrated circuit device according to the third embodiment.

Each operation of semiconductor integrated circuit device 10 configured as above will now be described. FIG. 80 is a performance chart in the reading operation in semiconductor integrated circuit device 10 according to the third embodiment. In FIGS. 80 and 46, a voltage of approximately 0V is applied to source region 15 of the selected memory cell. For example, a voltage of approximately 0V is applied to memory gate electrode 45 of the selected memory cell. In addition, for example, a voltage of approximately 1.5V is applied to control gate 42 of the selected memory cell, a voltage of approximately 1V is applied to drain region 17, and a voltage of approximately 0V is applied to semiconductor substrate 13.

Figure 81:
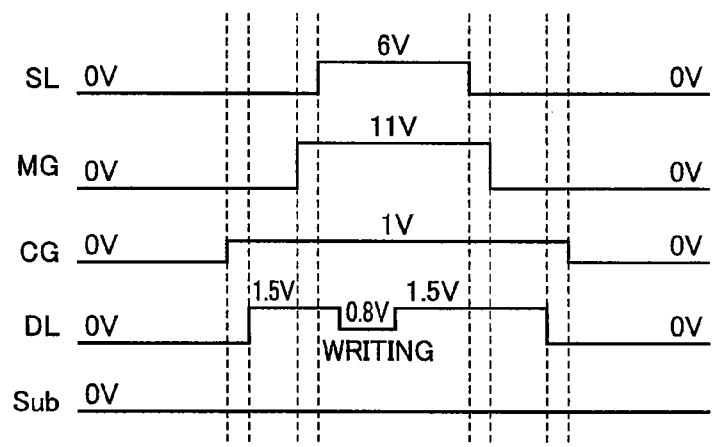
FIG. 81 is a performance chart in the writing operation.

FIG. 81 is a performance chart in the writing operation. As shown in FIG. 81, for example, a voltage of approximately 6V is applied to source region 15 of the selected memory cell, and for example, a voltage of approximately 11V is applied to memory gate electrode 45. In addition, a voltage of approximately 1V is applied to control gate 42 of the selected memory cell, a voltage of approximately 0.8V to 1.5V is applied to drain region 17, and a voltage of approximately 0V is applied to semiconductor substrate 13.

Figure 82:
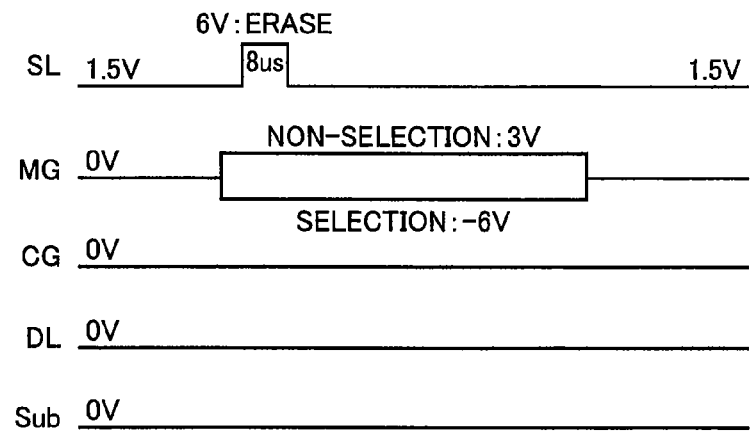
FIG. 82 is a performance chart in the erase operation.

FIG. 82 is a performance chart in the erase operation. As shown in FIG. 82, for example, a voltage of approximately 6V is applied to source region 15 of the selected memory cell, for example, a voltage of approximately 3V is applied to memory gate electrode 45, and a voltage of approximately 0V is applied to drain region 17 and the control gate. In addition, a voltage of approximately 0V is applied to semiconductor substrate 13. Here, for example, a voltage of approximately −6V is applied to memory gate electrode 42 of a non-selected memory cell.

A method of manufacturing semiconductor integrated circuit device 10 according to the third embodiment configured as above will now be described.

Figure 49:
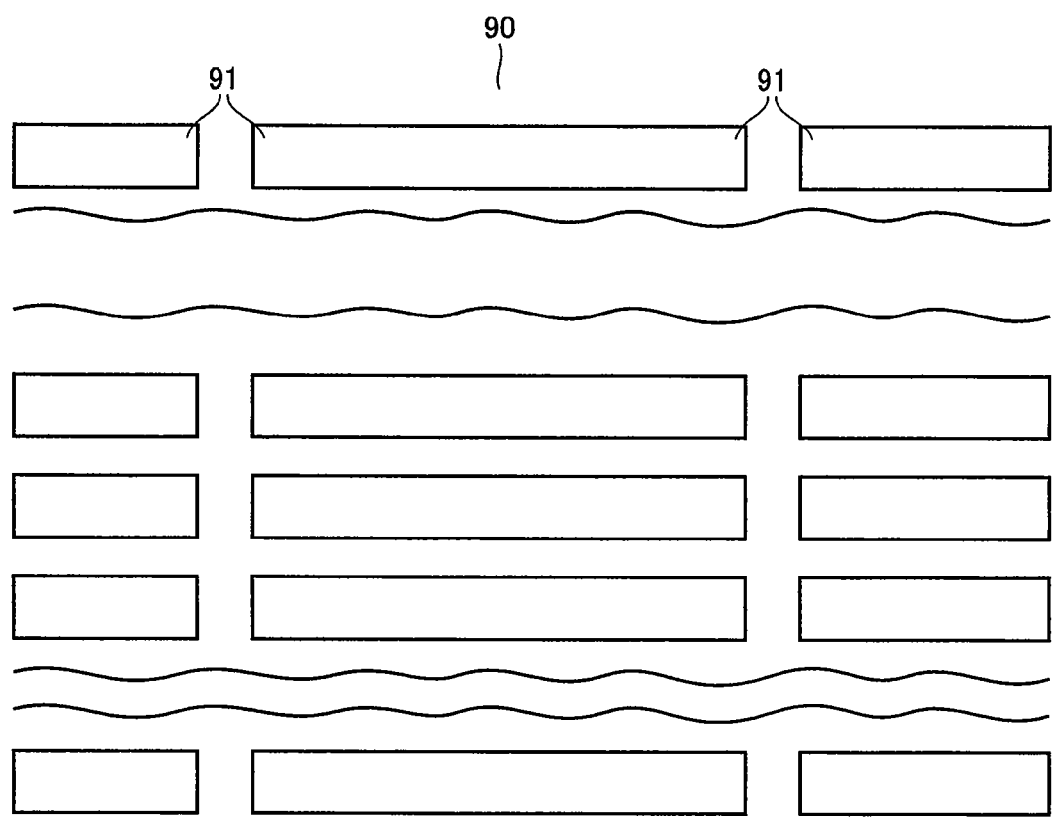
FIG. 49 is a plan view showing a step corresponding to the first step in the step of manufacturing the semiconductor integrated circuit device according to the first embodiment shown in FIGS. 6 and 7.

FIG. 49 is a plan view showing a step corresponding to the first step of the step of manufacturing semiconductor integrated circuit device 10 according to the first embodiment shown in FIGS. 6 and 7.

As shown in FIG. 49, isolation region 90 is formed on the main surface of semiconductor substrate 13 where memory cell region 67 is located, to define a plurality of active regions 91.

Figure 50:
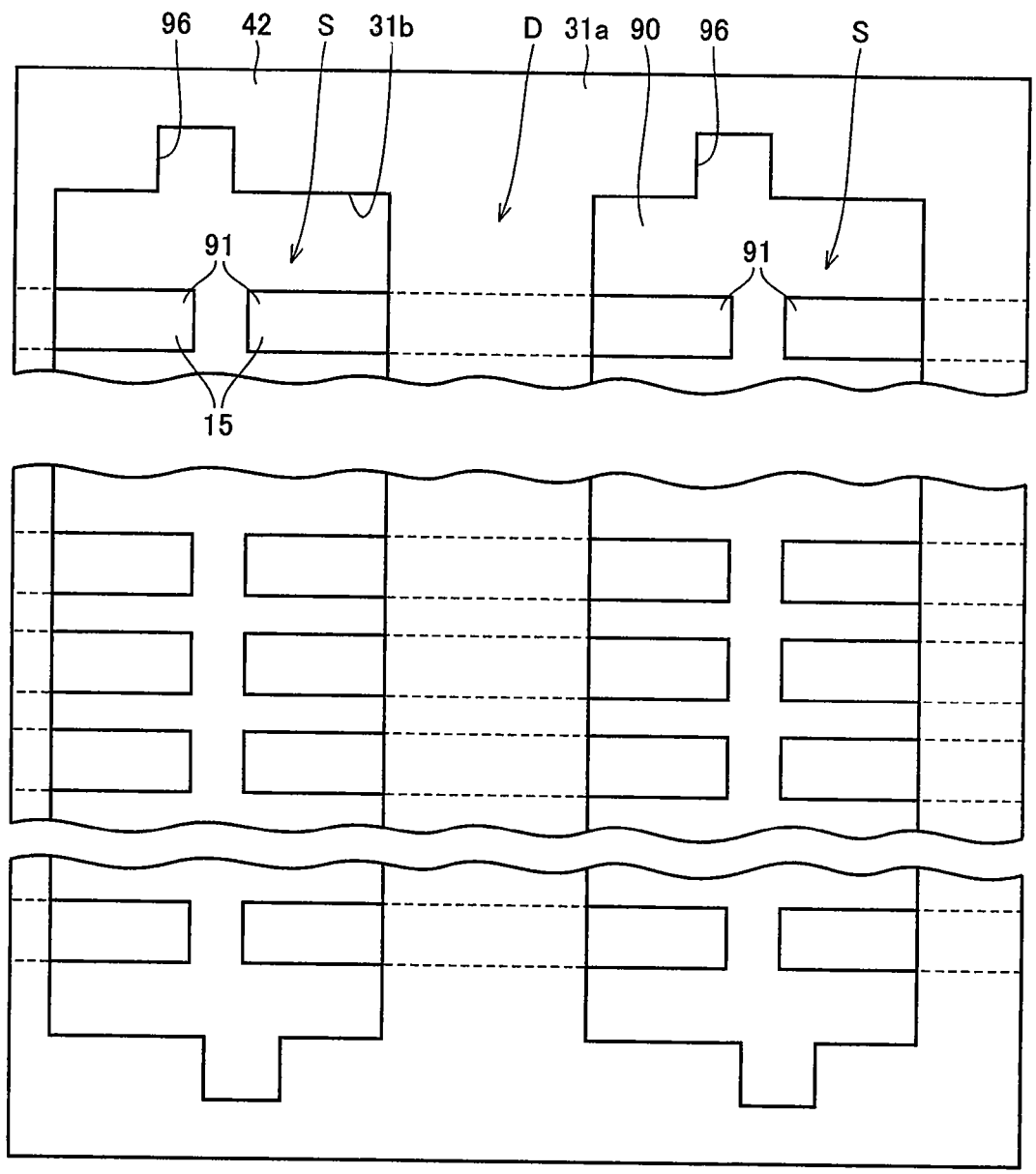
FIG. 50 is a plan view showing a manufacturing step corresponding to the third step of the semiconductor integrated circuit device according to the first embodiment shown in FIGS. 10 and 11.

FIG. 50 is a plan view showing a manufacturing step corresponding to the third step of semiconductor integrated circuit device 10 according to the first embodiment shown in FIGS. 10 and 11.

As shown in FIG. 50, conductive film pattern 31a having opening 31b in a region where source region 15 is located is formed in each active region 91. Here, recessed portions 96 are simultaneously patterned on opposing end portion sides in a longitudinal direction of opening 31b.

Figure 51:
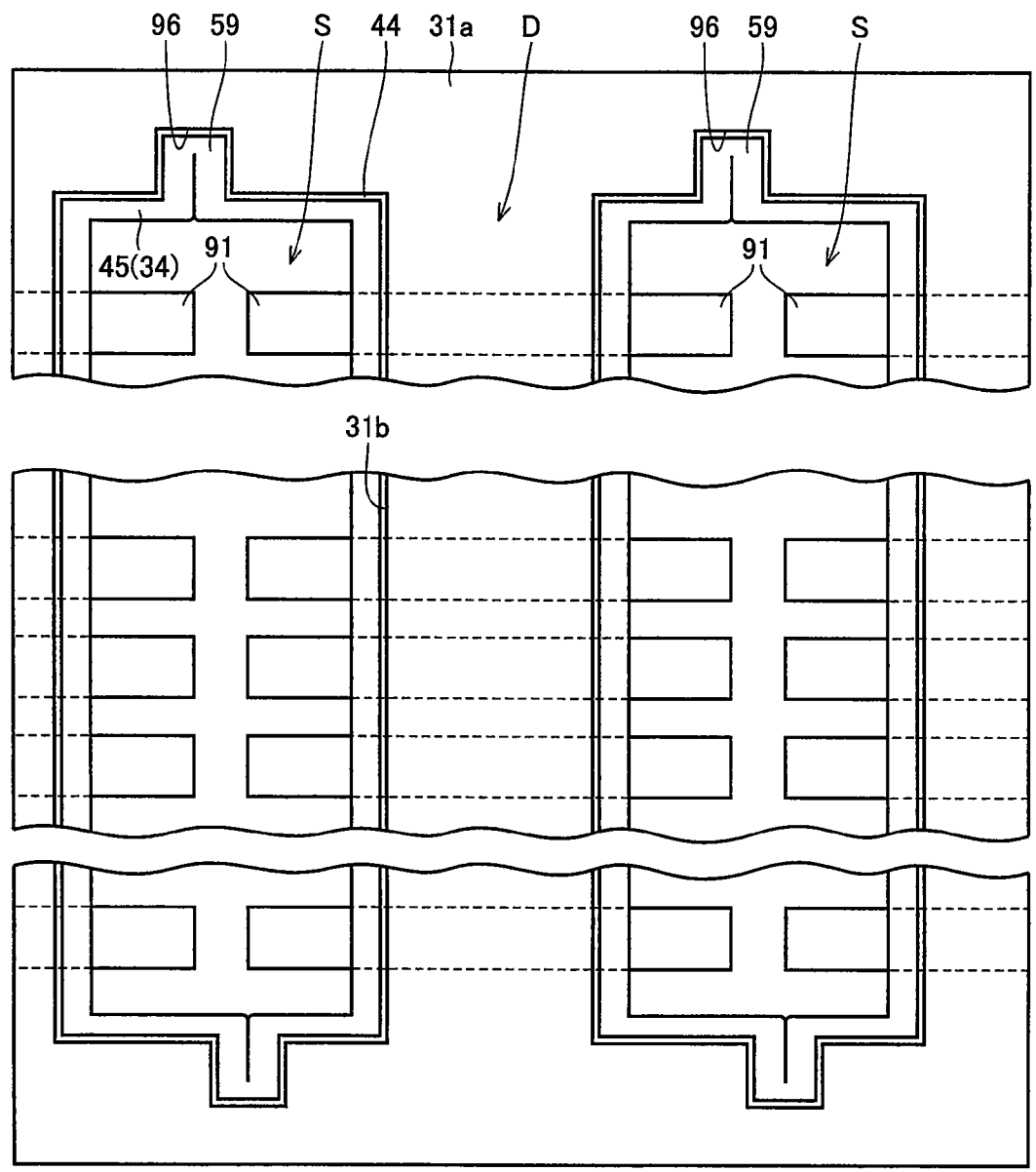
FIG. 51 is a plan view showing a manufacturing step corresponding to FIGS. 16 and 17.

FIG. 51 is a plan view showing a manufacturing step corresponding to FIGS. 16 and 17. As shown in FIGS. 51 and 16, insulating film 44 is formed on the surface of conductive film pattern 31a and on the main surface of semiconductor substrate 13 where opening 31b is located. Here, insulating film 44 is formed also on the inner surface of recessed portion 96 and on isolation region 90 where recessed portion 96 is located.

Thereafter, conductive film 34 is deposited (formed) on the upper surface of insulating film 44, and conductive film 34 is etched to form memory gate electrode 45 on the inner surface of opening 44 with insulating film 31b being interposed.

As shown in FIGS. 51 and 48, conductive film 34 implementing memory gate electrode 45 remains like a sidewall in recessed portion 96, and pad portion 59 is formed in a self-aligned manner. Here, if pad portion 59 is formed through photolithography, a margin between the formed pad portion and the control gate, or a margin for defective formation should be secured. On the other hand, if pad portion 59 is formed in a self-aligned manner as described above, such a margin is not necessary, and semiconductor integrated circuit device 10 can be reduced in size as compared with an example in which the pad portion is formed through lithography.

Figure 52:
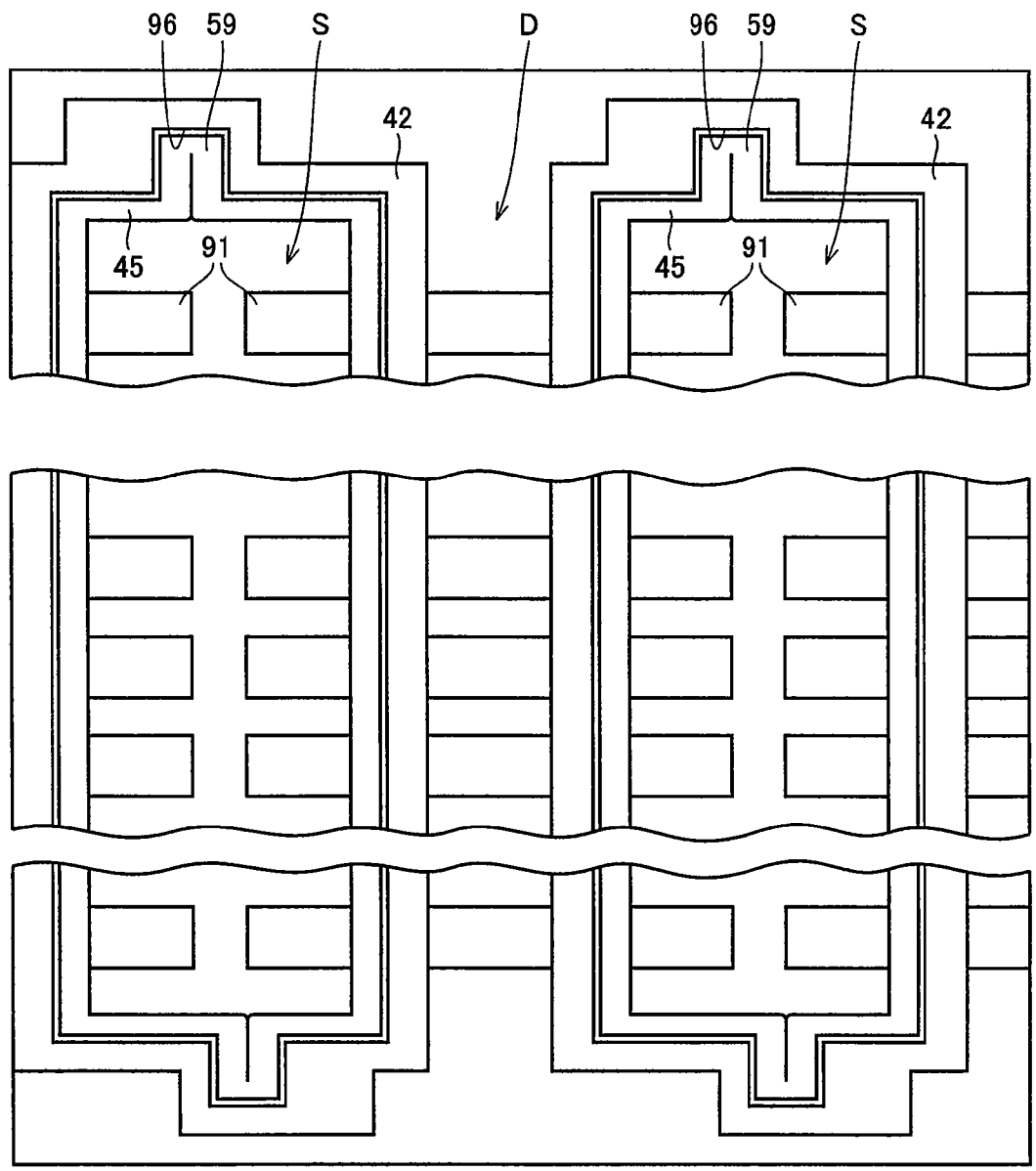
FIG. 52 is a plan view showing a manufacturing step subsequent to the manufacturing step shown in FIG. 51.

FIG. 52 is a plan view showing a manufacturing step subsequent to the manufacturing step shown in FIG. 51. As shown in FIG. 52, conductive film pattern 31a is patterned to form control gate 42, and a gate electrode of other peripheral circuit transistor is also formed by patterning.

It is noted that the step other than the manufacturing step described above is the same as in the manufacturing step according to the first and second embodiments.

Fourth Embodiment

Figure 53:
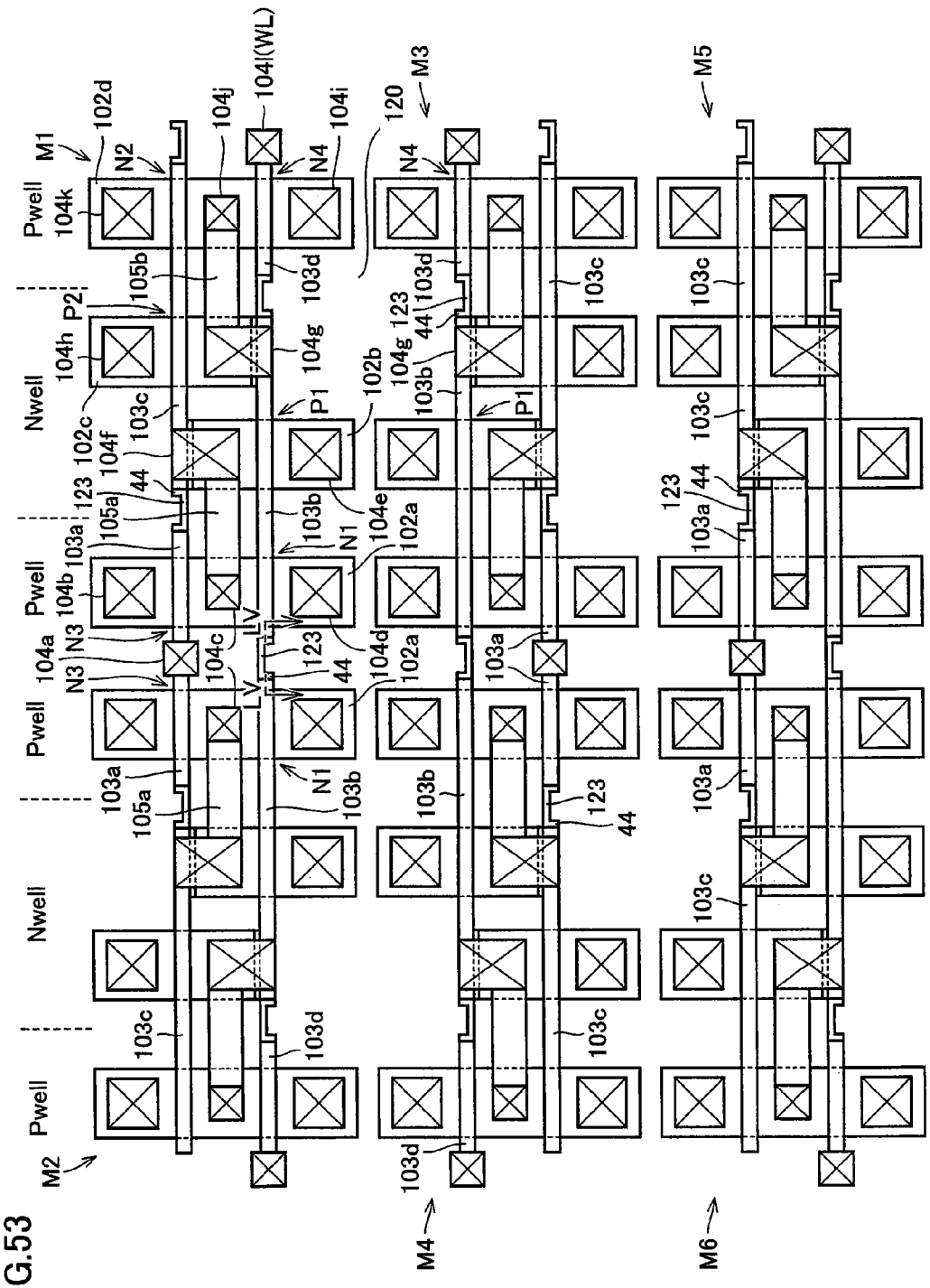
FIG. 53 is a plan view, for example, in an RAM region of a semiconductor integrated circuit device according to a fourth embodiment.

Semiconductor integrated circuit device 10 according to a fourth embodiment will be described with reference to FIGS. 53 to 66. FIG. 53 is a plan view, for example in RAM region 62 of semiconductor integrated circuit device 10 according to the fourth embodiment. As shown in FIG. 53, a plurality of SRAM (Static Random Access Memory) memory cells M1 to M6 are formed on the main surface of semiconductor substrate 13 where RAM region 62 is located.

Figure 54:
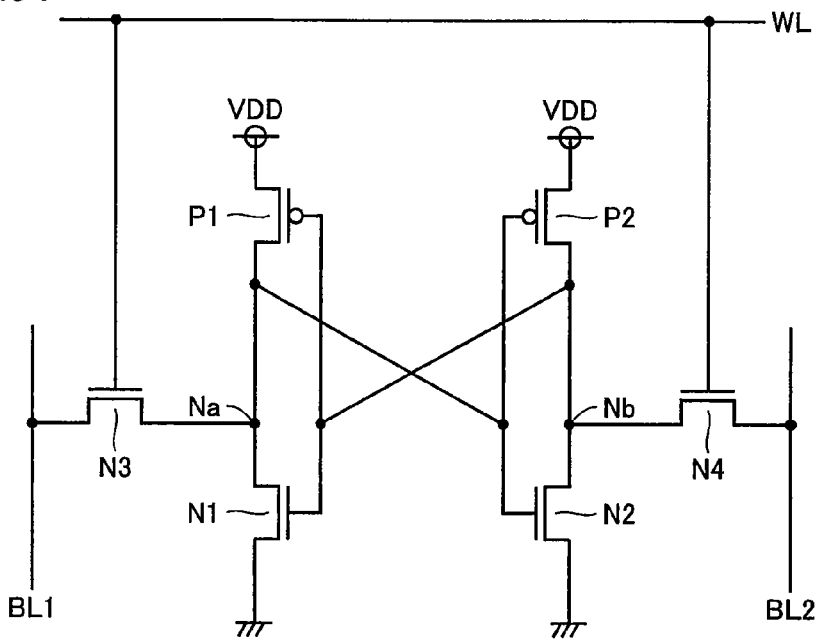
FIG. 54 shows an equivalent circuit of a memory cell M1.

Memory cells M1 to M6 are arranged on the main surface of semiconductor substrate 13 in a manner symmetric to each other with respect to a line. A configuration of SRAM memory cell M1 will briefly be described with reference to FIG. 54. Memory cell M1 has a full CMOS (Complementary Metal Oxide Semiconductor) cell structure, and includes a first inverter and a second inverter. FIG. 54 shows an equivalent circuit of memory cell M1. As shown in FIG. 54, memory cell M1 has two access NMOS transistors N3, N4.

The first inverter includes a first driver MOS transistor Ni and a first load PMOS (Positive Metal Oxide Semiconductor) transistor P1, and the second inverter includes a second driver NMOS transistor N2 and a second load PMOS transistor P2.

The first inverter and the second inverter form a flip-flop of which input and output are connected to each other. The flip-flop has a first storage node Na connected to the source of first access NMOS transistor N3, and a second storage node Nb connected to the source of second access NMOS transistor N4.

Storage node Na is connected to a bit line BL1 through first access NMOS transistor N3, and storage node Nb is connected to a bit line BL2 through second access NMOS transistor N4. In addition, the gates of the first and second access NMOS transistors N3, N4 are connected to a word line WL, and the sources of first and second load PMOS transistors P1, P2 are connected to a power supply line VDD.

A layout of memory cell M1 configured as the full CMOS SRAM will now be described. As shown in FIG. 53, an impurity is introduced, so as to provide P well regions on opposing sides of an N well region. Thereafter, an isolation region 120 is selectively formed on the main surface of semiconductor substrate 13, so as to define active regions 102a, 102b, 102c, 102d on the P well region and the N well region. Then, an N-type impurity such as phosphorus is selectively implanted into active regions 102a, 102b, 102c, 102d formed in the P well region, to form an impurity diffusion region. A P-type impurity such as boron is selectively implanted into the active region formed in the N well region, to form an impurity diffusion region. Active regions 102a, 102b, 102c, 102d herein refer to regions including a region serving as the source/drain of the transistor and a region (substrate portion) located between the former regions and having a conductivity type opposite to the former region.

Active regions 102a, 102d and active regions 102b, 102c are in linear shape, and extend in the same direction (a direction in which the P well region and the N well region extend). Therefore, variation in a width of the P well region or the N well region or variation in a position where they are formed can be suppressed.

Memory cell M1 in the present embodiment is constituted of six MOS transistors. Specifically, memory cell M1 is constituted of first and second driver NMOS transistors N1, N2, first and second access NMOS transistors N3, N4, and first and second load PMOS transistors P1, P2.

First and second access NMOS transistors N3, N4 and first and second driver NMOS transistors N1, N2 are formed on the P well regions on opposing sides of the N well region, and first and second load PMOS transistors P1, P2 are formed on the N well region in the center. First access NMOS transistor N3 is formed at an intersection of an impurity diffusion region 102a1 including the region serving as the source/drain and a polysilicon interconnection 103a, and second access NMOS transistor N4 is formed at an intersection of active region 102d including the region serving as the source/drain and a polysilicon interconnection 103d.

First driver NMOS transistor N1 is formed at an intersection of impurity diffusion region 102a1 including the region serving as the source/drain and a polysilicon interconnection 103b, and second driver NMOS transistor N2 is formed at an intersection of the active region including the region serving as the source/drain and a polysilicon interconnection 103c.

First load PMOS transistor P1 is formed at an intersection of an impurity diffusion region 102b1 including the region serving as the source/drain and polysilicon interconnection 103b, and second access PMOS transistor P2 is formed at an intersection of active region 102c including the region serving as the source/drain and polysilicon interconnection 103c.

Polysilicon interconnections 103a to 103d serve as the gates of respective MOS transistors, and extend in an identical direction as shown in FIG. 53. In other words, polysilicon interconnections 103a to 103d extend in a direction (a horizontal direction in FIG. 53) perpendicular to a direction in which the P well region and the N well region extend (a vertical direction in FIG. 53), i.e., in a direction in which the P well region and the N well region are aligned.

A not-shown interlayer insulating film is formed to cover active regions 102a to 102d and polysilicon interconnections 103a to 103d, and contact portions 104a to 1041 reaching the impurity diffusion region formed in active regions 102a to 102d and attaining a function as the source/drain are formed.

A conductive layer for connection to an upper interconnection is embedded in contact portions 104a to 104l.

Contact portions 104a and 104l serve as gate contacts reaching the gates, contact portions 104f and 104g serve as shared contacts reaching the impurity diffusion region and the polysilicon interconnection, and other contact portions 104b, 104c, 104d, 104e, 104h, 104i, 104j, and 104k serve as diffusion contacts reaching the impurity diffusion region.

In FIG. 53, the N-type impurity diffusion region serving as the drain of first driver NMOS transistor N1 and the N-type impurity diffusion region serving as the drain of first access NMOS transistor N3 are shared by these transistors. The drain of first driver NMOS transistor N1 and the drain of first access NMOS transistor N3 are connected to the drain of first load transistor P1 through contact portion 104c formed on the N-type impurity diffusion region, a first metal interconnection 105a, and contact portion (shared contact) 104f. This terminal serves as storage node Na in the equivalent circuit diagram shown FIG. 54.

Similarly, the N-type impurity diffusion region serving as the drain of second driver NMOS transistor N2 and the N-type impurity diffusion region serving as the drain of second access NMOS transistor N3 are connected to the drain of second load transistor P2 through contact portion 104j, a first metal interconnection 105b, and contact portion (shared contact) 104g. This terminal serves as storage node Nb in the equivalent circuit diagram shown FIG. 54.

Other memory cells are configured in a manner similar to memory cell M1 configured as above. Here, memory cell M2 is adjacent to memory cell M1 in a direction in which polysilicon interconnection 103b extends, while memory cell M3 is adjacent to memory cell M1 in a direction in which active regions 102a to 102d extend. In addition, similarly, memory cell M4 is adjacent to memory cell M3 in a direction in which polysilicon interconnection 103b extends.

Here, a distance between an end surface of polysilicon interconnection 103b of memory cell M1 and an end surface of polysilicon interconnection 103b of memory cell M2 adjacent to memory cell M1 is set, for example, to approximately 100 nm to 120 nm. A distance between impurity region 102a of memory cell M1 and impurity region 102a of memory cell M2 is set, for example, to approximately 200 to 220 nm. It is noted that insulating film 44 is formed on end surfaces of polysilicon interconnections 103a opposed to each other.

A distance between the end surface of polysilicon interconnection 103b and an end surface of polysilicon interconnection 103d is also set to approximately 100 nm to 120 nm. Insulating film 44 is formed also on end surfaces of polysilicon interconnections 103b, 103d opposed to each other.

Figure 55:
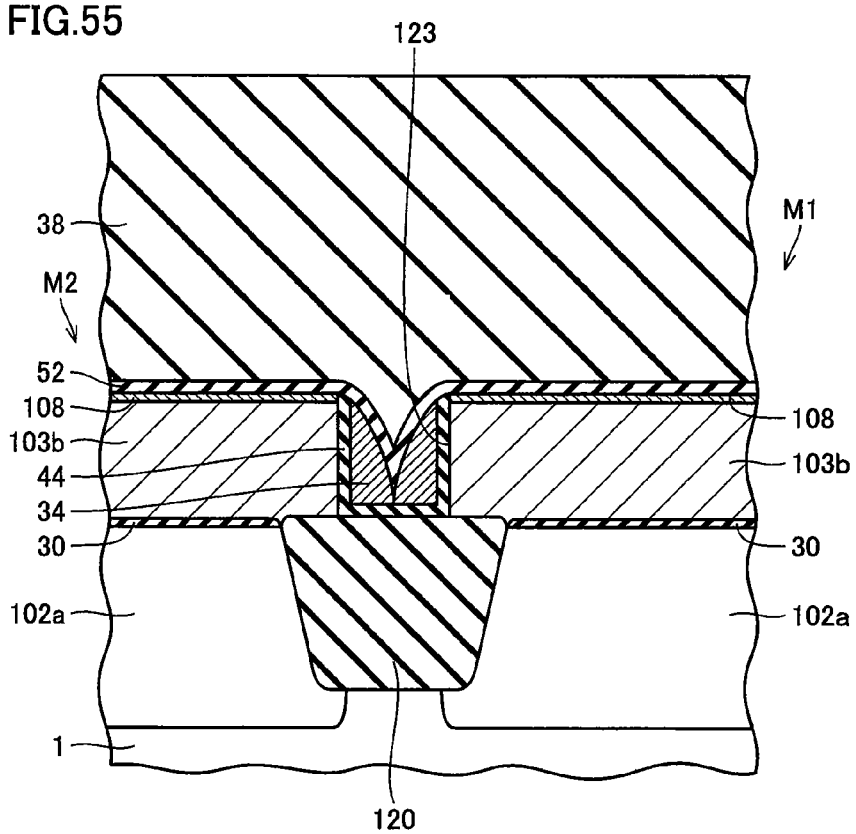
FIG. 55 is a cross-sectional view along the line LV-LV in FIG. 53.

FIG. 55 is a cross-sectional view along the line LV-LV in FIG. 53. As shown in FIG. 55, polysilicon interconnections 103b of memory cells M1, M2 are formed on active regions 102a, with insulating film 30 such as a silicon oxide film being interposed.

A boundary portion between polysilicon interconnection 103b of memory cell M1 and polysilicon interconnection 103b of memory cell M2 is located on isolation region 90 between active region 102a of memory cell M1 and active region 102a of memory cell M2. Insulating film 44 is formed also on the surface of tip end portions of polysilicon interconnections 103b, 103b from the isolation region between polysilicon interconnection 103b of memory cell M1 and polysilicon interconnection 103b of memory cell M2. Insulating film 44 ensures insulation between polysilicon interconnection 103b of memory cell M1 and polysilicon interconnection 103b of memory cell M2. Conductive film 34 like a sidewall is formed on the surface of the tip end portion of polysilicon interconnection 103b at the boundary portion between polysilicon interconnections 103b, with insulating film 44 being interposed.

Figure 56:
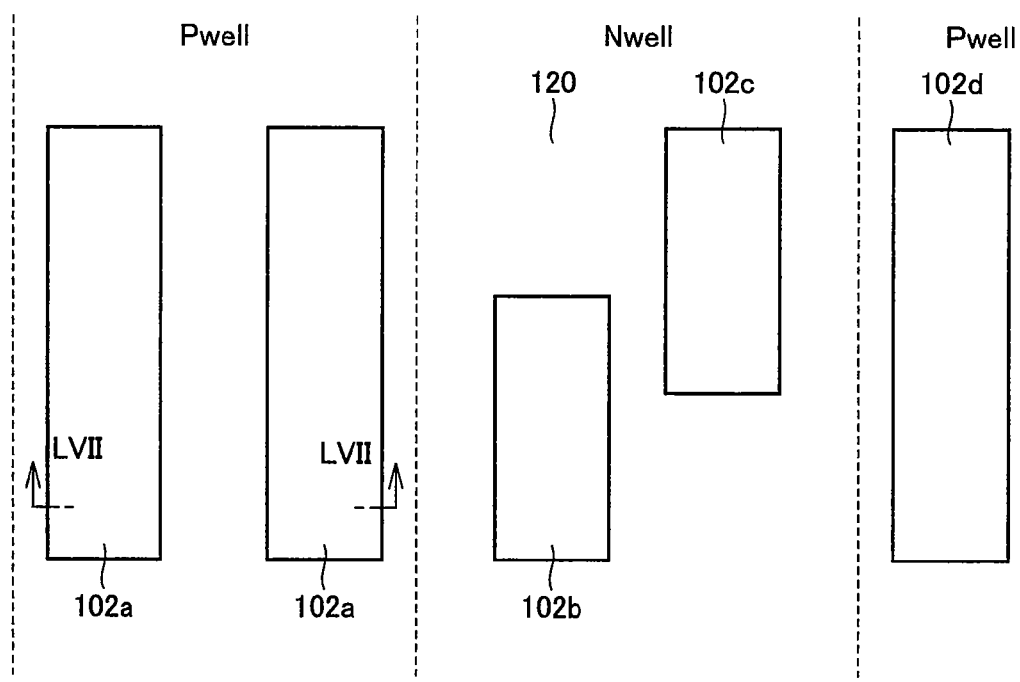
FIG. 56 is a plan view showing the first step in the step of manufacturing the semiconductor integrated circuit device according to the fourth embodiment.
Figure 57:
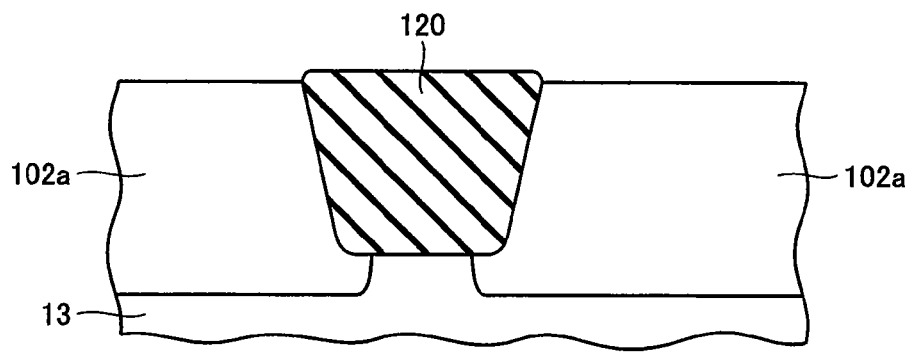
FIG. 57 is a cross-sectional view along the line LVII-LVII in FIG. 56.

A method of manufacturing semiconductor integrated circuit device 10 configured as above will now be described with reference to FIGS. 56 to 66. FIG. 56 is a plan view showing the first step in the step of manufacturing semiconductor integrated circuit device 10 according to the fourth embodiment, which corresponds to the first step of semiconductor integrated circuit device 10 according to the first embodiment shown in FIGS. 6 and 7. FIG. 57 is a cross-sectional view along the line LVII-LVII in FIG. 56. As shown in FIG. 57, isolation region 120 is selectively formed on the main surface of semiconductor substrate 13, to define the active region as well as the P well region and the N well region.

An impurity is selectively introduced into each P well region and N well region, to form impurity regions 102a to 102d.

Figure 58:
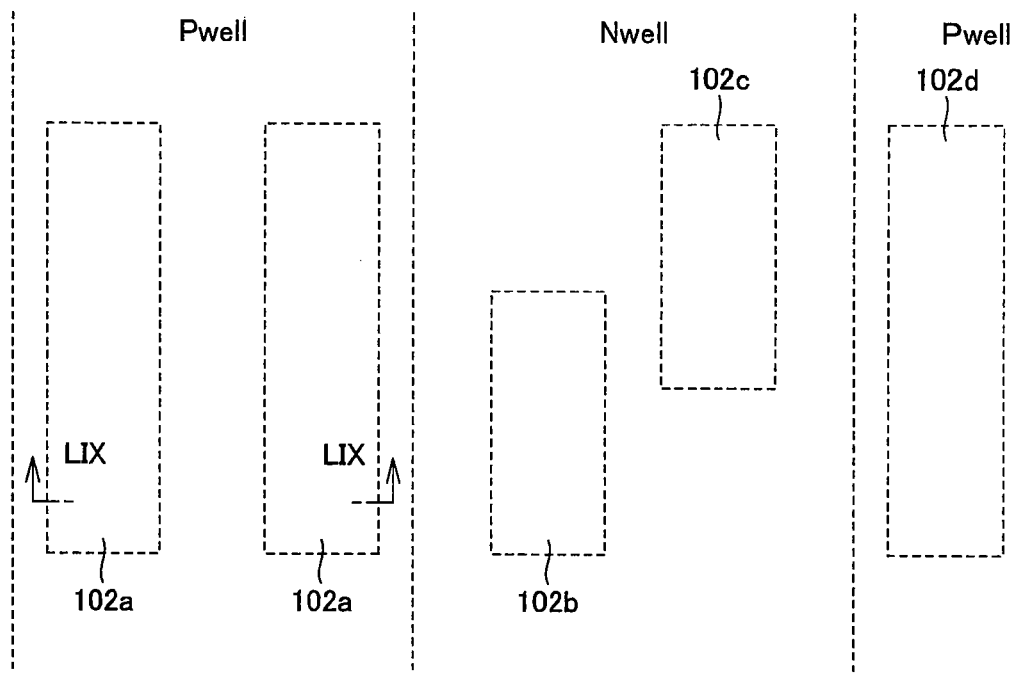
FIG. 58 is a plan view showing the step of manufacturing the semiconductor integrated circuit device subsequent to the manufacturing step shown in FIG. 56.
Figure 59:
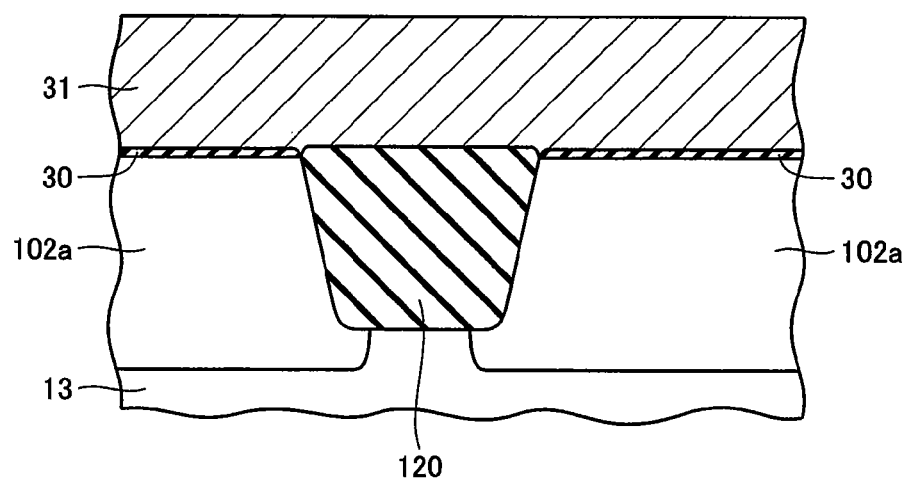
FIG. 59 is a cross-sectional view along the line LIX-LIX in FIG. 58.

FIG. 58 is a plan view showing the step of manufacturing semiconductor integrated circuit device 10 subsequent to the manufacturing step shown in FIG. 56, which corresponds to the second step of semiconductor integrated circuit device 10 according to the first embodiment shown in FIGS. 8 and 9. FIG. 59 is a cross-sectional view along the line LIX-LIX in FIG. 58.

As shown in FIGS. 58 and 59, the main surface of semiconductor substrate 13 is subjected to thermal oxidation treatment, to form insulating film 30 implemented by a silicon oxide film or the like.

Thereafter, conductive film 31 implemented by the polysilicon film or the like is deposited on the main surface of semiconductor substrate 13 with insulating film 30 being interposed.

Figure 60:
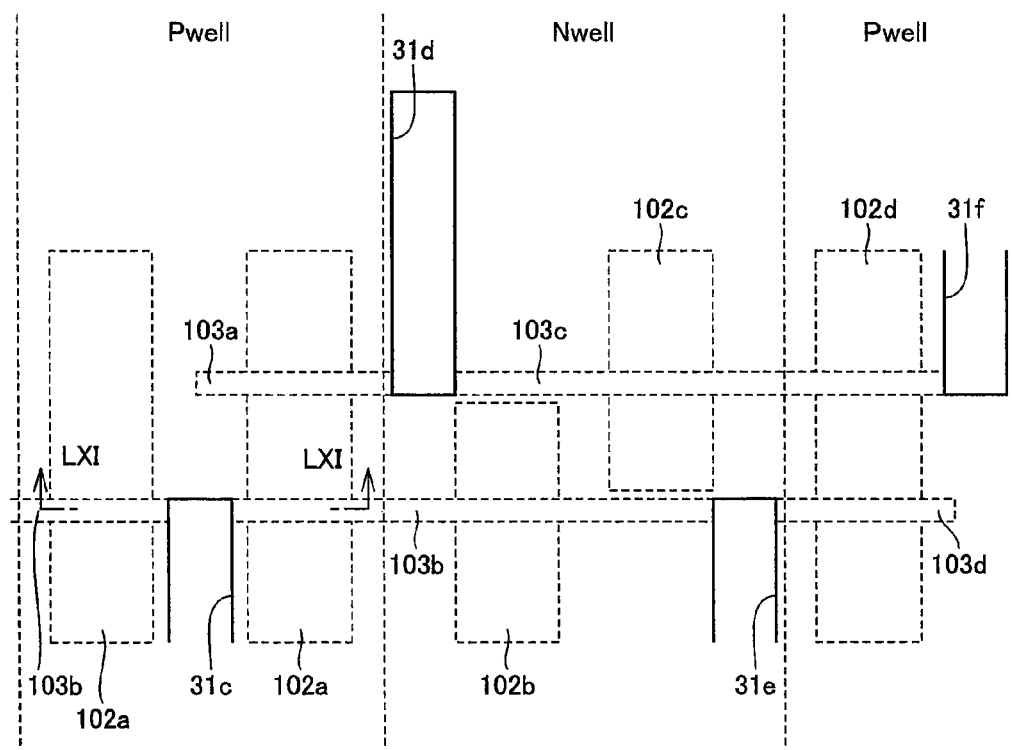
FIG. 60 is a plan view showing the step of manufacturing the semiconductor integrated circuit device subsequent to the manufacturing step shown in FIG. 58.
Figure 61:
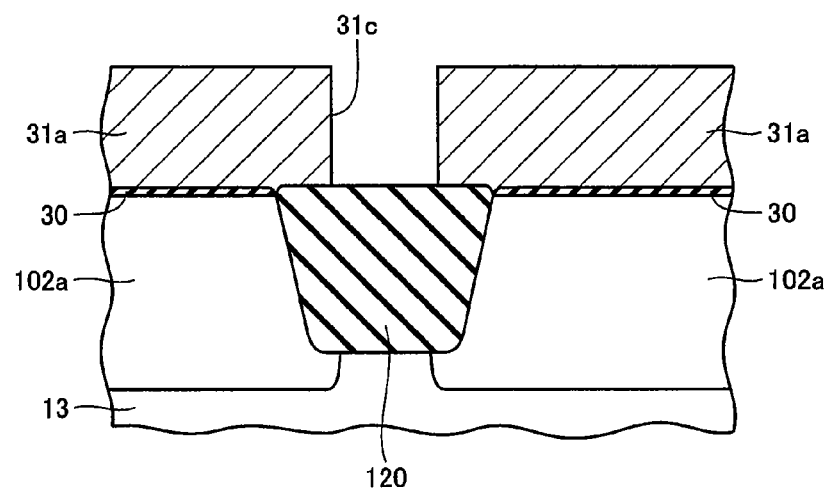
FIG. 61 is a cross-sectional view along the line LXI-LXI in FIG. 60.

FIG. 60 is a plan view showing the step of manufacturing semiconductor integrated circuit device 10 subsequent to the manufacturing step shown in FIG. 58, which corresponds to the third step of semiconductor integrated circuit device 10 according to the first embodiment shown in FIGS. 10 and 11. FIG. 61 is a cross-sectional view along the line LXI-LXI in FIG. 60.

As shown in FIGS. 60 and 10, conductive film pattern 31a having opening 31b in a region serving as the source region of the memory cell transistor having a MONOS structure and a plurality of openings 31c to 31f each formed in a region where RAM region 62 shown in FIG. 60 is located is formed in ROM region 63.

Specifically, conductive film pattern 31a, that has opening 31c in a region between polysilicon interconnections 103b of adjacent memory cells M1 to M6, opening 31d in a region between polysilicon interconnection 103a and polysilicon interconnection 103c, opening 31e in a region between polysilicon interconnection 103b and polysilicon interconnection 103d, and opening 31f in a region between polysilicon interconnections 103c of adjacent memory cells M1 to M6, is formed.

Opening 31c extends from the region between polysilicon interconnection 103b of formed memory cell M1 and polysilicon interconnection 103b of memory cell M2 to a region between polysilicon interconnection 103b of memory cell M3 and polysilicon interconnection 103b of memory cell M4 in FIG. 53. In other words, opening 31c is formed in such an elongated manner as extending in a direction in which active regions 102a to 102d extend. In addition, openings 31d, 31e and 31f are also formed in such an elongated manner as extending in a direction in which active regions 102a to 102d extend, in a manner similar to opening 31c. Conductive film pattern 31a including openings 31c to 31f formed in such an elongated manner can readily be manufactured by using a stepper employing laser beam such as KrF excimer laser, ArF excimer laser, and the like as a light source.

Figure 62:
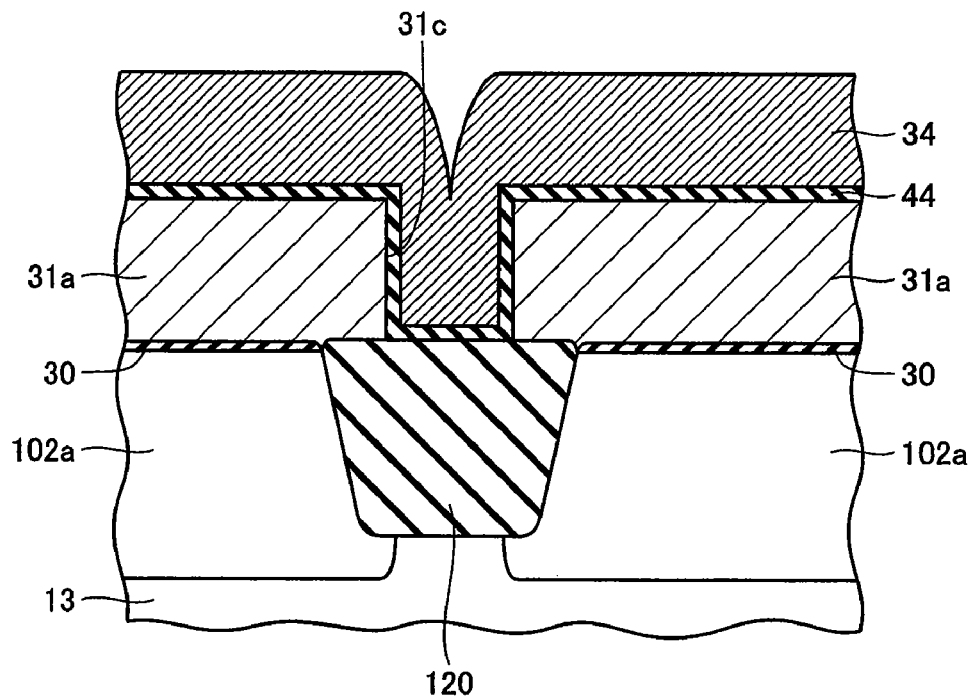
FIG. 62 is a cross-sectional view showing a manufacturing step subsequent to the step of manufacturing the semiconductor integrated circuit device shown in FIG. 61.

FIG. 62 is a cross-sectional view showing the manufacturing step subsequent to the step of manufacturing semiconductor integrated circuit device 10 shown in FIG. 61, which corresponds to the fifth step of semiconductor integrated circuit device 10 according to the first embodiment shown in FIGS. 14 and 15.

As shown in FIG. 62, insulating film 44 implemented by what is called the ONO film is formed on the surface of conductive film pattern 31a, on inner wall surfaces of openings 31c to 31f, and on the upper surface of isolation region 120 where openings 31c to 31f are located. Thereafter, conductive film 34 is deposited (formed) on conductive film pattern 31a with insulating film 44 being interposed. Here, conductive film 34 fills also openings 31c to 31f.

Figure 63:
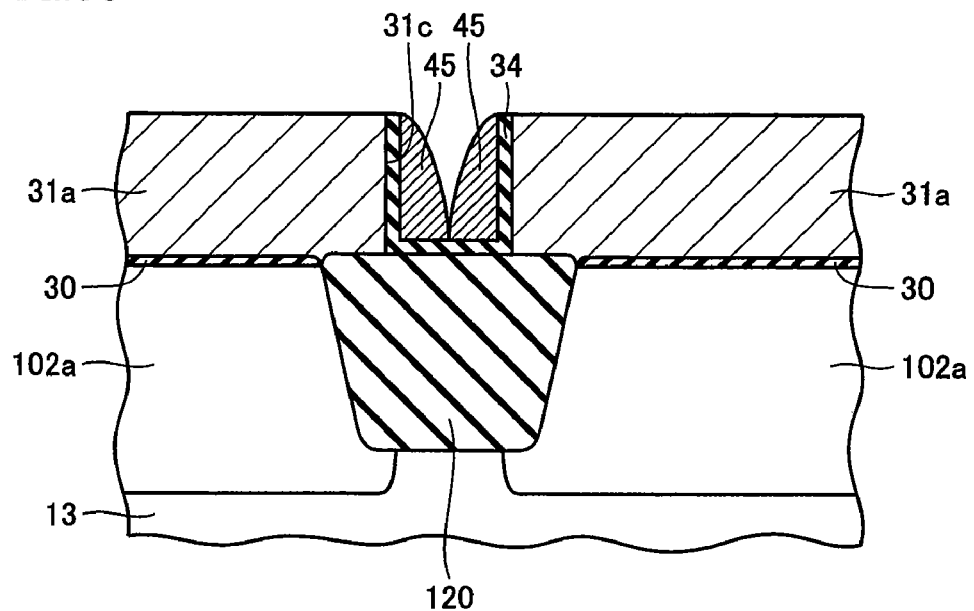
FIG. 63 is a cross-sectional view showing a manufacturing step subsequent to the manufacturing step shown in FIG. 62.
Figure 64:
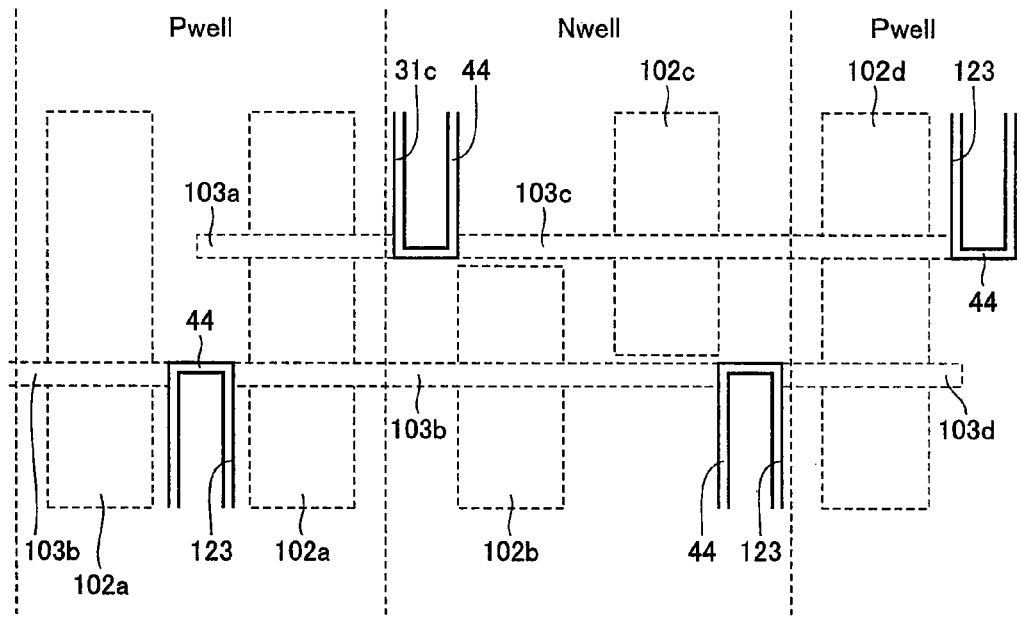
FIG. 64 is a plan view of the manufacturing step shown in FIG. 63.

FIG. 63 is a cross-sectional view showing a manufacturing step subsequent to the manufacturing step shown in FIG. 62, which corresponds to the sixth step of semiconductor integrated circuit device 10 according to the first embodiment shown in FIGS. 16 and 17. FIG. 64 is a plan view of the manufacturing step shown in FIG. 63.

As shown in FIG. 63, conductive film 34 is etched, so as to form memory gate electrode 45 on the main surface of semiconductor substrate 13 where ROM region 63 is located, as shown in FIG. 64. Here, conductive film 34 like a sidewall is formed on the inner surfaces of openings 31c to 31f.

Insulating film 44 is formed between conductive film 34 like a sidewall and conductive film pattern 31a, so that insulation between conductive film pattern 31a and conductive film 34 is ensured.

Figure 65:
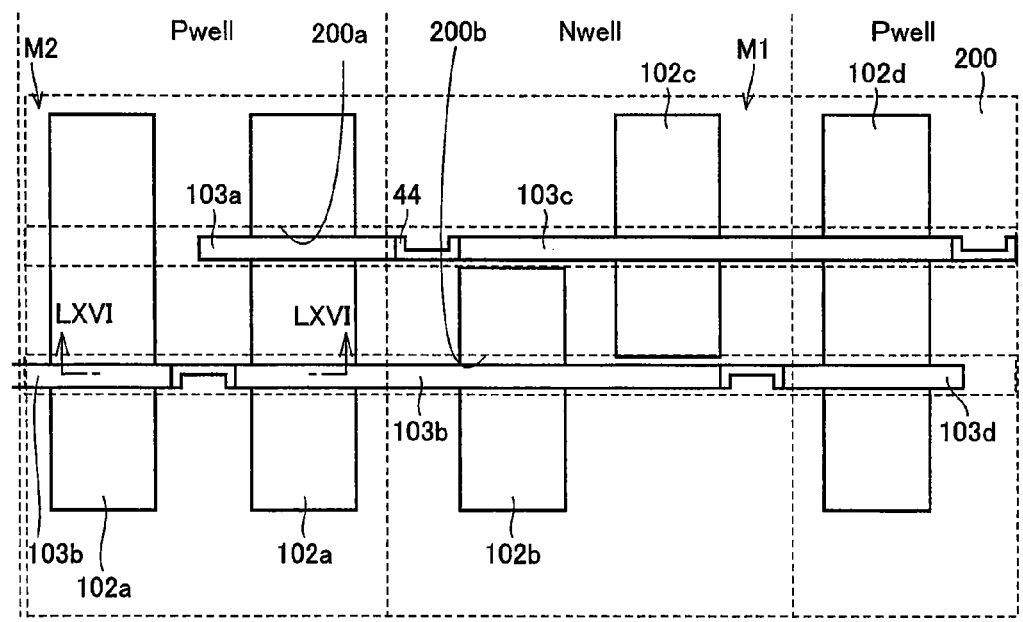
FIG. 65 is a plan view showing a manufacturing step subsequent to the manufacturing step shown in FIG. 64.
Figure 66:
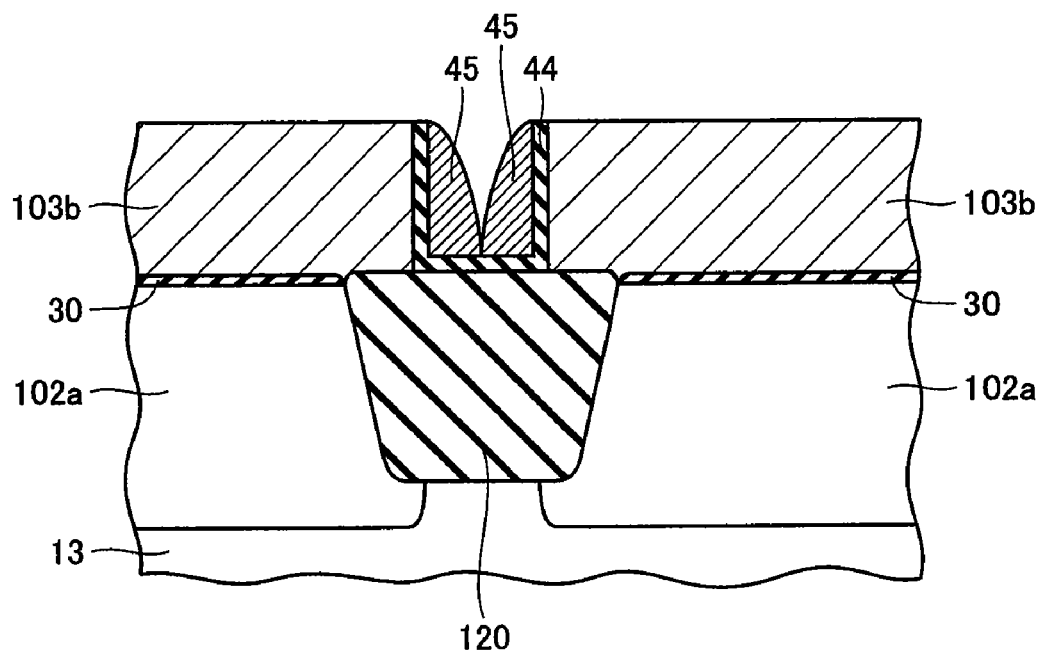
FIG. 66 is a cross-sectional view along the line LXVI-LXVI in FIG. 65.

FIG. 65 is a plan view showing a manufacturing step subsequent to the manufacturing step shown in FIG. 64, which corresponds to the seventh step of semiconductor integrated circuit device 10 according to the first embodiment shown in FIGS. 18 and 19. FIG. 66 is a cross-sectional view along the line LXVI-LXVI in FIG. 65. As shown in FIGS. 65 and 66, conductive film pattern 31a is patterned to form polysilicon interconnections 103a to 103d. In the step of forming polysilicon interconnections 103a to 103d, initially, a resist mask is formed on the entire upper surface of conductive film pattern 31a. Thereafter, a photomask 200 is arranged above the resist mask, and the resist mask is subjected to exposure treatment.

Photomask 200 includes a plurality of opening patterns 200a, 200b that extend in a direction in which polysilicon interconnections 103a to 103d extend.

Opening pattern 200a is such a pattern as connecting polysilicon interconnections 103a, 103c of memory cell M1 and polysilicon interconnections 103a, 103c of memory cell M2 to each other.

Opening pattern 200b is such a pattern as connecting polysilicon interconnections 103b, 103d of memory cell M1 and polysilicon interconnections 103b, 103d of memory cell M2 to each other.

Using such photomask 200, photolithography is performed to pattern conductive film pattern 31a. Here, openings 31c to 31f have already been formed in the main surface of formed semiconductor substrate 13. Accordingly, even when photomask 200 as above is used to pattern conductive film pattern 31a, polysilicon interconnections are isolated by insulating film 44 formed on the inner wall surface of openings 31c to 31f. For example, insulating film 44 formed on the inner surface of opening 31c isolates polysilicon interconnection 103b of memory cell M1 and polysilicon interconnection 103b of memory cell M2 from each other. Insulating film 44 formed on the inner surface of opening 31d isolates polysilicon interconnection 103a and polysilicon interconnection 103c from each other as well. In addition, insulating film 44 formed in opening 31e isolates polysilicon interconnection 103b and polysilicon interconnection 103d from each other. Insulating film 44 formed on the inner surface of opening 31c isolates polysilicon interconnection 103c of memory cell M1 and polysilicon interconnection 103c of the memory cell adjacent to memory cell M1 from each other as well.

As described above, openings 31c to 31f are formed in advance in the boundary region between polysilicon interconnections 103a to 103d and insulating film 44 is formed on the inner wall surfaces of openings 31c to 31f, so that each polysilicon interconnection 103a to 103f can be divided in a self-aligned manner. Therefore, patterning can be performed such that polysilicon interconnections 103a to 103d adjacent in the longitudinal direction are connected to each other when conductive film pattern 31a is subjected to photolithography.

Opening 31c has a width, for example, of 100 nm to 120 nm in a lateral direction (in a direction in which polysilicon interconnections 103a to 103d extend). A distance between a perimeter of opening 31c and active region 102a is set, for example, to approximately 50 nm.

Accordingly, a distance between active region 102a of memory cell M1 and active region 102a of memory cell M2 can be set to approximately 200 nm to 220 nm.

On the other hand, if patterning of polysilicon interconnections 103a to 103d is attempted without forming openings 31c to 31f, initially, a margin between polysilicon interconnections 103a to 103d should be secured, taking into account defective formation of polysilicon interconnections 103a to 103d to be formed. For example, a distance between polysilicon interconnections 103a to 103d should be set, for example, to approximately 120 nm. In addition, a distance of approximately 100 nm should be secured between active regions 102a to 102d, taking into account margin for mask displacement or defective formation. Therefore, for example, a distance between active region 102a of memory cell M1 and active region 102a of memory cell M2 is set, for example, to approximately 300 nm to 320 nm.

In particular, the regions on the main surface of semiconductor substrate 13 under opening 31c and on opposing sides of opening 31c serve as the P well regions, i.e., the well regions having the same conductivity type. Therefore, the distance between active region 102a of memory cell M1 and active region 102a of memory cell M2 is determined simply by a distance between polysilicon interconnections 103b.

Therefore, by making smaller the distance between polysilicon interconnections 103b, a smaller distance between active regions 102a can be ensured, which significantly contributes to a smaller size of semiconductor integrated circuit device 10. As described above, according to the method of manufacturing semiconductor integrated circuit device 10 of the fourth embodiment, the distance between polysilicon interconnections of each SRAM transistor can be made smaller and reduction in size of semiconductor integrated circuit device 10 can be achieved. Though the fourth embodiment has been applied to an SRAM formed in RAM region 62 of semiconductor integrated circuit device 10, applications of the embodiment are not limited to such an embedded microcomputer. The application of the embodiment is not limited to the SRAM, and the embodiment is applicable to an example in which a plurality of gates are formed. In such an example, a distance between gates can be made smaller.

Figure 67:
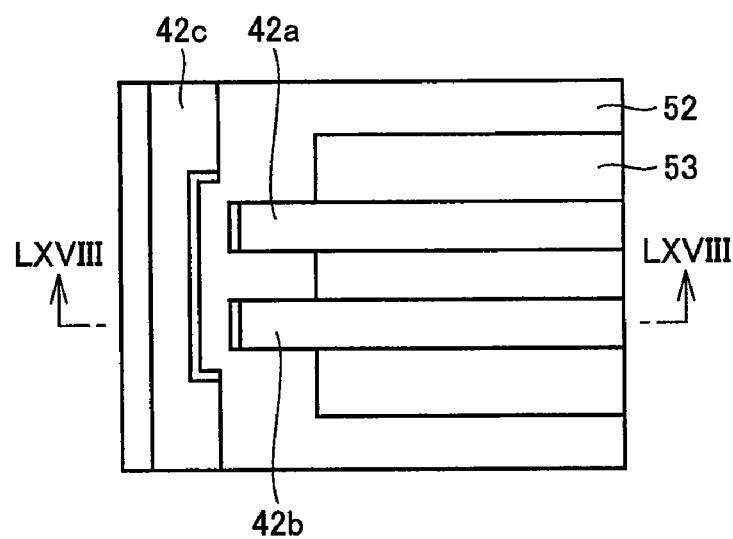
FIG. 67 is a plan view of a peripheral circuit region of a semiconductor integrated circuit device according to a variation of the fourth embodiment.
Figure 68:
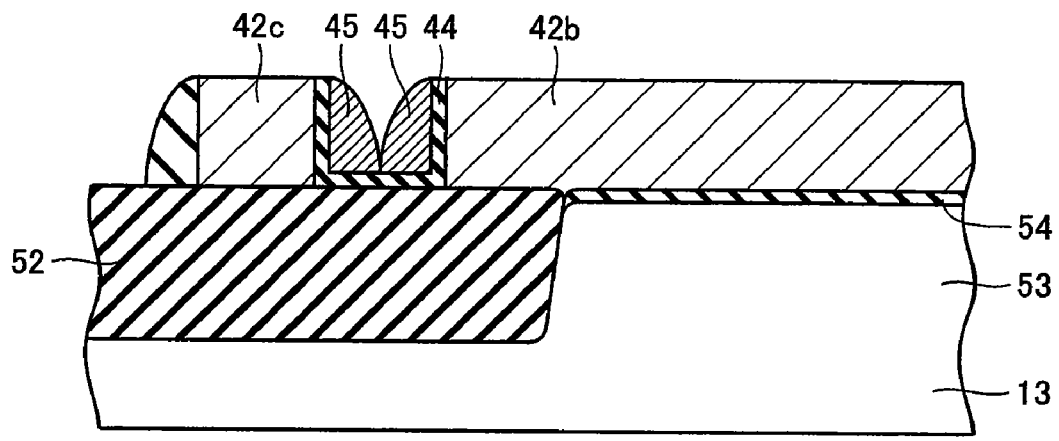
FIG. 68 is a cross-sectional view along the line LXVIII-LXVIII in FIG. 67.

A variation of the fourth embodiment will be described with reference to FIGS. 34 to 37 and FIGS. 67 to 79. FIG. 67 is a plan view of the peripheral circuit region of semiconductor integrated circuit device 10 according to the variation of the fourth embodiment, and FIG. 68 is a cross-sectional view along the line LXVIII-LXVIII in FIG. 67. As shown in FIG. 67, gate electrodes (interconnection) 42a, 42b extending in one direction and a gate electrode (interconnection) 42c located on an end portion side of gate electrodes 42a, 42b and extending in a direction intersecting the direction in which gate electrodes 42a, 42b extend are formed on the main surface of semiconductor substrate 13 where the peripheral circuit region is located.

A boundary region between gate electrodes 42a, 42b and gate electrode 42c is formed on isolation region 52 formed on the main surface of semiconductor substrate 13. As shown in FIG. 68, gate electrode 42b is formed on the upper surface of an active region 53 with an insulating film 54 being interposed, and a part of gate electrode 42b reaches isolation region 52. Insulating film 44 implemented, for example, by the ONO film is formed on an end surface of gate electrode 42b, on a portion of a side surface of gate electrode 42c opposed to gate electrode 42b, and on the surface of isolation region 52 located at the boundary portion between gate electrode 42b and gate electrode 42c, so that isolation between gate electrode 42b and gate electrode 42c is ensured. In addition, conductive film 45 like a sidewall is formed on the end surface of gate electrode 42b with insulating film 44 being interposed, and conductive film 45 like a sidewall is formed also on an outer surface of gate electrode 42c opposed to gate electrode 42b with insulating film 44 being interposed.

Figure 69:
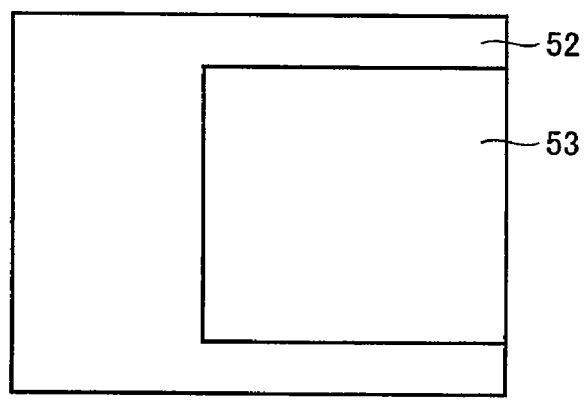
FIG. 69 is a plan view showing the first step of the semiconductor integrated circuit device according to the variation of the fourth embodiment.
Figure 70:
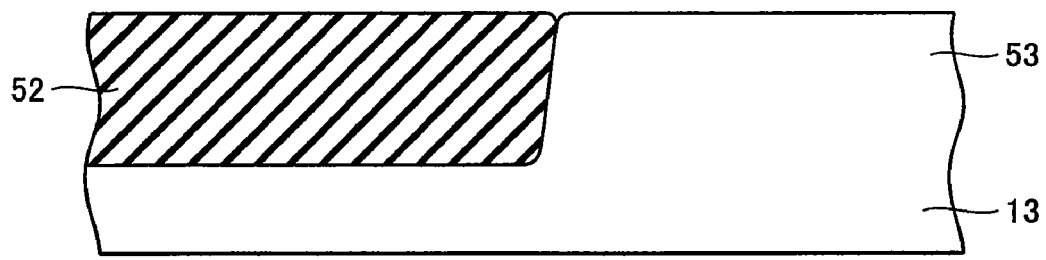
FIG. 70 is a cross-sectional view of FIG. 69.

FIG. 69 is a plan view showing the first manufacturing step of semiconductor integrated circuit device 10 according to the variation, which corresponds to the first manufacturing step of semiconductor integrated circuit device 10 according to the first embodiment shown in FIGS. 6 and 7. FIG. 70 is a cross-sectional view of FIG. 69.

As shown in FIGS. 69 and 70, isolation region 52 is selectively formed on the main surface of semiconductor substrate 13, to define active region 53.

Figure 71:
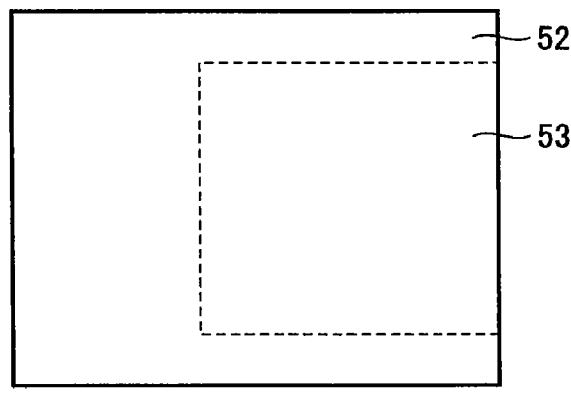
FIG. 71 is a plan view showing a manufacturing step subsequent to the manufacturing step shown in FIG. 69.
Figure 72:
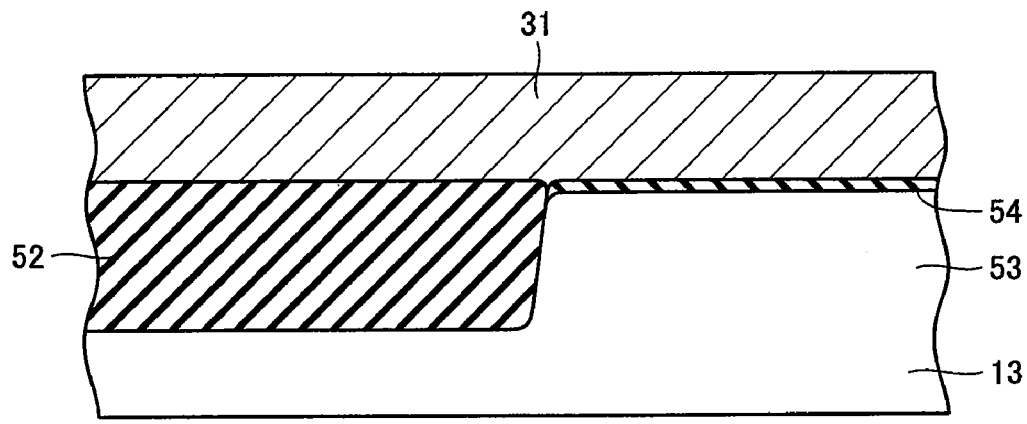
FIG. 72 is a cross-sectional view of FIG. 71.

FIG. 71 is a plan view showing a manufacturing step subsequent to the manufacturing step shown in FIG. 69, which corresponds to the second step of semiconductor integrated circuit device 10 according to the first embodiment shown in FIGS. 8 and 9. FIG. 72 is a cross-sectional view of FIG. 71.

As shown in FIGS. 71 and 72, insulating film 54 is formed on the main surface of semiconductor substrate 13, and conductive film 31 is deposited (formed) on the upper surface of insulating film 54.

Figure 34:
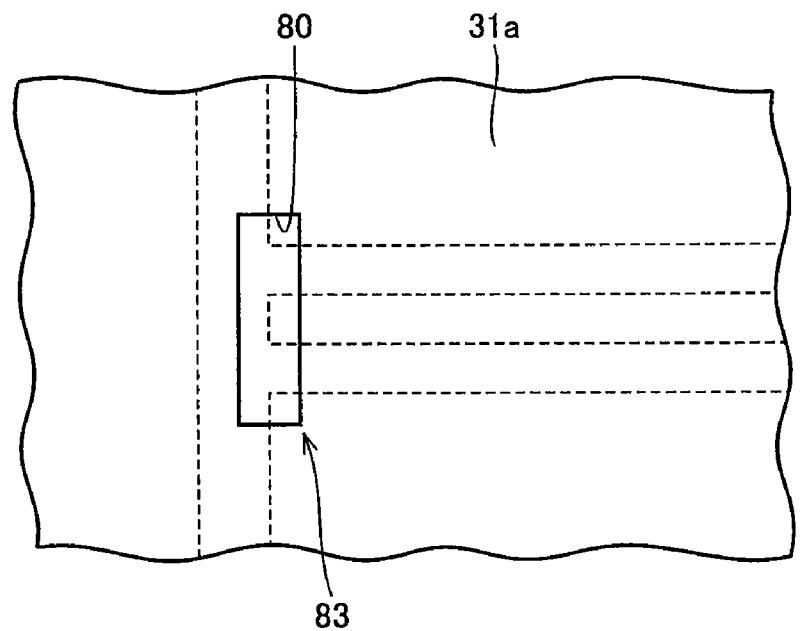
FIG. 34 is a plan view of the peripheral circuit region in the step of patterning the conductive film of the semiconductor integrated circuit device.
Figure 73:
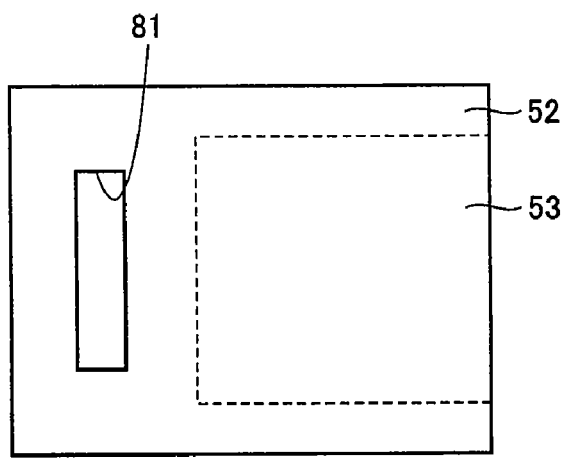
FIG. 73 is a plan view of the peripheral circuit region in the step of patterning the conductive film of the semiconductor integrated circuit device.
Figure 74:
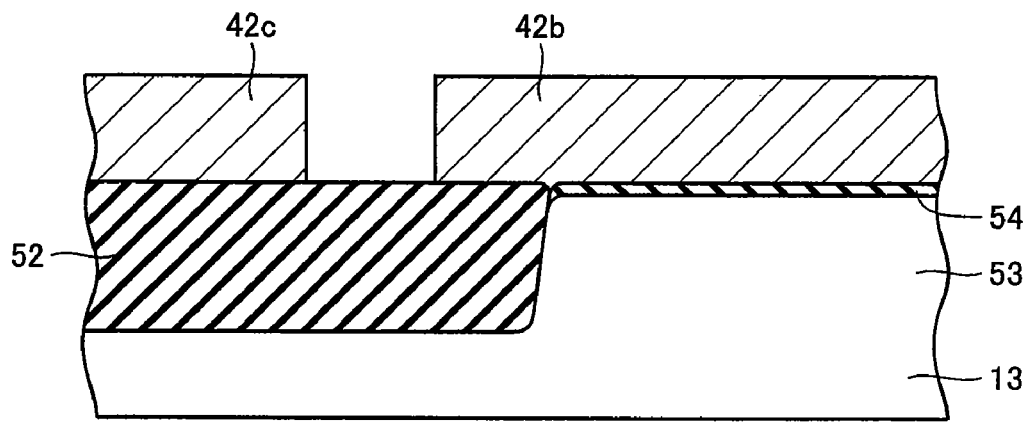
FIG. 74 is a cross-sectional view of FIG. 73.

FIGS. 34 and 73 are plan views of the peripheral circuit region in the step of patterning conductive film 31a of semiconductor integrated circuit device 10. FIG. 74 is a cross-sectional view of FIG. 73. As shown in FIGS. 34, 73 and 74, in the step of patterning the conductive film, conductive film pattern 31a having an opening 80 in a region serving as a boundary region 83 between adjacent gate electrodes of the formed peripheral circuit transistor is formed.

Figure 35:
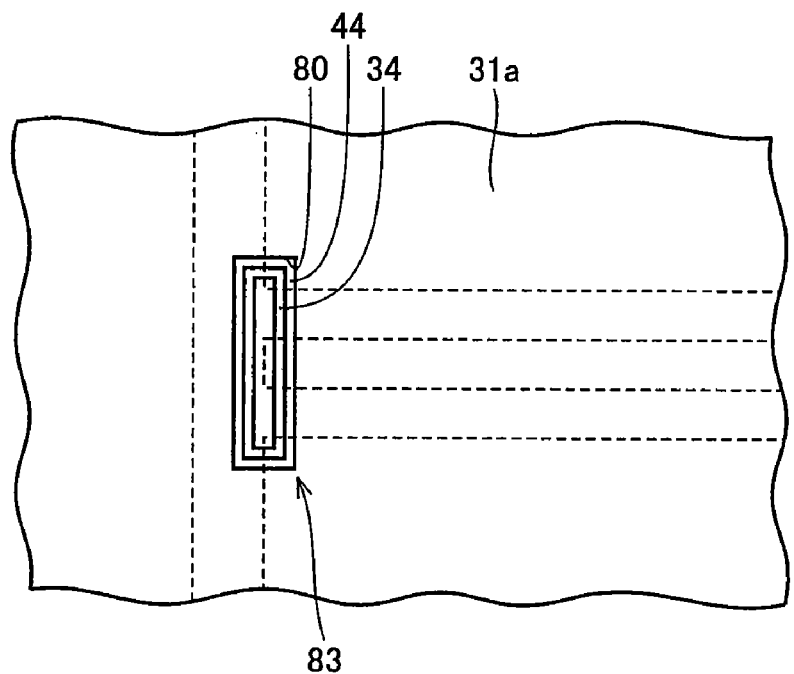
FIG. 35 is a plan view of the peripheral circuit region in the seventh step of forming the control gate and the gate electrode.
Figure 36:
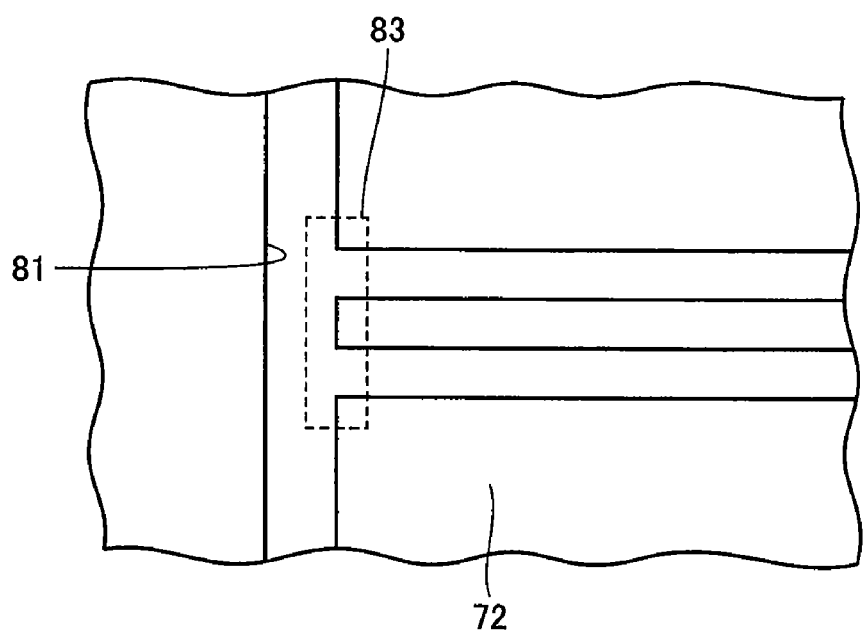
FIG. 36 is a plan view of a photomask in the peripheral circuit region.
Figure 75:
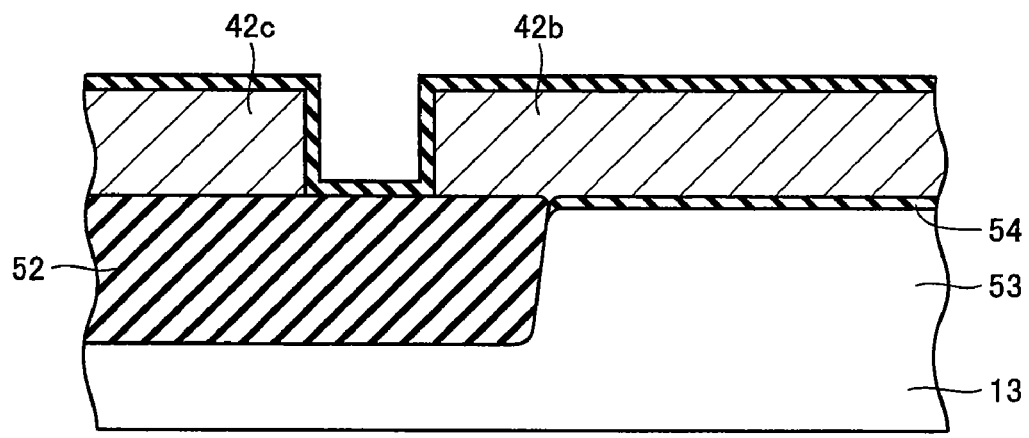
FIG. 75 is a cross-sectional view showing a manufacturing step subsequent to the step of manufacturing the semiconductor integrated circuit device shown in FIG. 74.
Figure 76:
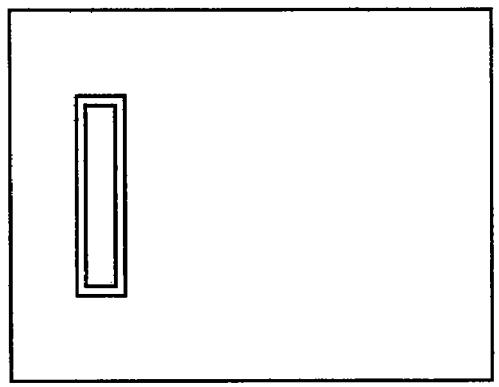
FIG. 76 is a plan view of the peripheral circuit region in the seventh step of forming the control gate and the gate electrode.
Figure 77:
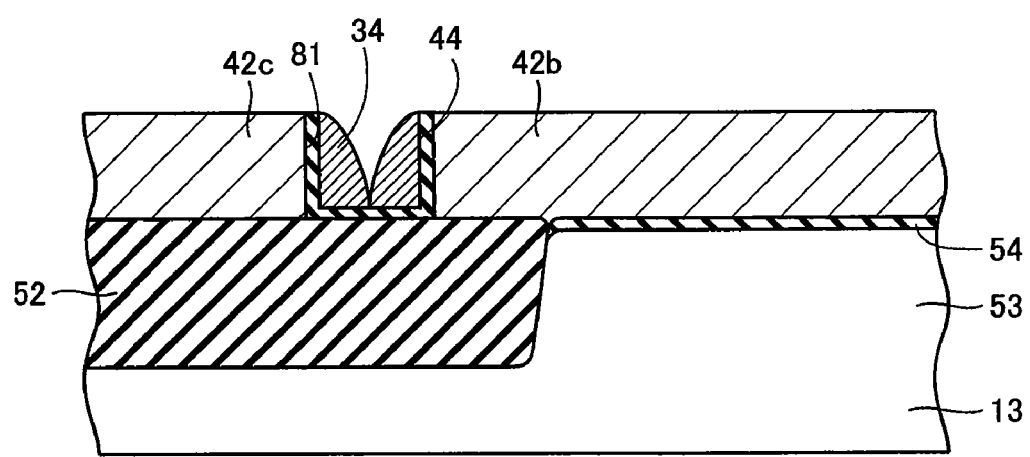
FIG. 77 is a cross-sectional view of FIG. 76.

FIG. 75 is a cross-sectional view showing the manufacturing step subsequent to the step of manufacturing semiconductor integrated circuit device 10 shown in FIG. 74, which corresponds to the fifth step of semiconductor integrated circuit device 10 according to the first embodiment shown in FIGS. 14 and 15. As shown in FIG. 75, insulating film 44 is formed on the inner surface of opening 80 and on the surface of conductive film pattern 31a. In addition, conductive film 34 is deposited on the upper surface of insulating film 44. In the fifth step of forming memory gate electrode 45, conductive film 34 is formed on the surface of insulating film 44 formed on the inner surface of opening 80. FIGS. 35 and 76 are plan views of the peripheral circuit region in the seventh step of forming the control gate and the gate electrode. FIG. 77 is a cross-sectional view of FIG. 76, and FIG. 36 is a plan view of photomask 72 in the peripheral circuit region. As shown in FIGS. 35, 76 and 77, in the seventh step of semiconductor integrated circuit device 10, insulating film 44 is formed on the inner surface of opening 80, and conductive film 34 is formed on the inner surface of opening 80, in the surface of insulating film 44.

Figure 37:
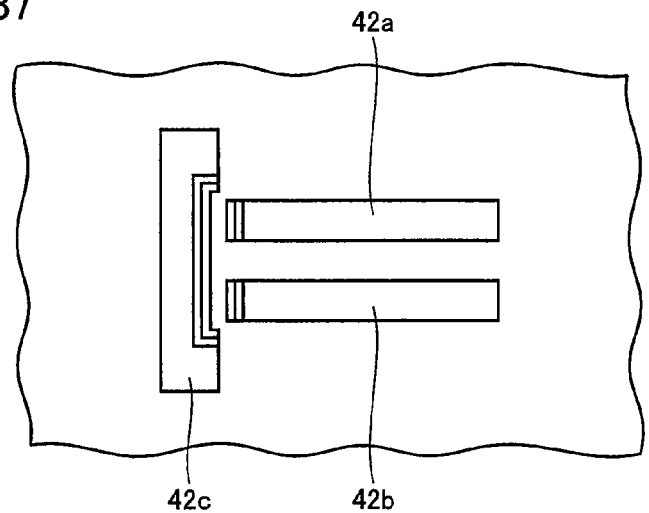
FIG. 37 is a plan view of the peripheral region when the gate electrode in the peripheral circuit region is formed.

In this manner, an etching mask 72 shown in FIG. 36 is arranged on the upper surface side of opening 80 where insulating film 44 and conductive film 34 are formed, and patterning using photolithography is performed. FIG. 37 is a plan view of the peripheral region when the gate electrode of the peripheral circuit region is formed. As shown in FIG. 36, an opening 81 is formed in etching mask 72.

Opening 81 is formed in FIG. 37 such that formed gate electrodes 42a, 42b and 42c are connected to each other in an isolation region 83 shown in FIG. 35. Opening 81 in etching mask 72 shown in FIG. 36 is arranged above formed gate electrodes 42a, 42b and 42c, on the upper surface side of conductive pattern 31a. If etching mask 72 is arranged in such a manner, a part of isolation region 83 in opening 81 is located on the upper surface of opening 80 shown in FIG. 35.

Figure 78:
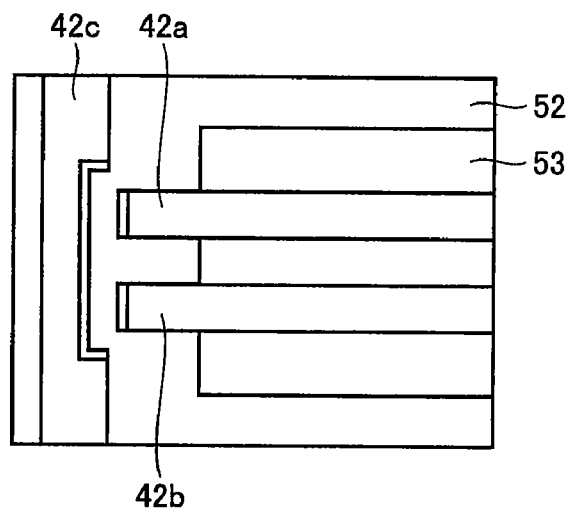
FIG. 78 is a plan view showing a manufacturing step subsequent to the manufacturing step shown in FIG. 76.
Figure 79:
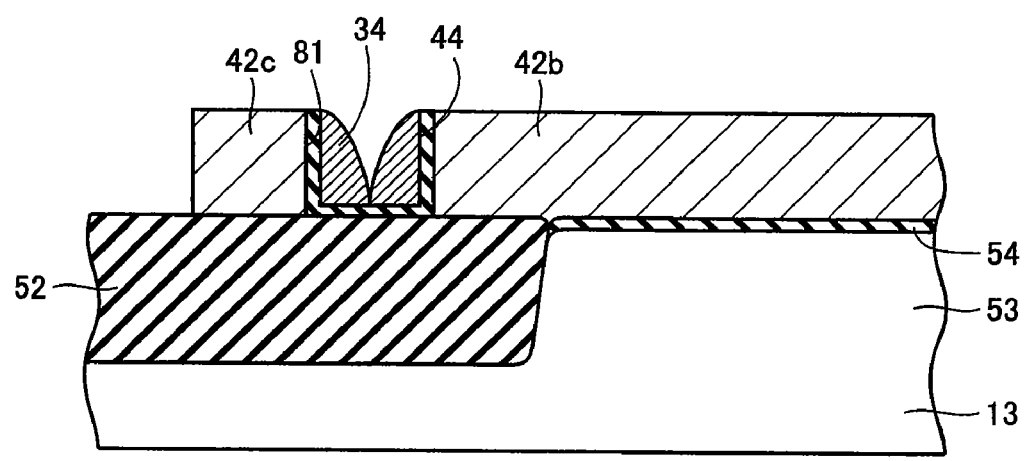
FIG. 79 is a cross-sectional view of FIG. 78.

FIG. 78 is a plan view showing a manufacturing step subsequent to the manufacturing step shown in FIG. 76, and FIG. 79 is a cross-sectional view of FIG. 78. In FIGS. 78, 79 and 37, etching mask 72 is arranged and patterning using photolithography is performed. Then, gate electrodes 42a, 42b and 42c are isolated by opening 80 shown in FIG. 35. In other words, adjacent gate electrodes 42a, 42b and 42c are formed on opposing sides of opening 80. Here, as insulating film 44 is formed on the inner surface of opening 80, insulating film 44 is formed on the surfaces of formed gate electrodes 42a, 42b and 42c on a side of isolation region 83, and conductive film 34 is formed on the surface of insulating film 44 on the side of isolation region 83. As insulating film 44 is formed on the surface of formed gate electrodes 42a, 42b and 42c on the side of isolation region 83, gate electrodes 42a, 42b and 42c are electrically isolated from each other.

In the seventh step of forming the gate electrode, opening 80 including insulating film 44 formed in advance on the surface is formed in a portion of isolation region 83 for isolating gate electrodes 42a, 42b and 42c, in conductive pattern 31a. Therefore, it is not necessary to form an opening 82 in etching mask 72 in such a manner as isolating formed gate electrodes 42a, 42b and 42c from each other, but opening 82 can be formed so as to connect gate electrodes 42a, 42b and 42c to each other in isolation region 83. As photolithography can be performed to connect gate electrodes 42a, 42b and 42c to each other, unlike an example in which isolated gate electrodes are formed through photolithography, it is not necessary to provide a margin between gate electrodes 42a, 42b and 42c. As described above, according to the method of manufacturing semiconductor integrated circuit device 10 of the fourth embodiment, gate electrodes 42a, 42b and 42c can be more proximate to each other and reduction in an area can be achieved.

Though the fourth embodiment has been applied to the gate electrode of the peripheral circuit transistor, the embodiment is not limited as such and it is applicable to the control gate of the memory cell transistor or a variety of interconnections. In other words, a method of manufacturing a semiconductor integrated circuit device, which includes the steps of forming a conductive film on a main surface of a semiconductor substrate, forming a conductive pattern having an opening in an isolation region of an interconnection to be formed in the conductive film, forming an insulating film covering the conductive pattern, and forming an interconnection by using an etching mask having an opening formed to connect the formed interconnections in the isolation region to each other, so as to pattern the insulating film and the conductive pattern, may be employed. According to such a method of manufacturing a semiconductor integrated circuit device, an interval between interconnections can be shorter than in an example in which the interconnection is formed through normal photolithography, and an area can be made smaller.

The present invention is suitable for an embedded microcomputer incorporating a flash memory having a MONOS structure.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a semiconductor substrate;
   an isolation region selectively formed on a main surface of said semiconductor substrate;
   an active region defined by said isolation region on said main surface of said semiconductor substrate;
   a first impurity region formed on said active region, capable of serving as a source region;
   a second impurity region formed on said active region, capable of serving as a drain region;
   a channel region formed on said main surface of said semiconductor substrate between said first impurity region and said second impurity region;
   a control gate electrode formed annularly in plan view on an upper surface of said channel region on a side of said second impurity region, with a first insulating film being interposed;
   a recessed portion formed on a side surface of said control gate electrode located on a side of said first impurity region;
   a sidewall-shaped memory gate electrode formed annularly in plan view on the upper surface of said channel region on a side of said first impurity region, with a second insulating film capable of accumulating charges being interposed, as well as on one side surface of said control gate electrode;
   a connection portion connected to said memory gate electrode and formed in said recessed portion; and
   a voltage application portion connected to said connection portion, capable of applying a voltage to said memory gate electrode.

* * * * *